(12) United States Patent
Radovanovic

(10) Patent No.: US 12,302,762 B2
(45) Date of Patent: May 13, 2025

(54) MATERIAL, SYSTEM AND METHOD MAKING USE OF PLASMON RESONANCE

(71) Applicant: Pavle Radovanovic, Waterloo (CA)

(72) Inventor: Pavle Radovanovic, Waterloo (CA)

(73) Assignee: Pavle Radovanovic, Waterloo (CA)

( * ) Notice: Subject to any disclaimer, the term of this patent is extended or adjusted under 35 U.S.C. 154(b) by 702 days.

(21) Appl. No.: 16/632,476

(22) PCT Filed: Jul. 20, 2018

(86) PCT No.: PCT/CA2018/050882
§ 371 (c)(1),
(2) Date: Jan. 20, 2020

(87) PCT Pub. No.: WO2019/014773
PCT Pub. Date: Jan. 24, 2019

(65) Prior Publication Data
US 2021/0159400 A1    May 27, 2021

Related U.S. Application Data

(60) Provisional application No. 62/534,893, filed on Jul. 20, 2017.

(51) Int. Cl.
| | |
|---|---|
| *B82Y 20/00* | (2011.01) |
| *G02B 1/00* | (2006.01) |
| *G02B 5/00* | (2006.01) |
| *G02B 6/122* | (2006.01) |
| *H10N 50/85* | (2023.01) |
| *B82Y 30/00* | (2011.01) |
| *B82Y 40/00* | (2011.01) |

(52) U.S. Cl.
CPC ............. *H10N 50/85* (2023.02); *G02B 1/002* (2013.01); *G02B 5/008* (2013.01); *G02B 6/1226* (2013.01); *B82Y 20/00* (2013.01); *B82Y 30/00* (2013.01); *B82Y 40/00* (2013.01)

(58) Field of Classification Search
CPC .......... B82Y 20/00; B82Y 30/00; H01L 43/10
See application file for complete search history.

(56) References Cited

PUBLICATIONS

Runnerstorm et al., "Defect Engineering in Plasmonic Metal Oxide Nanocrystals", ACS Publications, Nano Lett. 2016, 16, pp. 3390-3398. (Year: 2016).*
"Configure." Merriam-Webster.com. Merriam-Webster, 2022. Web. Oct. 20, 2022.*

(Continued)

*Primary Examiner* — Reema Patel
(74) *Attorney, Agent, or Firm* — Gowling WLG (Canada) LLP

(57) ABSTRACT

A plasmonic nanostructure material having semiconductor nanocrystals or metal-oxide nanocrystals configured with point defects to provide localized surface plasmon resonance as a parameter for tuning the electronic structure of the nanocrystals. A method of preparing a plasmonic nanostructure material including: colloidal synthesis of nanocrystals to provide point defects resulting in localized surface plasmon resonance as a parameter for tuning the electronic structure of the nanocrystals; and depositing nanocrystals as a thin film, growing nanocrystals on a desired substrate, or drawing nanocrystals into a nanowire.

16 Claims, 41 Drawing Sheets

(56) References Cited

PUBLICATIONS

Runnerstrom. E.L et al., "Defect Engineering in Plasmonic Metal Oxide Nanocrystals," Nano Letters, 16, pp. 3390-3398, Apr. 25, 2016.

Fang, H. et al., "Tuning Plasmon Resonance of $In_2O_3$ Nanocrystals throughout the Mid-Infrared Region by Competition between Electron Activation and Trapping", Chemistry of Materials, 29, pp. 4970-4979, May 18, 2017.

Patent Cooperation Treaty, International Preliminary Report on Patentability for Application No. PCT/CA2018/050882 dated Jan. 21, 2020.

* cited by examiner

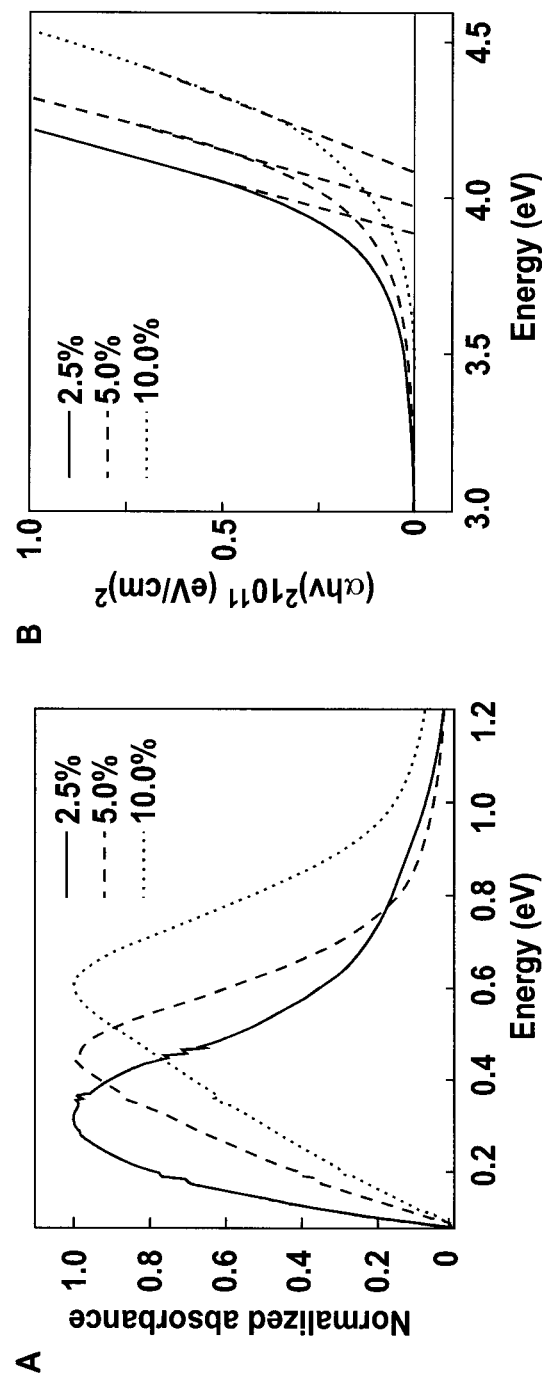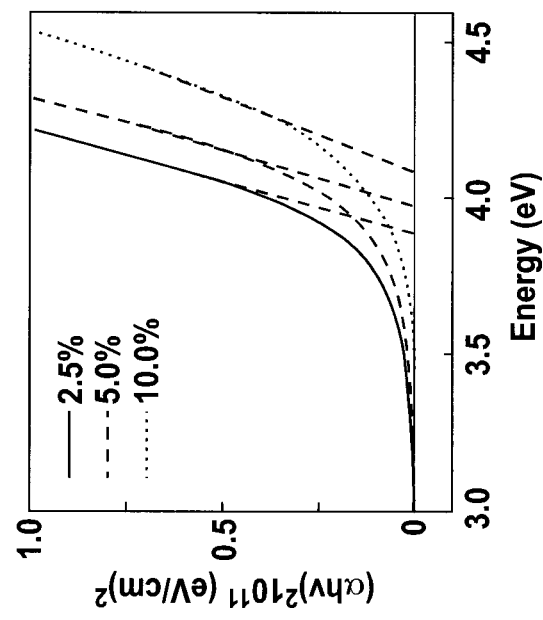
Figure 2A
Figure 2B

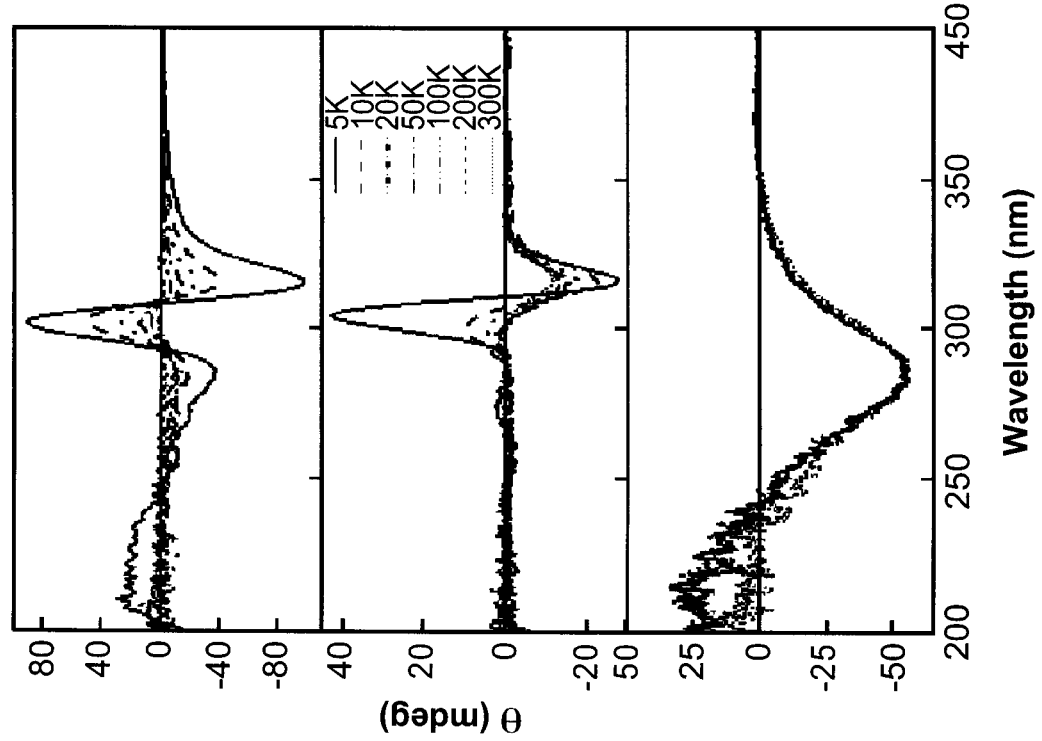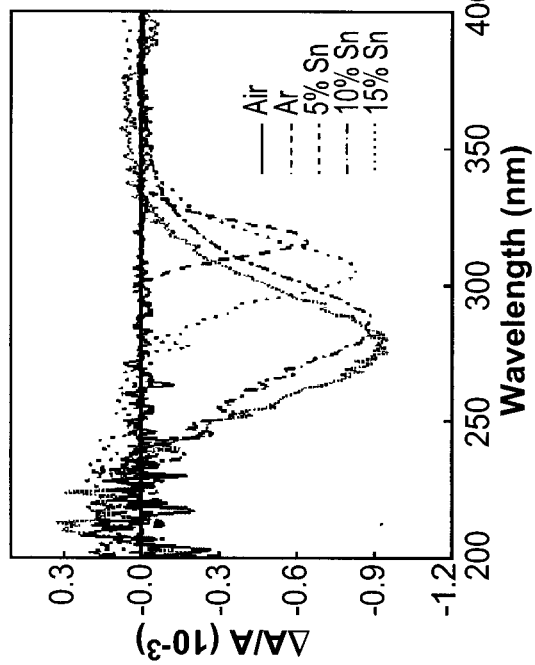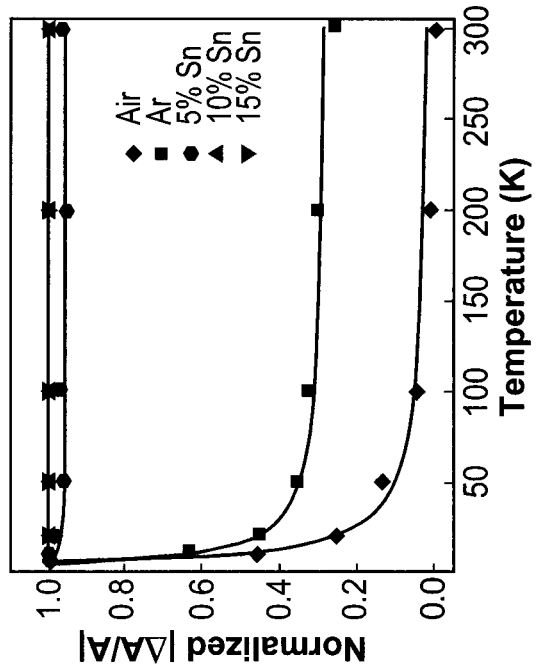
Figure 9A
Figure 9B
Figure 9C

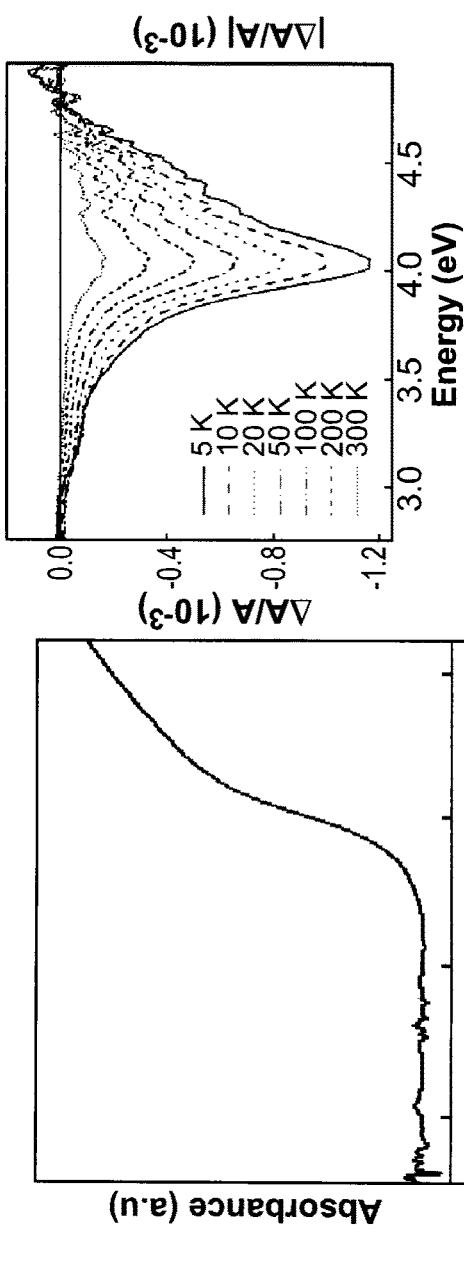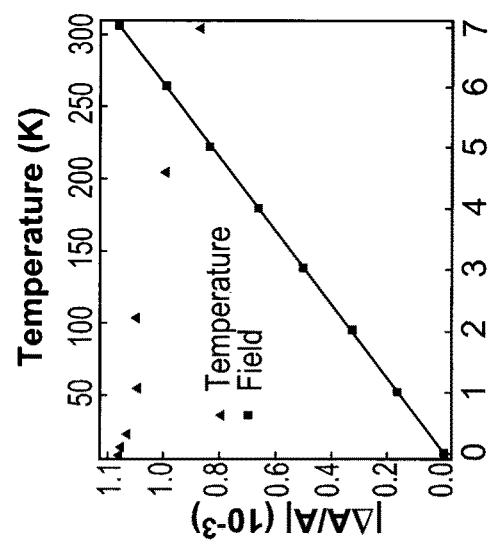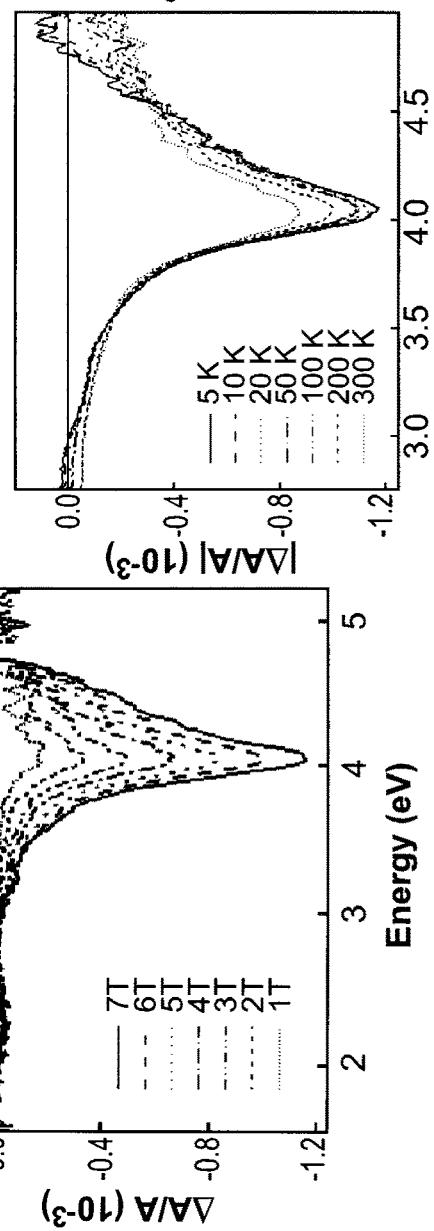
Figure 17A
Figure 17B
Figure 17C
Figure 17D

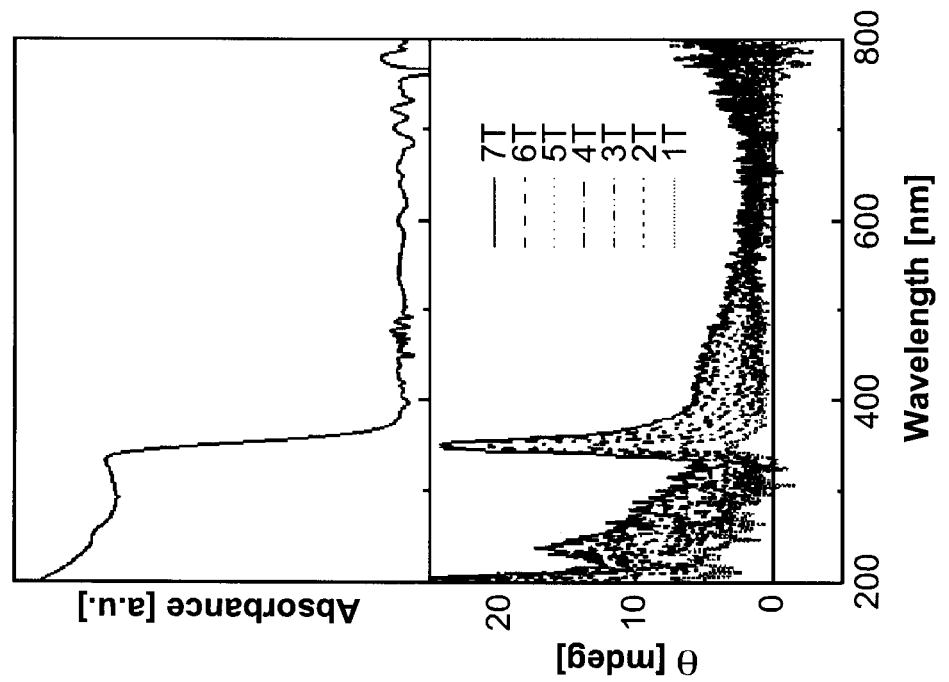
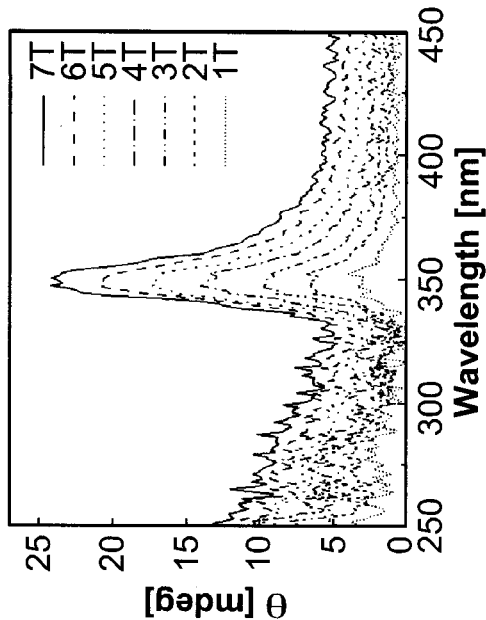
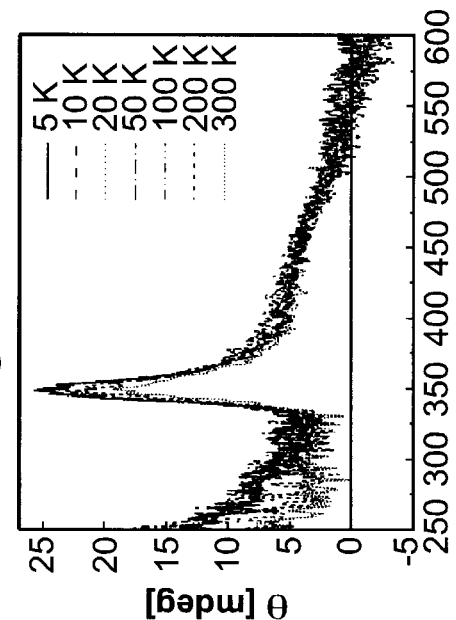
Figure 21A
Figure 21B
Figure 21C

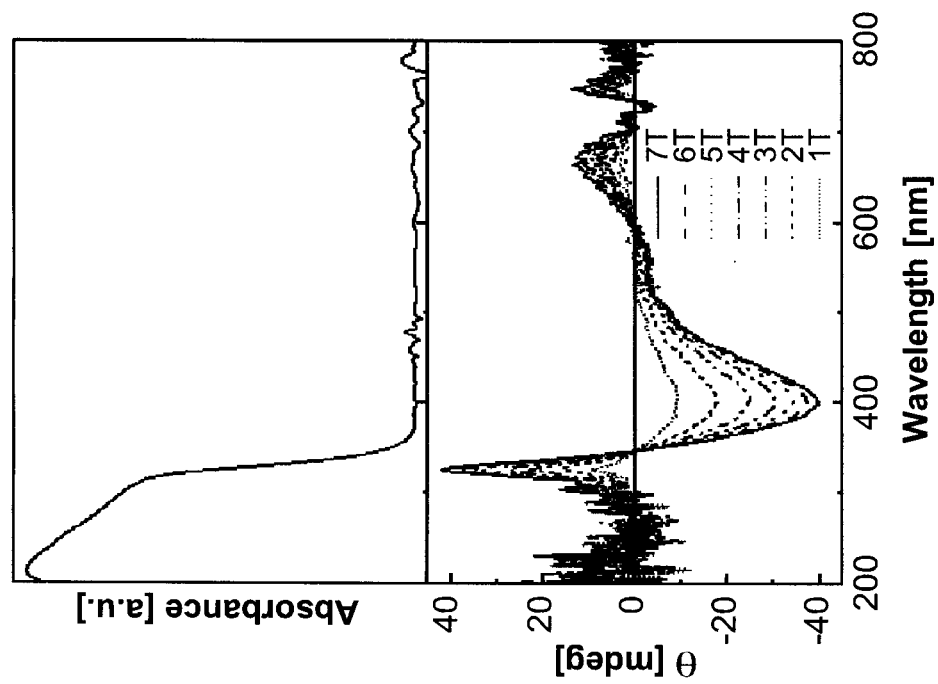
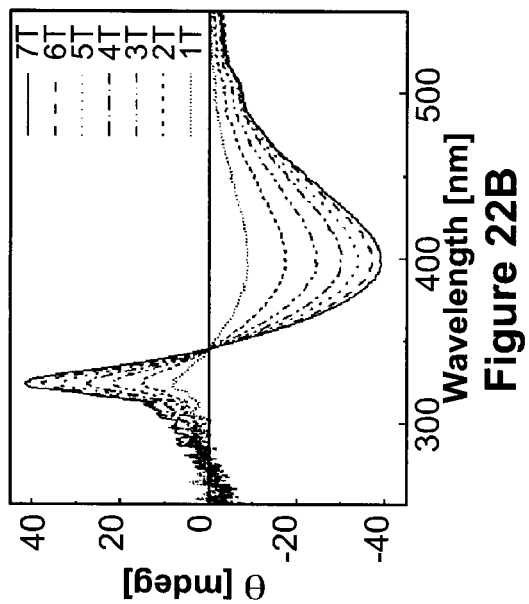
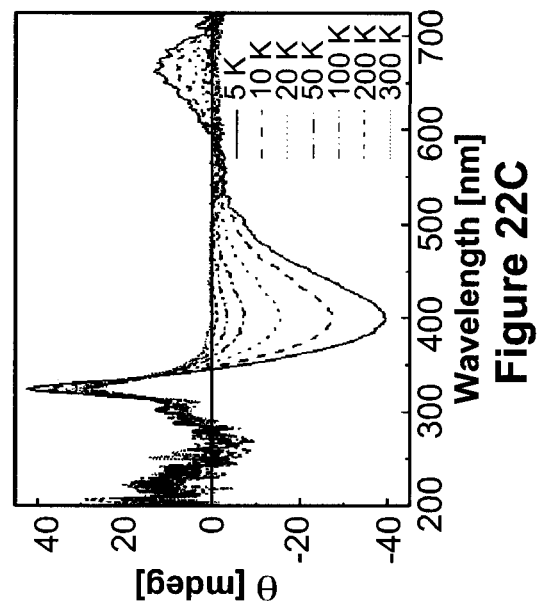
Figure 22A
Figure 22B
Figure 22C

MATERIAL, SYSTEM AND METHOD MAKING USE OF PLASMON RESONANCE

RELATED APPLICATIONS

This application claims the benefit of U.S. Provisional Patent Application No. 62/534,893 filed on Jul. 20, 2017, which is hereby incorporated herein by reference.

FIELD

This disclosure is directed generally at a material, method for making same, system and method that allows use of plasmon resonances in electronics and information technology, and, more specifically, at a material, system and method making use of plasmon resonances to provide practical nanodevices in electronics and information technology.

BACKGROUND

Nanostructures, such as semiconductor nanocrystals (NCs), metallic nanoparticles, and the like, have been studied with regard to their unique and interesting properties. In particular, these studies have lead to new terms such as "spintronics", which relates to manipulation of the "spin" characteristic of the electron. In particular, there have been many attempts at universities and information technology companies around the world to develop semiconductor-only spintronic technologies that would operate at room temperature but there do not seem to have been any viable solutions as yet.

More recently, there has been research into the phenomenon of plasmon resonance in semiconductor nanostructures. Plasmonic nanostructures are characterized by confined light-induced collective resonant oscillations of free charge carriers. As a result of these charge density oscillations, known as localized surface plasmon resonances (LSPRs), many metallic nanostructures exhibit strong light absorption and scattering, which are sensitive to their local physical and chemical environment, size, shape, and composition. These phenomena render such metallic nanoparticles particularly interesting for different technologies, including photovoltaics, chemical and biomolecular sensors, and photothermal cancer therapy. However, metal nanoparticle LSPRs also experience a high degree of electronic-transition-induced optical losses, and lack the ability to tune the concentration of free electrons as a parameter for controlling the plasmonic properties.

More recently, colloidal plasmonic semiconductor and metal oxide nanocrystals have been developed. These new nanocrystals provide a new type of plasmonic material. Currently used spintronic information processing technology generally makes use of the giant magneto-resistance (GMR) effect, in which small magnetic fields can be used to control and manipulate conductivity of electrical devices. Recently, diluted magnetic semiconductors (DMSs) and diluted magnetic oxides (DMOs) have been developed for potential application as GMR and related devices in spintronics. One major disadvantage of these structures (which mostly rely on doping semiconductor thin films and nanostructures with transition metal ions), is the low temperature required for the operation of the resulting devices (usually only up to 200 K), and limitation of the device size and structure necessary to induce long-range ferromagnetic ordering. The device size becomes particularly relevant for improving device efficiency (Moore's law) and ultimately moving to, for example, a quantum information regime.

However, in order to make these new plasmonic nanostructures useful in various applications, it is believed to be necessary to produce plasmon-exciton coupling in single-phase semiconductor NCs. This coupling has not been available due, at least in part, to the fact that, in all known semiconductors with appreciable concentration of free carriers, surface plasmon and exciton are non-resonant, plasmon absorption is in infrared (IR), while the band gap (exciton) energy usually corresponds to the visible or ultraviolet part of the spectrum.

Improvements to materials, systems and methods for nanostructures are needed in order to provide improved electronics and information technology equipment based on plasmonic nanostructures.

SUMMARY

According to one aspect here, there is provided a plasmonic nanostructure material having semiconductor nanocrystals or metal-oxide nanocrystals configured with point defects to provide localized surface plasmon resonance as a parameter for tuning the electronic structure of the nanocrystals.

In some cases, the semiconductor nanocrystal may be configured with point defects by at least one of aliovalent doping, photodoping, electrochemical injection, or native defect generation.

In some cases, the semiconductor nanocrystal may be further configured by controlling carrier activation, trapping and scattering based on nanocrystal composition or surface chemistry.

In some cases, the semiconductor nanocrystal may be doped with an aliovalent transition metal to provide both plasmon resonance and spintronic effects.

In some cases, the semiconductor nanocrystal may be a single phase nanocrystal and the localized surface plasmon resonance is coupled with exciton energy (semiconductor band structure) of the nanocrystal via correlated action of applying circularly polarized light and a magnetic field.

In some cases, the localized surface plasmon resonance may not be resonant with the exciton energy (semiconductor band structure) of the nanocrystal.

In some cases, the semiconductor nanocrystal may be selected from among the following:
A) n-type plasmonic semiconductor nanocrystals
  i) Semiconductors doped with aliovalent ions (this is particularly relevant for transparent metal oxides):
    a) $In_2O_3$ doped with tin (i.e., $Sn^{4+}$, known as ITO), antimony ($Sb^{5+}$), titanium ($Ti^{4+}$), molybdenum ($Mo^{5+}$ or $Mo^{6+}$, known as IMO), tungsten ($W^{5+}$ or $W^{6+}$, known as IWO),
    b) ZnO doped with aluminum ($Al^{3+}$, known as AZO), gallium ($Ga^{3+}$, known as GZO), indium ($In^{3+}$, known as IZO)
    c) $SnO_2$ doped with antimony ($Sb^{5+}$, known as ATO)
    d) CdO doped with indium ($In^{3+}$, ICO), dysprosium ($Dy^{3+}$) etc.
  ii) Non-stoichiometric semiconductor (i.e., anion deficient):
    $TiO_{2-x}$, $WO_{3-x}$, $InN_{1-x}$, $In_2O_{3-x}$
B) p-type semiconductors: both aliovalent doped and cation deficient. Particularly well-know cation deficient lattices are: $Cu_{2-x}S$, $Cu_{2-x}Se$. Other semiconductor nanocrystals having similar characteristics may also be selected by one of skill in the art having knowledge of this disclosure.

In another aspect, there is provided a method of preparing a plasmonic nanostructure material including: colloidal synthesis of nanocrystals to provide point defects resulting in localized surface plasmon resonance as a parameter for tuning the electronic structure of the nanocrystals; and depositing nanocrystals as a thin film, growing nanocrystals on a desired substrate, or drawing nanocrystals into a nanowire.

In some cases, the nanocrystals may be configured with point defects by at least one of aliovalent doping, photodoping, electrochemical injection, or native defect generation.

In some cases, the aliovalent doping may include doping with aliovalent transition metal dopants.

In some cases, the aliovalent transition metal dopants may be selected from the group consisting of molybdenum, tungsten, and titanium.

In some cases, the colloidal synthesis may be conducted in an argon environment having a predetermined flow rate.

In yet another aspect, there is provided a device or system for controlling a plasmonic nanostructure material, the device or system including: a support for the nanostructure material; a source of circularly polarized light that propagates in a predetermined direction and impinges on the nanostructure material; a magnetic field source positioned in relation to the nanostructure material and source of circularly polarized light such that the magnetic field lines are parallel with the light propagation direction; and a controller configured to control at least one of: the helicity of the polarized light, or; the orientation of the magnetic field, to switch the carrier polarization in the nanostructure material.

In some cases, the magnetic field source may include a permanent magnet or an electromagnet.

In some cases, the magnetic field source may include a ferromagnetic material and the nanostructure material is deposited on the ferromagnetic material.

In some cases, the source of circularly polarized light may include a laser and a quarter wave plate.

In some cases, the device or system may include a system for detecting the carrier polarization in the nanostructure material.

In some cases, the system for detecting the carrier polarization in the nanostructure material may include an electrical system.

In still yet another aspect, there is provided a method for controlling a plasmonic nanostructure material, the method includes: supporting a nanostructure material in a magnetic field; directing circularly polarized light at the nanostructure material to polarize charge carriers in the nanostructure material, wherein the nanostructure material is positioned such that lines of the magnetic field are parallel with the light propagation direction; and adjusting at least one of: the helicity of the polarized light to switch the carrier polarization in the nanostructure material; and the orientation of the magnetic field to switch the carrier polarization in the nanostructure material.

In some cases, the method may further include depositing the nanostructure material on a ferromagnetic material such that the magnetic field is provided by the ferromagnetic material.

In still yet another aspect, there is provided an information processing device incorporating a device for controlling a plasmonic nanostructure material, the device including: a support for the nanostructure material; a source of circularly polarized light that propagates in a predetermined direction and impinges on the nanostructure material; a magnetic field source positioned in relation to the nanostructure material and source of circularly polarized light such that the magnetic field lines are parallel with the light propagation direction; and a controller configured to control at least one of: the helicity of the polarized light, or; the orientation of the magnetic field, to switch the carrier polarization in the nanostructure material.

In still yet another aspect, there is provided an information processing device utilizing a method for controlling a plasmonic nanostructure material, the method includes: supporting a nanostructure material in a magnetic field; directing circularly polarized light at the nanostructure material to polarize charge carriers in the nanostructure material, wherein the nanostructure material is positioned such that lines of the magnetic field are parallel with the light propagation direction; and adjusting at least one of: the helicity of the polarized light to switch the carrier polarization in the nanostructure material; and the orientation of the magnetic field to switch the carrier polarization in the nanostructure material.

Other aspects and features of the present disclosure will become apparent to those ordinarily skilled in the art upon review of the following description of specific embodiments in conjunction with the accompanying figures.

BRIEF DESCRIPTION OF FIGURES

Embodiments of the present disclosure will now be described, by way of example only, with reference to the attached figures.

FIG. 2A is a graph showing normalized LSPR absorption spectra of $Sn^{4+}$-doped $In_2O_3$ (ITO) nanocrystals having different Se doping concentrations;

FIG. 2B is a graph illustrating Tauc plots of ITO NCs with different doping concentrations;

FIG. 9A is a graph showing temperature-dependent MCD spectra of the exciton transition of $In_2O_3$ NCs synthesized in air (top panel), in Ar (middle panel), and 10% $Sn^{4+}$-doped $In_2O_3$ NCs;

FIG. 9B is a graph illustrating 300 K MCD spectra of $Sn^{4+}$-doped $In_2O_3$ NCs with different doping concentration and pure $In_2O_3$ NCs synthesized under different atmosphere (in argon and air);

FIG. 9C is a graph illustrating normalized excitonic MCD signal intensities for samples in FIG. 9B plotted against temperature;

FIG. 17A is a graph illustrating absorption (top) and MCD (bottom) spectra of 9.2% IMO nanocrystals collected at 5 K;

FIG. 17B is a graph illustrating 5 K MCD spectra of NCs in FIG. 17A collected at different magnetic field (1-7 T) in the band gap region;

FIG. 17C is a graph illustrating 7 T MCD spectra of NCs in FIG. 17A collected at different temperatures (5-300 K) in the band gap region;

FIG. 17D is a graph illustrating magnetic field (squares) and temperature (triangles) dependence of MCD intensity of 9.2% IMO NCs;

FIG. 21A is a graph illustrating absorption (top) and MCD (bottom) spectra of $TiO_{2-x}$ (F-OLAM) NCs collected at 5 K;

FIG. 21B is a graph illustrating 5 K MCD spectra of $TiO_{2-x}$ (F-OLAM) NCs collected at different magnetic field (1-7 T) in the band gap region;

FIG. 21C is a graph illustrating 7 T MCD spectra of $TiO_{2-x}$ (F-OLAM) NCs collected at different temperatures (5-300 K);

FIG. 22A is a graph illustrating absorption (top) and MCD (bottom) spectra of $TiO_{2-x}$ (M-OLAM) NCs collected at 5 K;

FIG. 22B is a graph illustrating 5K MCD spectra of $TiO_{2-x}$ (M-OLAM) NCs collected at different magnetic field (1-7 T);

FIG. 22C is a graph illustrating 7 T MCD spectra of $TiO_{2-x}$ (M-OLAM) NCs collected at different temperatures (5-300 K);

DETAILED DESCRIPTION

Figure 1:
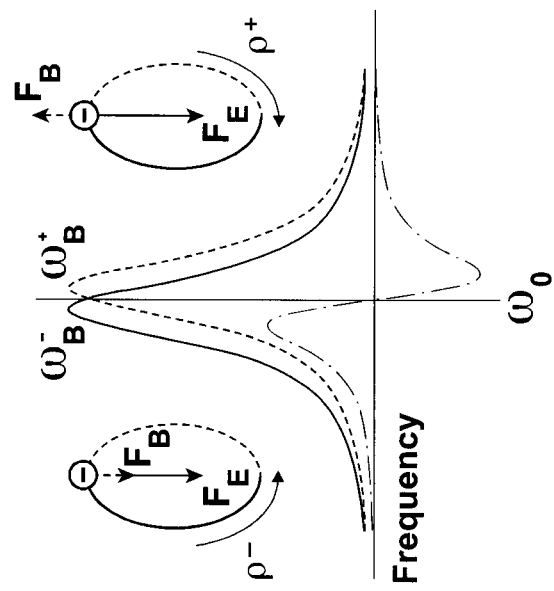
FIG. 1 is a schematic representation of the origin of magnetic circular dichroism (MCD) spectrum of LSPR in plasmonic NC.
Figure 1:
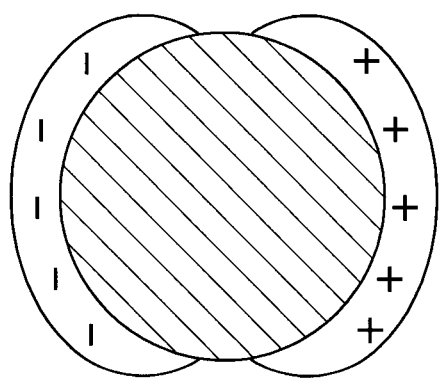
Figure 1:
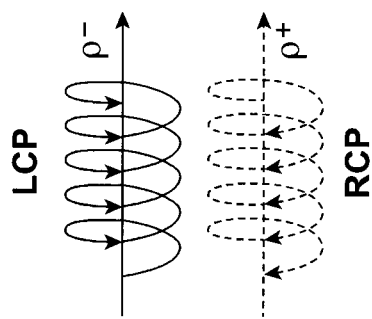

The disclosure is directed at a material, system and method using plasmon resonance. As the scope of these developments is quite broad, one of skill in the art will understand that there are many potential uses and applications for these new developments. While some non-limiting examples are provided, it will be understood that they are examples only and are not intended to limit the scope.

More particularly, the disclosure is directed at a material, system and method making use of plasmon resonance and, in particular, making use of plasmon resonance as a new or additional degree of freedom to control quantum states. The new material, system and method are intended to overcome at least one of the problems with conventional technology in order to provide improved electronic and information processing technology devices and equipment.

As noted above, one problem with conventional quantum devices, including semiconductor spintronic devices, is that they generally operate at very low temperatures. A further problem is that their size is limited by the critical size necessary to support long range ferromagnetic interactions (generally considered to be on the order of 100 nm). Given the temperature-independent behaviour of LSPR, it was determined that it may be possible to address at least some of these problems by using plasmon instead of or in addition to spin as an additional tuning parameter (degree of freedom). One challenge in developing this technology was that the electronic structure of all currently available plasmonic semiconductor NCs does not support resonant coupling between LSPR and the NC host lattice. Significantly (and surprisingly), it appears that semiconductor plasmonic metal oxide materials of reduced dimensions not only support these electronic structure interactions, but also do so at room temperature and single NC level, which are highly relevant factors for practical nanodevice operation.

Plasmonic semiconductor nanocrystals offer an opportunity for fundamental investigation of plasmon-exciton interactions in reduced dimensions and developing new technological applications owing to the possibility of interface-free coupling between plasmonic modes and excitons. However, plasmon-exciton coupling has not yet been realized in single-phase semiconductor nanocrystals because confined plasmon oscillations are generally not resonant with excitonic transitions, and because of the challenges in probing other possible forms of plasmon-exciton interactions. Using magnetic circular dichroism (MCD) spectroscopy, experimentation was able to demonstrate a robust electron polarization in degenerate $In_2O_3$ nanocrystals, enabled by non-resonant coupling of circular magnetoplasmonic modes with the exciton at the Fermi level. Splitting of the conduction band states can be further manipulated by imparting spin angular momentum using paramagnetic aliovalent dopants. Dynamic control of carrier polarization is achieved above room temperature, owing to the temperature-independent properties of the magnetoplasmonic modes, allowing for their harnessing as a new degree of freedom in what we are referring to as plasmontronic devices.

In particular, plasmonic nanostructures are characterized by confined light-induced collective resonant oscillations of free charge carriers. As a result of these charge density oscillations, known as localized surface plasmon resonances (LSPRs), many metallic nanostructures exhibit strong light absorption and scattering, which are sensitive to their local chemical environment, size, shape, and composition. These phenomena render such metallic nanoparticles particularly interesting for different technologies, including photovoltaics, chemical and biomolecular sensors, and photothermal cancer therapy. The possibility to generate an intense electric field, arising from LSPR, in the vicinity of metal nanostructures has also become a standard method for the enhancement of the sensitivity of various spectroscopic techniques including fluorescence, Raman scattering, and second harmonic generation.

Embodiments of the newly developed nanostructure material described herein involve electrically-doped semiconductor nanocrystals (NCs) that exhibit confined light-induced collective resonant oscillations of free charge carriers, known as localized surface plasmon resonances. The phenomenon of LSPR has traditionally been associated with metal nanoparticles. However, the possibility to control charge carrier type and density in semiconductor NCs by aliovalent doping, photodoping, electrochemical injection, or native defect (vacancy) generation has lead to the recent emergence of colloidal plasmonic semiconductor and metal oxide nanocrystals (NCs). In contrast to metal nanostructures, these alternative plasmonic materials have LSPR frequencies tunable in near- to mid-infrared (IR), potentially expanding the applications to terahertz imaging, heat-responsive devices, and surface-enhanced infrared absorption spectroscopy (SEIRA).

Importantly, the possibility to mutually control quantum electronic states and plasmonic properties in a single NC could enable a variety of applications beyond those typically expected for plasmonic nanostructured materials, including efficient non-volatile information transfer and storage, quantum information processing, and photocatalysis. Realization of these technologies requires materials in which plasmon resonance is coupled to the semiconductor band structure (exciton). This coupling is thought to be possible only via resonant interactions, requiring overlap between LSPR and exciton absorption. However, there has been no reported single-phase semiconductor that exhibits plasmon-exciton coupling due, in part, to the fact that in all known semiconductors with appreciable concentration of free carriers surface plasmon and exciton are off-resonance. In particular, plasmon absorption is in the infrared (IR), while the band gap energy associated with the formation of excitons usually corresponds to the visible or ultraviolet part of the spectrum. It was discovered and tested that a class of plasmonic semiconductor materials are able to show a robust interaction between LSPR and exciton at room temperature and in nanocrystals as small as ca. 10 nm (possibly smaller). This interaction is intrinsic in nature and is enabled by non-resonant coupling of LSPR and the semiconductor electronic bands, leading to the splitting of the NC band states and the formation of two polarized carrier channels, which can be used to carry and store information (these can be considered qubits). This technology is believed to represent a radically new approach to non-volatile electronic information processing and storage, and possibly quantum computing, and is believed to have significant advantages over existing technologies.

Spintronics and valleytronics are emerging quantum electronic technologies that rely on using electron spin and multiple extrema of the band structure (valleys), respectively, as additional degrees of freedom. There are also collective properties of electrons in semiconductor nanostructures that potentially could be exploited in multifunctional quantum devices. Specifically, plasmonic semiconductor nanocrystals offer an opportunity for interface-free coupling between a plasmon and an exciton. However, plasmon-exciton coupling in single-phase semiconductor nanocrystals remains challenging because confined plasmon oscillations are generally not resonant with excitonic transitions. Here, a robust electron polarization in degenerately doped $In_2O_3$ nanocrystals was demonstrated and enabled by non-resonant coupling of cyclotron magnetoplasmonic modes with the exciton at the Fermi level. Using magnetic circular dichroism spectroscopy, it can be shown that intrinsic plasmon-exciton coupling allows for the indirect excitation of the magnetoplasmonic modes, and subsequent Zeeman splitting of the excitonic states. Splitting of the band states and selective carrier polarization can be manipulated further by spin-orbit coupling. The results effectively open up the field of plasmontronics, which involves the phenomena that arise from intrinsic plasmon-exciton and plasmon-spin interactions. Furthermore, the dynamic control of carrier polarization is readily achieved at room temperature, which allows for the harness the magnetoplasmonic mode as a new degree of freedom in practical photonic, optoelectronic and quantum-information processing devices.

Recent years have seen a surge of the interest in plasmonic semiconductor nanostructures, as an alternative to their noble metal counterparts. In contrast to nanostructures made of gold and silver, semiconductor and metal oxide nanocrystals (NCs) offer an opportunity to adjust the type and concentration of charge carriers by aliovalent doping, controlling the stoichiometry (cation or anion deficiency), photodoping, or electrochemical injection. As a result, degenerately doped semiconductor and metal oxide NCs exhibit resonant plasmon oscillations in the near-to-mid-infrared (IR) spectral range, allowing for a host of new applications in photonics, optoelectronics, and quantum information processing, sensing, and spectroscopy. Furthermore, the ability to control carrier activation, trapping, and scattering via NC composition and/or surface chemistry allows for fine tuning of the energy, band width, and quality factor of the localized surface plasmon resonance (LSPR).

Besides expanding the applications relying on optical field enhancement into the IR range, attaining LSPR in semiconductor NCs brings about numerous other opportunities. If LSPR and the excitonic transition are resonant, mutual coupling between plasmon oscillations and excitons could be achieved in single-phase nanostructures, rather than nanocomposites containing metal-semiconductor interface. Plasmon excitation may then result in the enhancement of the excitonic absorption and emission, or near-field that would enable shifting and splitting of the excitonic transitions though optical Stark effect, enhancement of the two-photon absorption, or photonic upconversion, to name a few. However, non-resonant nature of the LSPR and exciton in semiconductor NCs has been a major obstacle toward realizing such opportunities.

One of the promising ways to achieve dynamic modulation of the plasmonic properties of colloidal NCs is to use a magnetic field. As an example, the existence of magneto-plasmonic modes in gold NCs have been revealed and appear to be responsible for magnetic-field-induced chirality of LSPR as shown in FIG. 1.

The shift of the magneto-plasmonic modes ($\Delta\omega$) is predicted to follow linear dependence on the magnetic field, with $\Delta\omega=|\omega_B-\omega_0|=g(\omega_0)B$, where $\omega_B$ is the frequency of the magneto-plasmonic modes, too is the frequency of LSPR at B=0, and $g(\omega_0)$ is the proportionality constant ($g(\omega_0)=-e/2m$). Linear dependence on the magnetic field has also been reported for LSPRs in $Sn^{4+}$-doped $In_2O_3$ (ITO) and photodoped ZnO NCs, demonstrating generality of the magneto-optical behavior of the localized plasmon oscillations.

The possibility to control charge carrier type and density by aliovalent doping, photodoping, charge transfer, or native defect (vacancy) generation has led to the recent emergence of colloidal plasmonic semiconductor nanocrystals (NCs). In contrast to metal nanostructures, these alternative plasmonic NCs have LSPR frequencies tunable in near- to mid-infrared (IR), potentially expanding the applications to terahertz imaging, heat-responsive devices, and surface-enhanced infrared absorption spectroscopy (SEIRA). Importantly, the possibility to mutually control semiconducting and plasmonic properties in a single NC could enable a variety of applications beyond those typically expected for plasmonic nanostructured materials. The phenomena observed in semiconductor-metal nanocomposites and/or heterostructured core-shell NCs have served as a guideline to predict the conditions for, and the behavior of plasmon-exciton interactions in degenerate semiconductor NCs. At the heart of these phenomena is the resonant coupling between a plasmon and an exciton, resulting in the enhancement of the excitonic absorption and emission, optical Stark effect (OSE), and photocatalytic activity, to name a few.

In the presence of external electric and magnetic fields, free electrons associated with LSPR experience Lorentz forces, and their oscillation can be expressed according to the Drude model as: $m(dv/dt)+\gamma mv=-eE-e(v\times B)$, where e, m, and v are the charge, effective mass, and velocity of the electron, respectively, γ is the damping factor, and E and B are external electric and magnetic field, respectively. When excited by circularly polarized light with opposite helicity ($\rho^+$ and $\rho^-$), free electrons undergo cyclotron motion in opposite directions giving rise to two energetically degenerate circular plasmonic modes with the resonance frequency $\omega_0$ (as shown in FIG. 1A). In the presence of an external magnetic field applied parallel to the light propagation direction, the plasmonic modes split, leading to a difference in the absorption of left circularly polarized (LCP) and right circularly polarized (RCP) beams, and resulting in a derivative-shaped magnetic circular dichroism (MCD) spectrum (as shown in FIG. 1A). The model developed from the Drude equation of motion allows for a prediction of the shift of magnetoplasmonic modes relative to $\omega_0$ ($\Delta\omega=|\omega_B-\omega_0|=g(\omega_0)B$), where $\omega_B$ is the frequency of the magnetoplasmonic mode ($\omega_B^-$, $\omega_B^+$) and $g(\omega_0)=-e/2m$ is the proportionality constant. The shift of the magnetoplasmonic modes follows linear dependence on B, which was experimentally confirmed for gold nanoparticles. Linear dependence of MCD intensity on the magnetic field has also been reported for LSPR of Sn-doped $In_2O_3$ (ITO) and photodoped ZnO NCs, demonstrating generality of the magneto-optical behavior of the localized plasmon oscillations.

Normalized absorption spectra of ITO NCs in the near-IR region are presented in FIG. 2A. Broad bands, which shift to higher energy with increasing doping level, can be ascribed to LSPRs generated by aliovalent substitutional doping of NCs with $Sn^{4+}$. Their maximum intensities and energies follow Drude-Lorenz model for semiconductors, with $\omega_p \sim n^{1/2}$ and $\alpha_{abs} \sim n$, where $\omega_p$ is the plasma frequency, $\alpha_{abs}$ is the absorption coefficient, and n is the number density of free electrons. The blue shift of the LSPR with increasing doping concentration is accompanied by a shift of the band edge absorption, as shown by the Tauc plots in FIG. 2B. The shift of the band edge to higher energy is associated with the increased conduction band occupancy, and is known as the Burstein-Moss effect.

In particular, FIG. 1 illustrates absorption and MCD spectra of LSPR in degenerate semiconductor NCs. FIG. 1 shows a schematic representation of the origin of MCD signal for LSPR in plasmonic NCs (105), represented as the difference between the absorption of LCP ($\rho^-$) beam (110, $\omega_B^-$) and RCP ($\rho^+$) beam (115, $\omega_B^+$) for magnetic field oriented parallel to the light propagation direction. The direction of the cyclotron motion of free electrons for $\rho^-$ and $\rho^+$ are shown with curved arrows 120 and 125, respectively. The orientation of the magnetic component ($F_B$) relative to the electric component ($F_E$) of the Lorenz force leads to splitting of the circular plasmonic modes in the magnetic field, generating MCD intensity.

FIG. 2A illustrates normalized LSPR absorption spectra of ITO nanocrystals having different $Sn^{4+}$ doping concentrations, as indicated in the graph. FIG. 2B illustrates Tauc plots of ITO NCs with different doping concentrations, as indicated in the graph.

Figure 3A:
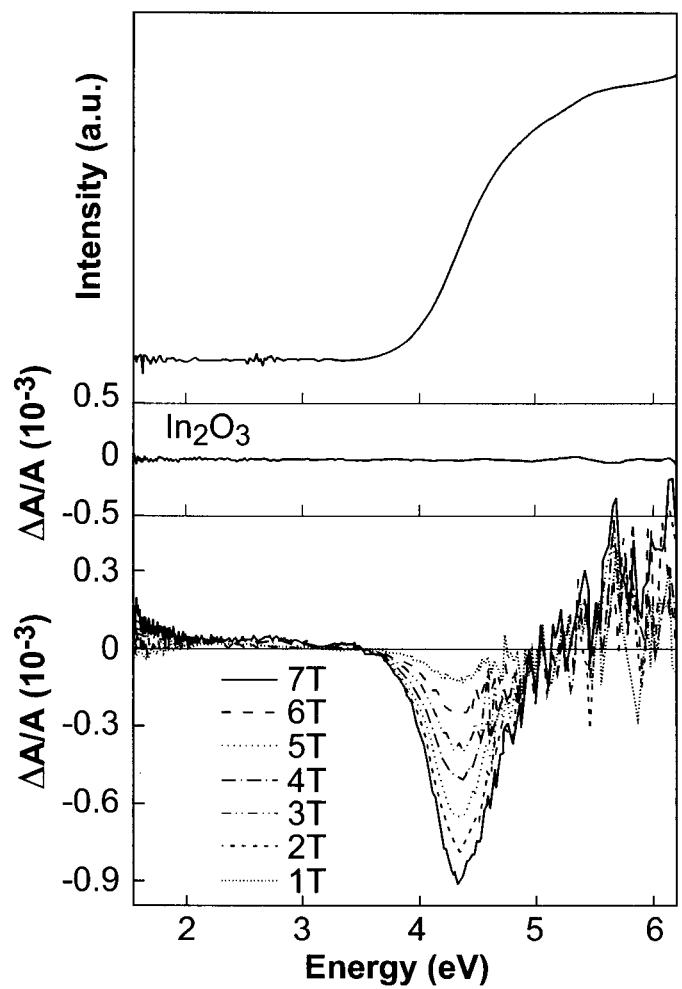
FIG. 3A is a graph shown absorption (top panel) and MCD (bottom panel) spectra of ITO nanocrystals (containing 10% Sn4+) collected at 300 K.
Figure 3B:
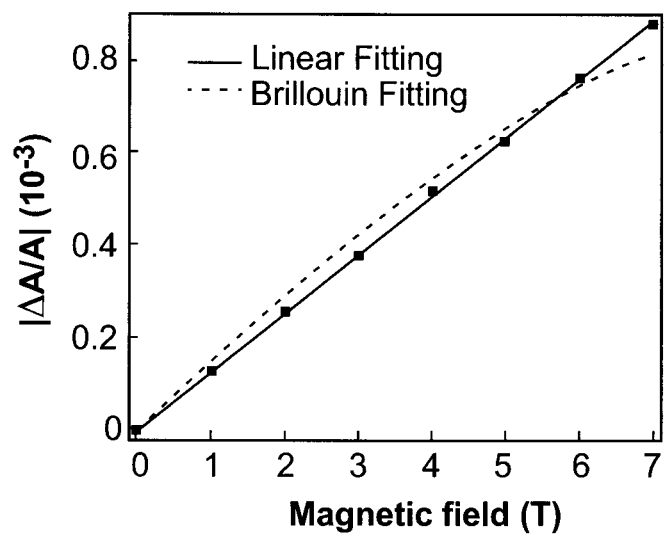
FIG. 3B illustrates magnetic field dependence of MCD intensity at 4.34 eV for ITO nanocrystals in FIG. 3A as function of the magnetic field strength.
Figure 3C:
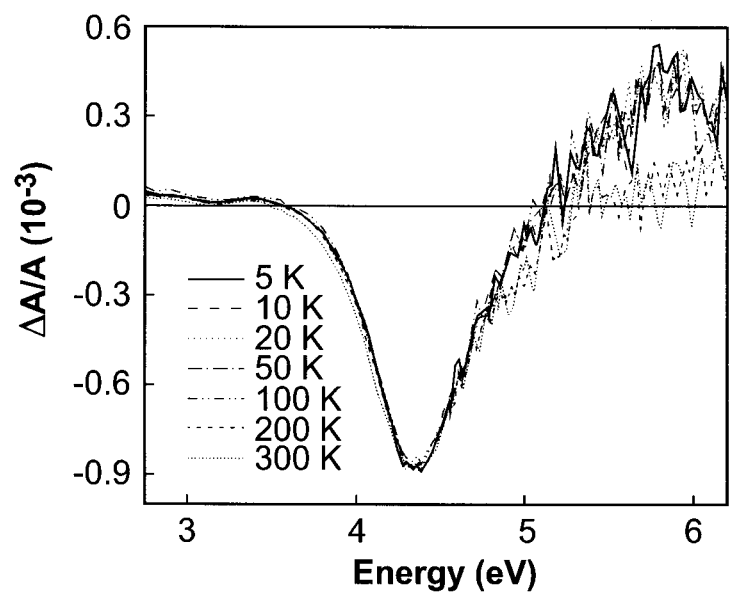
FIG. 3C is a graph illustrating 7 T MCD spectra of nanocrystals in FIG. 3A collected at different temperatures (5-300 K)

In this work MCD spectroscopy in Faraday geometry was used to examine the excitonic properties of ITO NCs. FIG. 3A (top panel) shows absorption spectrum of 10.0% ITO NCs in the visible range (band gap region). Typical 300 K MCD spectrum of $In_2O_3$ NCs collected at 7 T (FIG. 3A, middle panel) shows no measurable intensity, as expected. However, variable-field MCD spectra of ITO NCs (bottom panel) are dominated by negative bands that coincide with the NC band edge absorption. The intensity of the MCD band maximum at ca. 4.34 eV is plotted as a function of magnetic field in FIG. 3B (squares). The band gap MCD intensity is linearly dependent on the magnetic field, as evident from the best linear fit to the experimental data (solid line), identically to the MCD intensity of LSPR. The Brillouin function fit to the same data for the spin state S=½ and the electron spin Landé g-factor ($g_S$) of 2.002 (dashed line) shows significant deviation from the experimental data confirming that the observed field dependence is not associated with the Curie-type paramagnetism. Another unusual signature behavior of the circular magnetoplasmonic modes in $In_2O_3$ and ZnO NCs is their temperature-independent MCD intensity; it has been found that the LSPR MCD intensity remains unchanged from liquid helium to at least 30 K. FIG. 3C shows 7 T MCD spectra of 10% ITO NCs collected at various temperatures from 5 to 300 K. All spectra are essentially identical attesting to the temperature independence of the excitonic MCD intensity. The field and temperature dependencies in FIGS. 3A to 3C are specific to cyclotron motion of free electrons in plasmonic NCs, and unambiguously demonstrate plasmon-exciton interactions in ITO NCs. This is a highly surprising result because plasmon and exciton are off-resonance, and LSPR is not directly excited in these measurements. Furthermore, unlike LSPR, the band gap absorption transition is quantum mechanical in nature, suggesting the magnetoplasmonic-mode-induced splitting of the NC band states. An important conclusion that follows from these results is that plasmon-exciton coupling is responsible for both the excitation of the LSPR by exciton, and subsequent Zeeman splitting of the excitonic states by the magnetoplasmonic modes.

Figure 4:
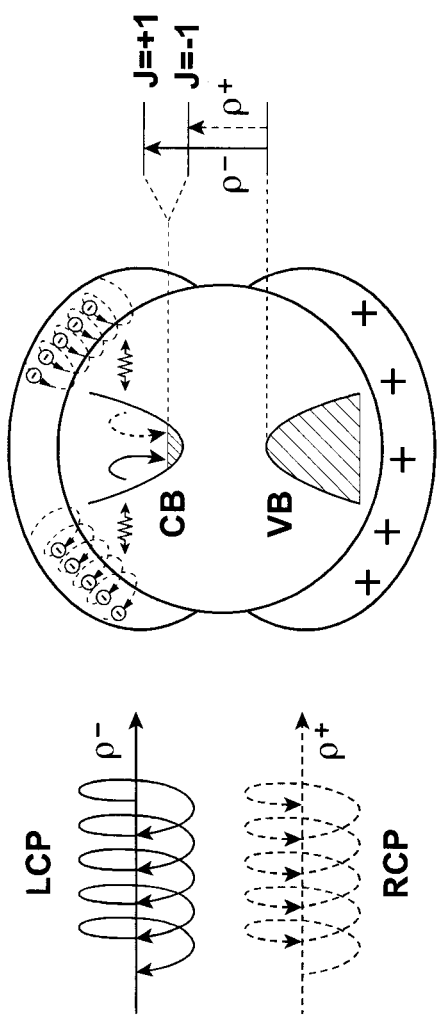
FIG. 4 is a schematic representation of the splitting of the conduction band states, induced by angular momentum of the cyclotron magnetoplasmonic modes.
Figure 5:
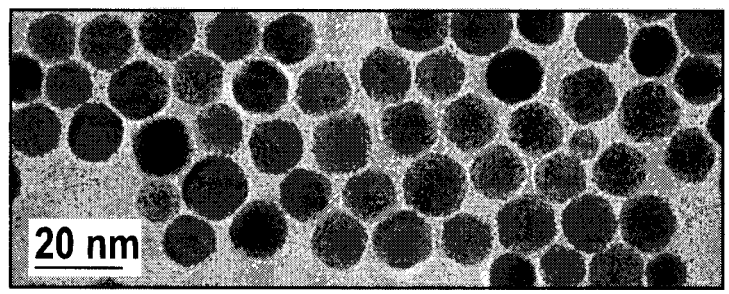
FIG. 5 is a transmission electron microscopy image of typical $Sn^{4+}$-doped $In_2O_3$ (ITO) nanocrystals synthesized in argon atmosphere.

Variable-temperature MCD measurements are very helpful in addressing the nature of the band splitting in semiconductor NCs. Specifically, the absence of the temperature dependence of MCD intensity, characteristic for the A-term, is associated with the lack of ground state splitting. Zeeman perturbation, represented as $\mu_B(\hat{L}+2\hat{S})B$, where $\hat{L}$ and $\hat{S}$ are the orbital and spin angular momentum operators, respectively, leads to splitting of the lowest unoccupied conduction band states. In the absence of a significant source of paramagnetism, the total angular momentum is largely due to the orbital angular momentum (i.e., J=L=1), with the Zeeman energy of the split states given by $E_{Zeeman}=\mu_B M_J B$ where $M_J=\pm 1$. Taken together, the field and temperature dependent measurements suggest that the circular magnetoplasmonic modes impart significant orbital angular momentum to the conduction band excited states, leading to the formation of oppositely polarized electronic states at the Fermi level (as shown in FIG. 4). In particular, FIG. 4 shows a schematic representation of the splitting of the conduction band excited states, induced by angular momentum of the circular magnetoplasmonic modes.

Figure 11:
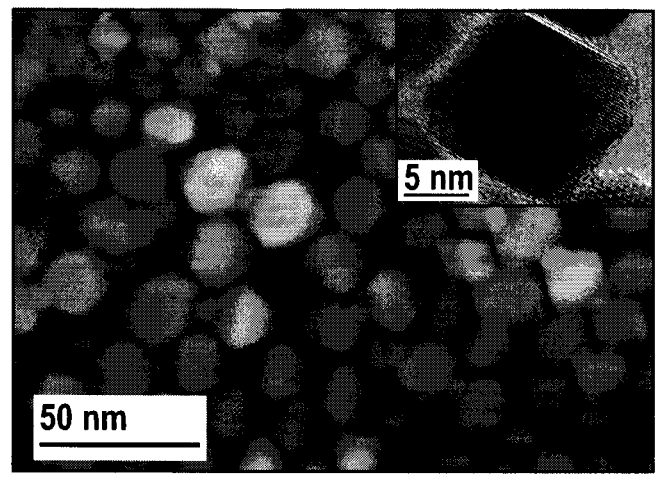
FIG. 11 shows a scanning transmission electron microscopy image of Mo-doped $In_2O_3$ (IMO) nanocrystals.
Figure 12:
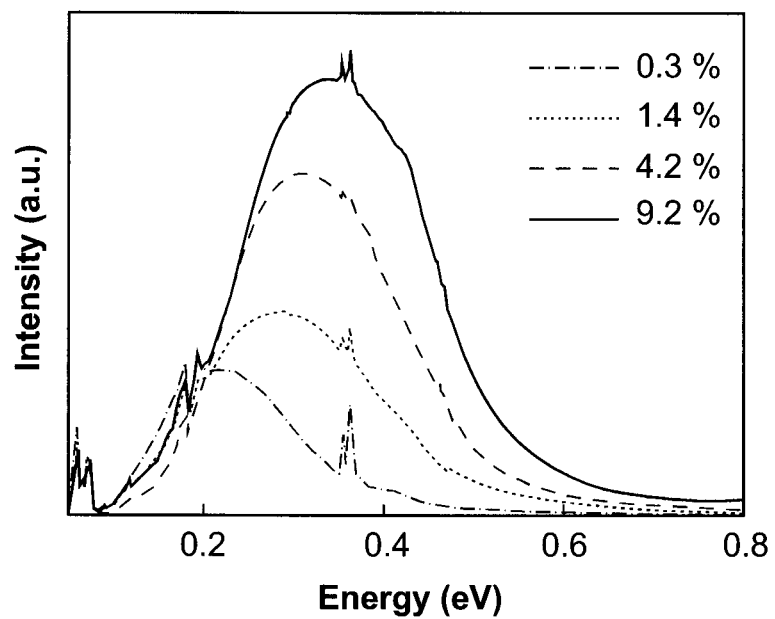
FIG. 12 is a graph showing LSPR absorption spectra of IMO nanocrystals having different doping concentrations.
Figure 13A:
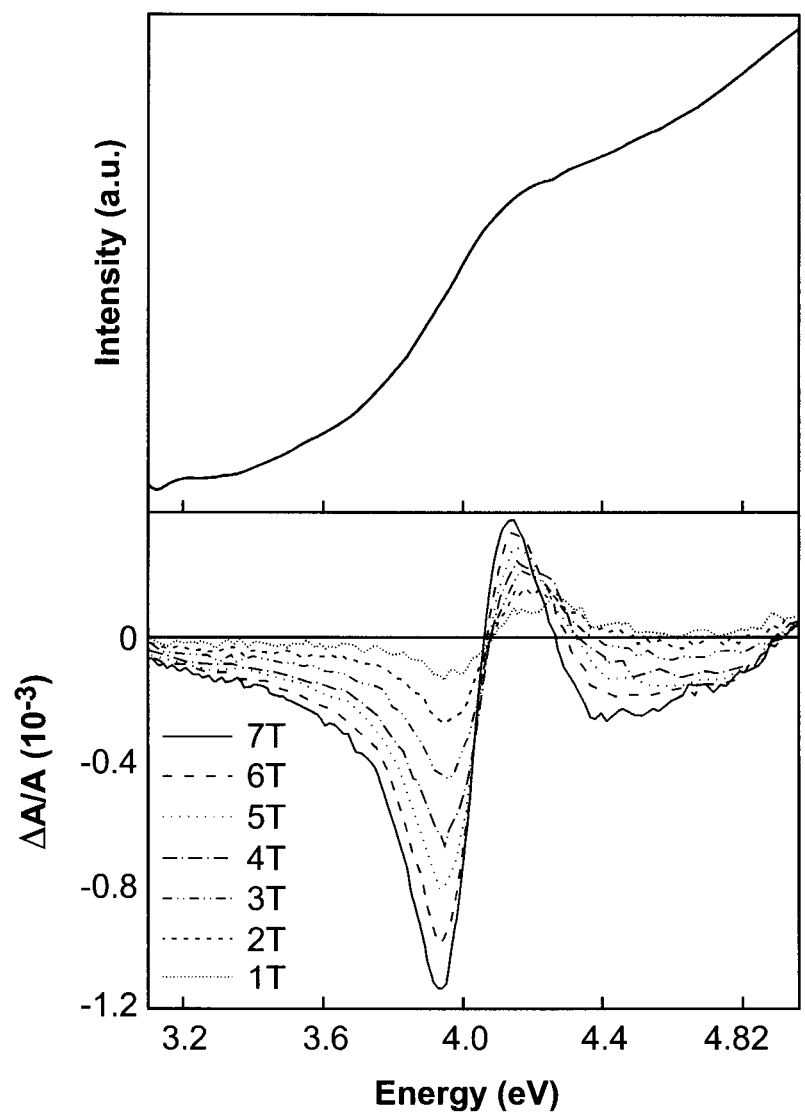
FIG. 13A is a graph showing absorption (top panel) and MCD (bottom panel) spectra of 0.3% IMO nanocrystals collected at 5K.

To demonstrate the generality of plasmon-induced electron polarization and the possibility of its manipulation a new material, Mo-doped $In_2O_3$ (IMO), NCs were synthesized. FIG. 11 shows typical electron microscopy image of IMO NCs. Most NCs have truncated tetragonal bypiramidal morphology and the bixbyite crystal structure. Their single-crystalline nature is evident from high-resolution TEM imaging (inset in FIG. 11). With increasing doping concentration LSPR band shifts to higher energy and increases in intensity, as suggested from the Drude-Lorentz model (FIG. 12). An increase in the number density of free electrons is also accompanied by the blue shift of the onset of the band edge absorption. MCD spectra of 0.3% IMO NCs collected at different magnetic field strengths. A robust derivative-shaped MCD signal with a negative maximum at ca. 3.93 eV coincides with the band edge absorption (FIG. 13A). The intensity of this peak also follows linear dependence on the magnetic field (FIG. 13B), confirming that it originates from the Zeeman splitting of the NC band states due to their coupling with the magnetoplasmonic modes.

Figure 13B:
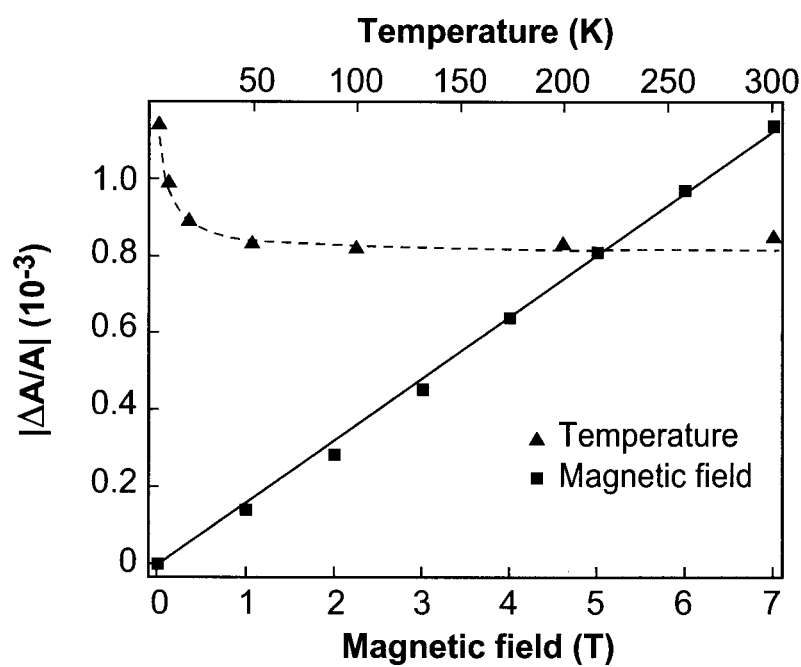
FIG. 13B is a graph showing magnetic field (squares) and temperature (triangles) dependence of MCD intensity recorded at 3.93 eV for IMO nanocrystals.
Figure 14:
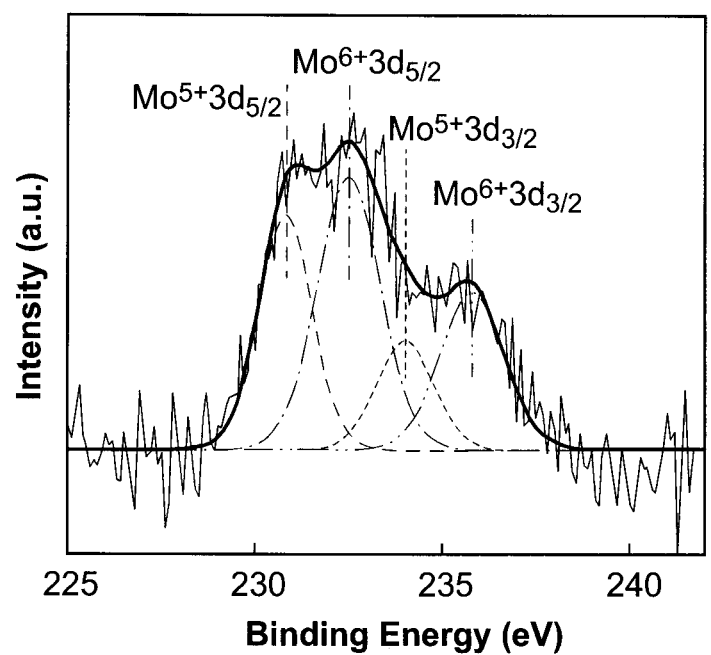
FIG. 14 is a graph showing Mo 3d X-ray photoelectron spectroscopy (XPS) illustrating oxidation state of molybdenum in IMO NCs.

However, unlike MCD spectra of ITO NCs, the intensity of this band at first decreases rapidly upon heating the sample and then levels off, dropping by ca. 25% from 5 to 300 K (FIG. 13B). Temperature dependence of MCD intensity typically indicates the presence of ground state splitting, and is characteristic for the C-term. At room temperature the MCD spectra have only A-term intensity, owing to the balanced population of the two ground state sublevels. On the other hand, at low temperatures the Boltzmann population of the higher energy sublevel is reduced, resulting in a combination of A- and C-term. The C-term is generally observed for species with ground state paramagnetism, and follows Curie-type temperature dependence. Paramagnetism in IMO NCs is due to the presence of $Mo^{5+}$ which is formed in situ by reduction of $Mo^{6+}$ precursor, similarly to $MoO_{3-x}$ NCs (FIG. 14). Simulated MCD temperature dependence for a $d^1$ transition metal ion ($Mo^{5+}$).

Figure 15:
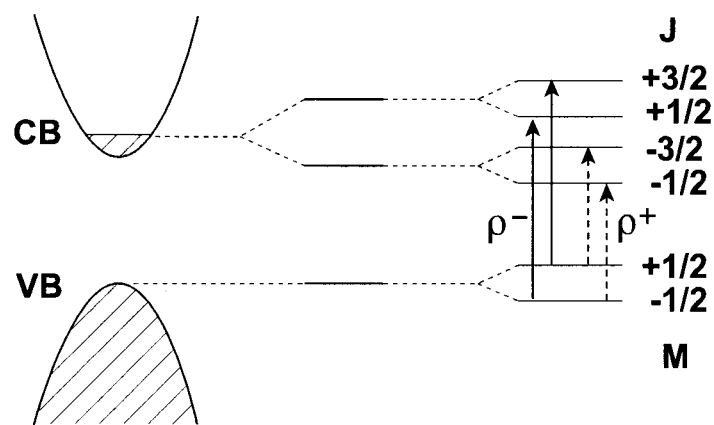
FIG. 15 is a schematic representation of the excitonic splitting for IMO nanocrystals owing to the paramagnetism induced by the presence of Mo dopant in 5+ oxidation state.

Although a decrease in MCD intensity for IMO NCs with temperature obeys Curie behavior at low temperatures, the majority of the intensity measured at 5 K persists up to room temperature indicating a dominant A-term intensity associated with plasmon-exciton coupling. These results indicate that the spin angular momentum is coupled with the orbital angular momentum to provide additional splitting in the ground and excited states (FIG. 15). Careful inspection of the MCD spectra reveals asymmetric shape of both negative and positive bands, consistent with the anomalous Zeeman effect. These results suggest the possibility of using transition metal aliovalent dopants to further manipulate the band splitting and carrier polarization in semiconductor NCs.

Given this distinct magneto-plasmonic behavior, it is possible to use a combination of magneto-optical and magneto-electrical methods to manipulate the quantum states in plasmonic semiconductor nanostructures. For example, colloidal synthesis of plasmonic $In_2O_3$ NCs doped with molybdenum, tungsten, and titanium has been developed. These dopants have d-orbitals that could play a significant role in the behavior of transparent conducting oxides. As noted above, FIG. 11 shows a typical scanning transmission electron microscopy (TEM) image of Mo-doped $In_2O_3$ (Mo: $In_2O_3$) NCs, as an example. Absorption spectra of Mo:$In_2O_3$ NCs in the mid-IR region are shown in FIG. 12. The spectra are dominated by strong LSPR bands, which shift to higher energy with increasing doping level. It has been discovered that at least of ITO NCs, the maximum intensities and energies follow the Drude-Lorenz model for semiconductors, with $\omega_p \sim n^{1/2}$ and $\alpha_{abs} \sim n$, where $\omega_p$ is the plasma frequency, $\alpha_{abs}$ is the absorption coefficient, and n is the number density of free charge carriers. The measurements of plasmon-exciton coupling were performed in Faraday geometry by measuring the difference between the absorption of left and right circularly polarized (LCP and RCP, respectively) beams when a variable magnetic field is applied parallel to the direction of light propagation. FIG. 13A shows 5 K absorption spectrum (top) and the corresponding variable-field magnetic circular dichroism (MCD) spectra (bottom) of 0.3% Mo:$In_2O_3$ NCs in the band gap region. As shown in FIG. 3A, for ITO NCs, typical 5 K MCD spectrum of $In_2O_3$ NCs collected at 7 T is shown for comparison (middle) and, as expected, shows no measurable intensity. However, all MCD spectra of Mo:$In_2O_3$ NCs show a strong MCD signal with the dominant negative band, and the inflection point that coincides with the first shoulder of the band gap absorption spectrum. The intensity of the MCD band maximum at 3.93 eV is plotted as a function of B in FIG. 13B The linear dependence of MCD intensity on the magnetic field unambiguously demonstrates plasmon-induced splitting of $In_2O_3$ NC band states. This is extremely surprising result because plasmon and exciton are non-resonant, and LSPR is not directly excited in these measurements. This observation suggests that that there is a direct electronic coupling between LSPR and quantized transitions involving NC band structure that allows the excitation of the magneto-plasmonic modes and subsequent splitting of the NC band states and electron/spin polarization. These results are believed to represent the first example of intrinsic plasmon-exciton coupling in any plasmonic semiconductor system.

While a full understanding of the effect of plasmon on quantum states in reduced dimensions is still developing, an investigation of the magneto-optical properties of transition-metal doped plasmonic NCs (Mo: $In_2O_3$ and Ti: $In_2O_3$ NCs) is expected to clarify the role of d-orbital occupancy in plasmon-exciton coupling via spectral modelling and electronic structure calculations. Further, it is believed that quantum confinement and nanostructure morphology will play a role in manipulating the interaction between LSPR and quantum states based on the NC size and shape. It is also possible that coupling of p-type plasmonic nanostructures with quantum states will also be available. One potential material for these purposes is, for example, non-stoichiometric copper sulfide and copper selenide nanocrystals and nanowires, which feature LSPR associated with valence band holes.

The detection of circular magneto-plasmons is believed to represent a significant advancement in sensitivity of refractometric sensors based on the LSPR shift in the magnetic field. The observed peak shift of the exciton due to plasmon-exciton interactions can also be quite large in magnitude, making it very sensitive to chemical surrounding and temperature. While this technology does not immediately exploit quantum correlations characteristic for typical quantum sensors (such as entanglement) to achieve higher sensitivity or resolution, it serves as a viable starting point for more advanced commercial applications. It is expected that plasmon control of single defect states and their entanglement in plasmonic nanowire systems, which can be detected by single nanowire magneto-optical and magneto-electrical measurements, provides a quantum qubit that can be used for broader application of these devices/systems in quantum sensing and computing.

Figure 16A:
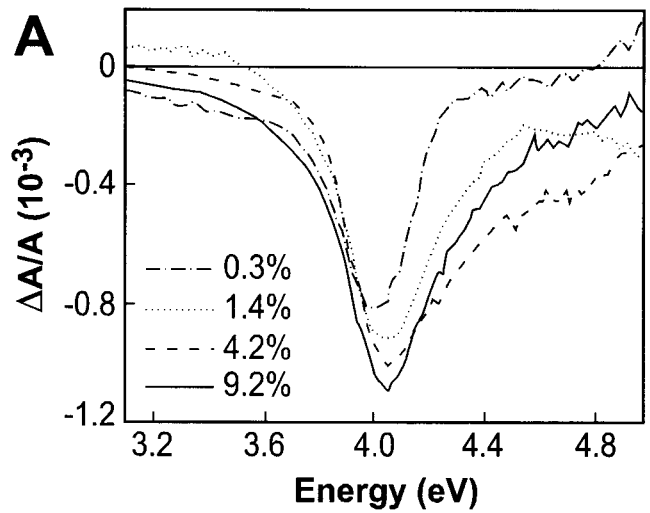
FIG. 16A is a graph illustrating normalized A term MCD spectra (collected at 100 K) of IMO nanocrystals with different molybdenum doping concentrations (as indicated in the graph) in the fundamental band gap region.

The possibility of controlling the magnitude and orientation of charge carrier polarization using circular magneto-plasmonic modes as a new degree of freedom was also explored. FIG. 16A compares A-term MCD spectra of IMO NCs having different doping concentrations. The measurements were performed on the samples having the same NC band gap absorbance. With increasing doping concentration MCD intensity associated with the excitonic transition increases, demonstrating the control of plasmon-exciton coupling strength and the corresponding NC band splitting by controlling the LSPR intensity. On the other hand, the C-term intensity (determined as the difference between MCD spectra collected at 5 and 100 K) has exactly the opposite trend (FIG. 16B); as the strength of plasmon-exciton coupling decreases with decreasing doping concentration, the relative contribution of the C-term (paramagnetism in the ground state due to $Mo^{5+}$) increases. Furthermore, to demonstrate the full control over carrier polarization, the MCD spectra of IMO NCs for the opposite directions of the external magnetic field was measured.

Figure 16B:
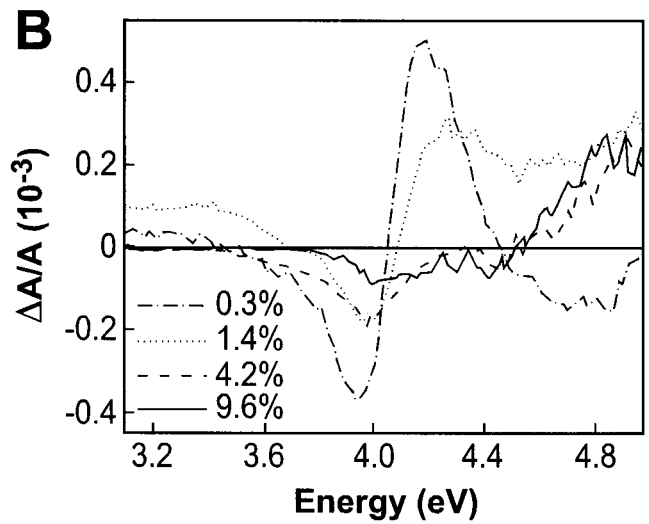
FIG. 16B is a graph illustrating normalized C term MCD spectra of IMO nanocrystals from FIG. 16A.
Figure 16C:
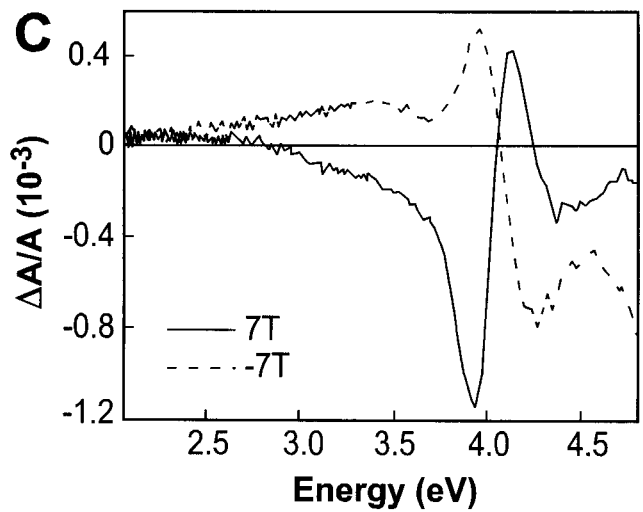
FIG. 16C is a graph illustrating exciton MCD spectra of 0.3% IMO nanocrystals recorded at 5 K for the opposite polarities of the external magnetic field of 7 T.

In particular, the exciton MCD spectra of 0.3% IMO NCs recorded at 5K for the opposite polarities of the external magnetic field of 7 T. The observed reversal of the sign of the exciton MCD signal demonstrates switching of the carrier polarization by controlling the direction of the cyclotron motion of free electrons (FIG. 16C).

In analogy to emerging electronic technologies that rely on different degrees of freedom for achieving the polarization of charge carriers, including spintronics (electron spin) and valleytronics (discrete values of crystal momentum), there is reference to harnessing circular plasmonic modes for information processing, transmittal, and storage as plasmontronics. In that context it is particularly instructive to compare the properties of plasmonic semiconductor NCs to those of diluted magnetic semiconductors (DMSs) in which polarized electronic states arise from sp-d exchange interactions between unpaired d electrons on transition metal dopant centers and host lattice charge carriers. Practical utilization of a DMS requires a system that supports itinerant-carrier-mediated ferromagnetic ordering of dopant centers at or above room temperature, is compatible with the current semiconductor technology and is, ideally, transparent to visible light. Additionally, the minimum device size is generally limited thermodynamically by the size of the ferromagnetic domains. In contrast to DMSs, carrier polarization in plasmonic semiconductor NCs is a universal phenomenon that persists above room temperature, owing to the temperature independent properties of the circular magnetoplasmonic modes. Importantly, LSPR is inherently a single NC effect that can be attained in NCs below 2 nm in diameter containing only a few free electrons. These properties allow for a dynamic control of the carrier polarization at room temperature in nanoscale semiconductor devices.

In summary, embodiments described herein have demonstrated dynamic control of the carrier polarization in transparent plasmonic semiconductor NCs using magnetoplasmonic mode as an additional degree of freedom. The observed NC band splitting can be further modified by using aliovalent dopants with unpaired d electrons. Circular plasmonic modes and their relative oscillator strength are also sensitive to NC size and shape, allowing for a variety of ways to manipulate carrier polarization in plasmonic semiconductor NCs. The ability to achieve polarized carriers in individual NCs at room temperature opens up the new field of "plasmontronics", with the possibilities for fundamental investigation of plasmon-exciton and plasmon-spin interactions in reduced dimensions and for technological applications in photonics, optoelectronics, and quantum information processing.

Various materials and methods were used to determine the embodiments described above. In particular, the reagents and solvents are generally commercially available. Further, Indium(III) acetylacetonate (In(acac)$_3$, 98%) and tin(IV) chloride pentahydrate (SnCl$_4$.5H$_2$O, 98%) and Bis(acetylacetonato)dioxomolybdenum(VI) (MoO$_2$(acac)$_2$), oleylamine (70%), and oleic acid (90%) are also readily available.

The syntheses of ITO and IMO NCs were based on an experimental procedure. In a 100 mL three-neck round-bottom flask, 0.9 g of In(acac)$_3$, 7.2 g of oleylamine and different amounts of doping precursors, SnCl$_4$.5H$_2$O or MoO$_2$(acac)$_2$, were mixed together. The reaction mixture was heated to 250° C. within 1 h and then allowed to react for another 1 h under the flow of argon with continuous stirring. The mixture was slowly cooled to room temperature and the precipitate was collected by centrifugation at 3000 rpm for 10 min. After the precipitate was washed with ethanol three times, 1.5 mL oleic acid was added and the mixture was heated to 90° C. for 30 min. This procedure was performed in order to remove any surface-bound dopant ions and impurities. The NC samples were subsequently precipitated again and washed with ethanol three times. The obtained NCs were dispersed in a non-polar solvent, such as hexane or toluene.

Transmission electron microscopy (TEM) images were collected with a JEOL-2010F microscope operating at 200 kV. Copper grids with lacey Formvar/carbon support films purchased from Ted Pella, Inc. were used to prepare the specimen for TEM measurements. Powder X-ray diffraction (XRD) patterns were obtained with an INEL diffractometer with a position-sensitive detector and monochromatic Cu Kα radiation (λ=1.5418 Å). Raman spectra were collected at room temperature with a Renishaw 1000 spectrometer using the Ti-sapphire laser tuned to 785 nm. XPS spectra were recorded with VG Scientific ESCALAB 250 spectrometer, using Al Kα radiation (1486.6 eV photon energy) as the excitation source.

The UV-vis-NIR absorption spectra were collected with a Varian Cary 5000 UV-vis-NIR spectrophotometer. The UV-visible-NIR measurements were performed on colloidal suspensions of NCs or upon drop-casting the colloidal suspensions onto quartz substrates. Fourier transform infrared (FTIR) spectroscopy measurements were performed using a FTIR Bruker Tensor 37 spectrometer. FTIR spectra were collected using KBr pellets on which colloidal NCs were drop-casted.

MCD spectroscopic measurements were carried out in Faraday configuration using a Jasco J-815 spectropolarimeter for generating circularly polarized light and signal detection. Samples were housed in an Oxford SM 4000 magneto-optical cryostat which allows for variable temperature (1.5 to 300 K) and variable field (0 to 8 T) operation. The NCs were deposited on strain-free quartz substrates by drop-casting the colloidal suspensions in toluene. The MCD intensity (the difference in absorption of left and right circularly polarized light) was expressed as ellipticity (θ, millidegree) of the transmitted light.

The magnetic-field-dependent MCD measurements were made at 5 K under varied magnetic field from 1 to 7 T with 1 T interval. The full-range spectra were collected from 200 to 800 nm with 1 nm data pitch, 1 s response time, and 1 accumulation. The high-resolution MCD spectra in the band gap region were collected in the range of 250-400 nm with 1 nm data pitch, 2 s response time, and 2 accumulations. The variable-temperature MCD spectra were collected at 7 T and different temperatures (5, 10, 20, 50, 100, 200, and 300 K).

LSPR band absorbance and peak energy as a function of Sn$^{4+}$ doping concentration are defined according to the Drude-Lorenz model. Specifically, the absorption coefficient (α) for the LSPR is directly proportional to the charge carrier density (n), according to the following expression:

$$\alpha_{free-electrons} = \frac{ne^2}{m*\varepsilon_0 nc\tau\omega^2}$$

where e and m* are the charge and effective mass, respectively, of an electron, $\varepsilon_0$ is the vacuum permittivity, τ is the mean time between two electron scattering events, n is the refractive index of undoped semiconductor, and c and ω are the speed and frequency of light, respectively. On the other hand, the plasma frequency ($\omega_p$) has a square root dependence on the free electron concentration:

$$\omega_p = \sqrt{\frac{ne^2}{m*\varepsilon_{opt}\varepsilon_0}}$$

where $\varepsilon_{opt}=n^2$ is the dielectric constant measured in the transparent region of the spectrum of an undoped semiconductor. Agreement of the experimental data with the Drude-Lorenz model has been previously demonstrated. Surprisingly, the undoped In2O3 NCs synthesized in argon also show a small but clearly observable LSPR band in the mid-IR (MIR). The most likely source of these electrons is oxygen vacancies, which are readily formed in transparent metal oxides although; LSPR in non-stoichiometric $In_2O_3$ has not been reported. To confirm this hypothesis, we measured the absorption spectra of $In_2O_3$ NCs prepared under oxidizing conditions to reduce the probability of oxygen vacancy formation and minimize their concentration. Besides the sharp vibrational overtones associated with the solvent molecules and/or coordinating ligands, no LSPR can be detected, confirming the absence of multiple free electrons. It has been shown that as few as 3-4 delocalized carriers can undergo collective oscillation and give rise to LSPR in $In_2O_3$ NCs of similar size, suggesting that any electrons associated with oxygen vacancies in these NCs are truly localized. An increase in the concentration of free electrons due to NC synthesis in an inert atmosphere and introduction of Se aliovalent dopant is also evident from the blue shift of the apparent band edge absorption The circular polarization of light was defined according to the "optics" convention (i.e., referenced to the detector or looking toward the source). The corresponding MCD spectra were represented as outlined in references. MCD intensity in defined as $\Delta A = A_L - A_R$, where $A_L$ and $A_R$ are the absorption of left ($\rho^-$) and right ($\rho^+$) circularly polarized light, and represented as a degree of ellipticity. The MCD intensities were converted to $\Delta A/A$ from ellipticity ($\theta$) using the relationship:

$$\frac{\Delta A}{A} = \frac{\theta}{32982 \times A}$$

where $\theta$ is in millidegree, and A is the band gap absorbance determined from the absorption spectrum simultaneously collected by the CD detector.

Figure 8B:
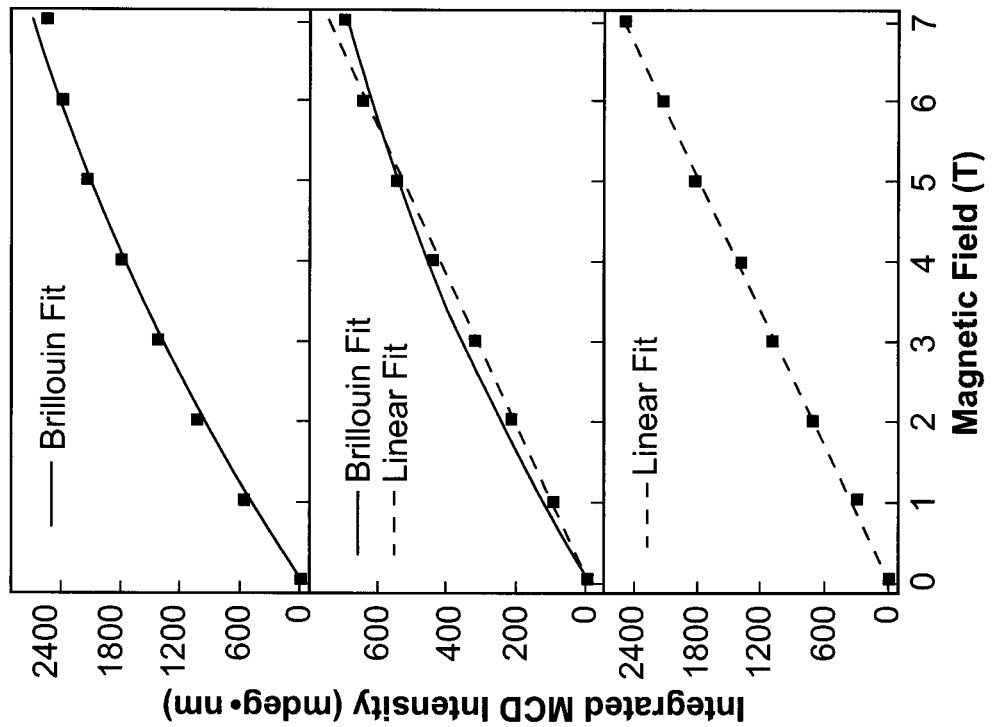
FIG. 8B is a graph illustrating integrated excitonic MCD signal intensities for samples in FIG. 8A plotted against magnetic field.
Figure 8A:
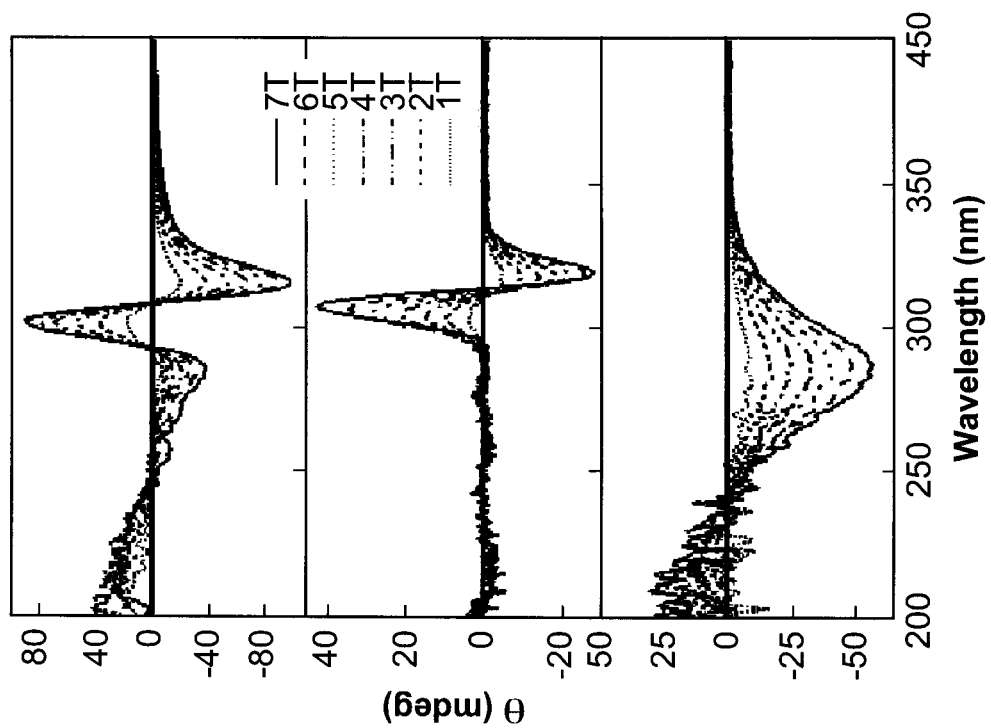
FIG. 8A is a graph showing magnetic-field dependent MCD spectra of exciton transition of $In_2O_3$ NCs synthesized in air (top panel), in argon (Ar) (middle panel), and 10% $Sn^{4+}$-doped $In_2O_3$ NCs.

Magnetic field dependence of the exciton MCD intensity was obtained from the high-resolution MCD spectra collected at different fields from 1 to 7 T, after the baseline subtraction using the spectrum collected at 0 T. The corrected field-dependent intensities at the MCD band maximum were fitted to a linear function in B to compare with the field dependence of the MCD intensity for LSPR. In addition, to clearly distinguish it from the Curie behavior, the magnetic field dependence of the intensity of MCD spectra at band edge energy was also fitted with the spin-only Brillouin function:

$$M_s = \frac{1}{2}Ng_S\mu_B\left[(2S+1)\coth\left((2S+1)\frac{g_S\mu_B B}{2k_B T}\right) - \coth\left(\frac{g_S\mu_B B}{2k_B T}\right)\right]$$

where S is the spin quantum number, $g_S$ is the corresponding Landé g-factor, B is the external magnetic field, $\mu_B$ is the Bohr magneton, $k_B$ is the Boltzmann constant, and T is the temperature (see dashed lines in most magnetic dependence MCD intensity figures). For the fitting, considering the case of free electrons, we used the values $g_S=2.002$ and $S=\frac{1}{2}$, while N was treated as the fitting parameter. An excellent fit to the experimental data points suggests that native defects containing localized unpaired electrons can spin-split the NC band states in analogy to transition metal dopants in diluted magnetic semiconductors (FIGS. 8A and B, top panels). The MCD spectra of $In_2O_3$ NCs synthesized under inert atmosphere show qualitatively similar trend with increasing magnetic field, although fitting to the MCD intensities shows deviation from $S=\frac{1}{2}$ Brillouin function dependence toward linear behavior (FIGS. 8A and B, middle panels). Upon incorporation of the sufficiently high concentration of $Sn^{4+}$, the MCD intensity becomes completely linearly dependent on the magnetic field (FIGS. 8A and B, bottom panels). This reversal of the functional form from saturation to linearity suggests a change in the origin of the excitonic splitting, which is well-correlated with the evolution of LSPR. As detailed herein, magnetoplasmonic modes, induced by the excitation of plasmonic $In_2O_3$ NCs with circularly polarized light in an external magnetic field, transfer angular momentum to the excitonic states leading to their Zeeman splitting. It should be noted that broadening of the MCD spectrum of ITO NCs is associated with a range of free electrons in NCs due to variation in doping concentrations as well as the NC size distribution.

For the temperature-dependent MCD intensity measurements, the spectra collected in the absence of magnetic field were used as baselines for correcting the MCD spectra measured at different temperatures from 5 to 300K. The fitting of temperature-dependent MCD intensities for IMO NCs involves the deconvolution of A-term and C-term from the overall MCD intensity (see the following section for more detailed discussion about A-term and C-term). The C-term MCD intensity vanishes almost completely at high temperatures, and the MCD intensity measured at room temperature was taken as the A-term contribution only. The maximum exciton MCD intensity at 300 K was subtracted from the maximum intensities measured at all other temperatures to obtain the temperature dependence of the C-term which was fitted with the Curie-type relationship:

$$M = \frac{N}{T}$$

where T is the temperature, ranging from 5 K to 300 K, and N is chosen as the fitting parameter. Adding A-term intensity (300 K) to the fitting curve for C-term intensity reproduces very well the temperature dependence of the overall MCD intensity. The doping concentration dependence of the A-term and C-term intensities were obtained in a similar way.

MCD intensity for a transition from the ground state |A> to an excited state |J> is defined as:

$$\frac{\Delta A}{E} = \left(\frac{2N_0\pi^3\alpha^2 Cl\log e}{250\,hcn}\right)\mu_B B\left[A_1\left(-\frac{\partial f(E)}{\partial E}\right) + \left(B_0 + \frac{C_0}{kT}\right)f(E)\right]$$

Where $\Delta A$ is the differential absorption between left and right circular polarized light, $E=h\nu$, $\alpha$ is the electric permeability, C is the concentration, l is the path length, n is the index of refraction, $\mu_B$ is the Bohr magneton, and B is the applied magnetic field. $A_1$, $B_0$, and $C_0$ are known as the MCD A-, B-, and C-term, respectively, f(E) is the absorption spectrum band shape, and ∂f(E)/∂E is its first derivative. Under external magnetic field along the light propagation direction (z), the ground and/or excited states are split due to a Zeeman perturbation with a magnitude $-\mu_z B = \mu_B(g_L \hat{L}_z + g_S \hat{S}_z)B$, where $\hat{L}_z$ and $\hat{S}_z$ are the orbital and spin angular momentum operators, respectively, and $g_L=1$ and $g_S=2.002$ are the corresponding gyromagnetic ratios. The overall electron angular momentum responsible for electron polarization is J=L+S, with the MCD selection rule $\Delta M_J = \pm 1$ (+1 for left circularly polarized light and −1 for right circularly polarized light).

One of the ways to experimentally differentiate between different terms is the temperature-dependence of the MCD intensity. A-term MCD occurs in a system which has degenerate excited states. Under magnetic field, the excited states are split due to the Zeeman effect. Since the Zeeman splitting is usually only a few wavenumbers, the two oppositely signed absorption bands will sum to a derivative shape MCD signal. On the contrary, C-term MCD requires degenerate ground states which undergo Zeeman splitting in the external magnetic field. At low temperatures, kT is comparable to or smaller than the magnitude of the Zeeman splitting in the presence of a strong magnetic field, causing the Boltzmann population of the lower ground state sublevel to be larger than that of the higher-energy sublevel. Hence, two oppositely signed absorption bands will have different intensities, resulting in mostly absorption band shape. C-term MCD is generally associated with the Zeeman splitting due to ground state paramagnetism, and therefore follows temperature dependence characteristic for the Curie law.

Figure 6B:
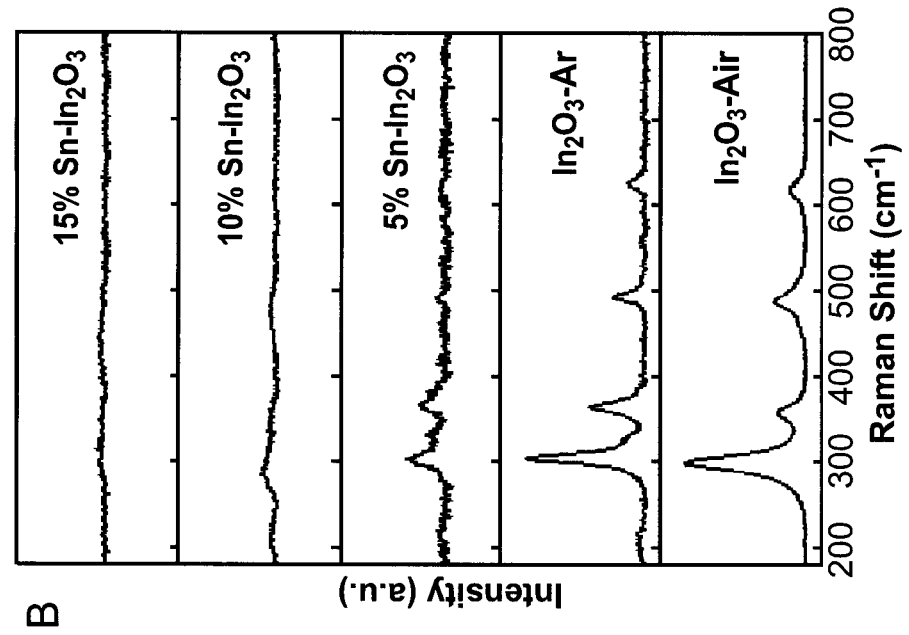
FIG. 6A is a graph showing X-ray diffraction (XRD) patterns of $Sn^{4+}$-doped $In_2O_3$ NCs with different doping concentration and pure $In_2O_3$ NCs synthesized under different atmosphere and FIG. 6B illustrates Raman spectra of samples in FIG. 6A.
Figure 6A:
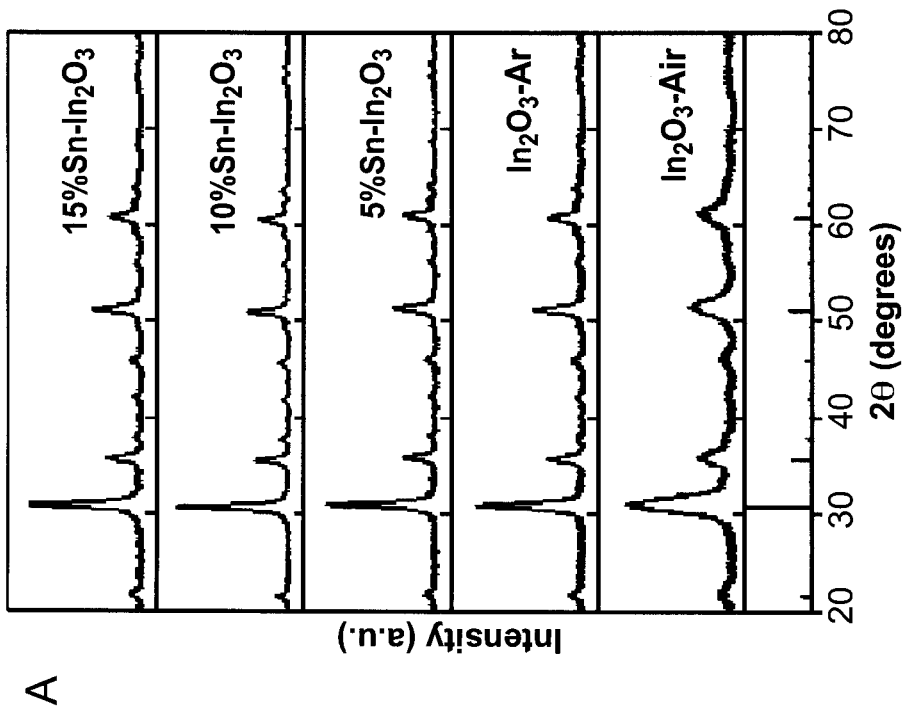

FIG. 6A illustrates XRD patterns of Sn-doped $In_2O_3$ NCs with different doping concentration and pure $In_2O_3$ NCs synthesized under different atmosphere. Vertical lines represent the XRD pattern of bulk cubic (bixbyite) $In_2O_3$ (JCPDS 06-0416). FIG. 6B further illustrates Raman Spectra of samples in FIG. 6A.

Figure 7B:
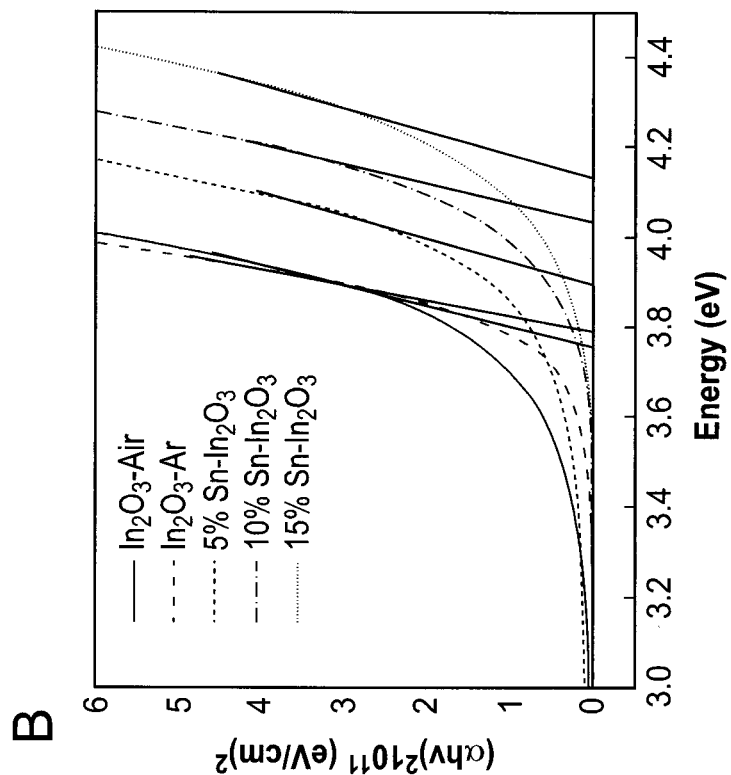
FIGS. 7A and 7B show absorption spectra of $Sn^{4+}$-doped $In_2O_3$ NCs with different doping concentration and pure $In_2O_3$ NCs synthesized under different atmosphere in mid-infrared range and Tauc plots of the same samples, respectively.
Figure 7A:
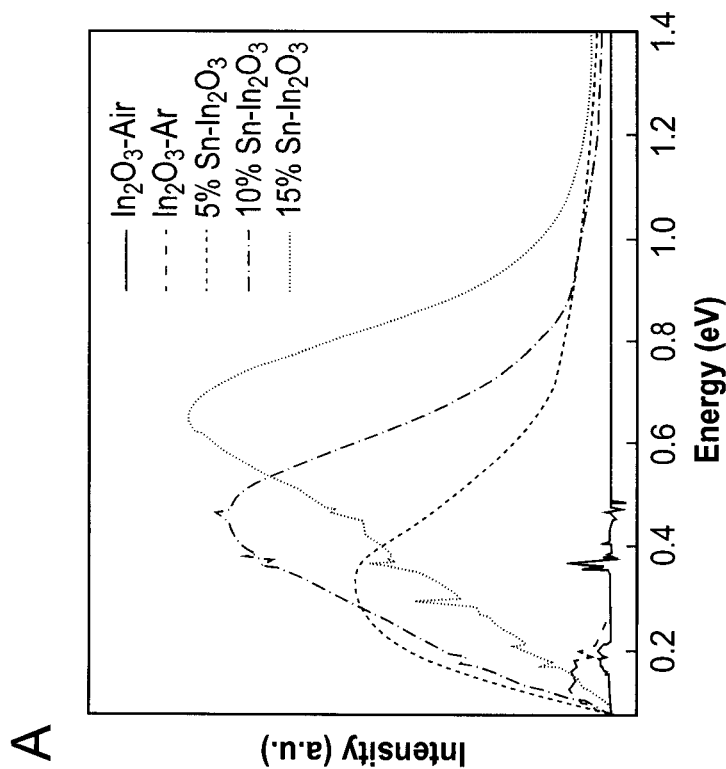

FIGS. 7A and 7B illustrate absorption spectra of Sn-doped $In_2O_3$ NCs with different doping concentration and pure $In_2O_3$ NCs synthesized under different atmosphere in mid-infrared range and Tauc plots of the samples. FIG. 8A is a graph illustrating magnetic-field dependent MCD spectra of exciton transition of $In_2O_3$ NCs synthesized in air (top panel), in Ar (middle panel), and 10% $Sn^{4+}$-doped $In_2O_3$ NCs. FIG. 8B is a graph illustrating excitonic MCD signal intensities for samples in FIG. 8A plotted against magnetic field.

FIG. 9A is a graph illustrating temperature-dependent MCD spectra of the exciton transition of $In_2O_3$ NCs synthesized in air (top panel), in Ar (middle panel), and 10% $Sn^{4+}$-doped $In_2O_3$ NCs. FIG. 9B is a graph illustrating 300 K MCD spectra of $Sn^{4+}$-doped $In_2O_3$ NCs with different doping concentration and pure $In_2O_3$ NCs synthesized under different atmosphere (in argon and air). FIG. 9C is a graph of excitonic MCD signal intensities for samples in B plotted against temperature.

Figure 10A:
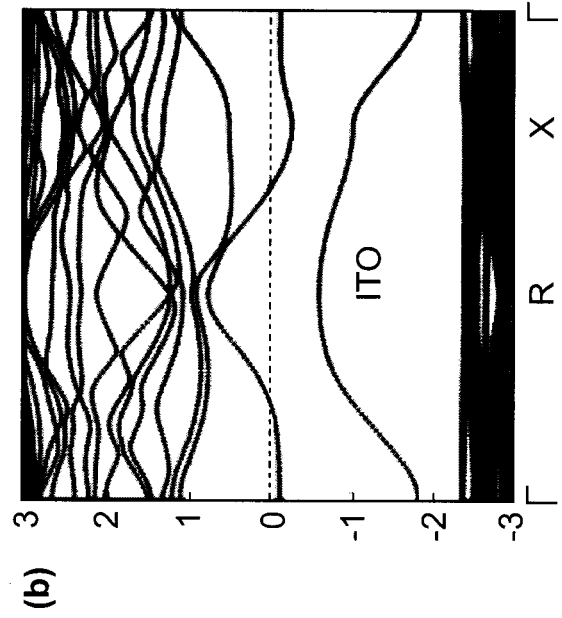
FIG. 10A illustrates calculated electronic band structures of $In_2O_3$ with the presence of one oxygen vacancy in an 80-atom unit cell.
Figure 10B:
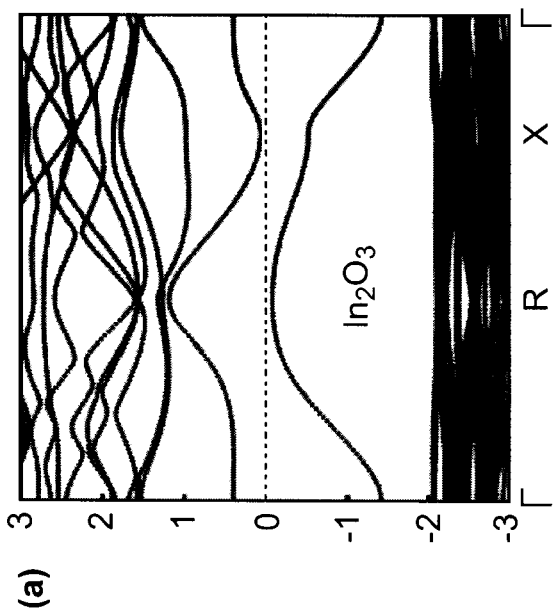
FIG. 10B illustrates calculated electronic band structure of Sn-doped $In_2O_3$ with the presence of one oxygen vacancy in an 80-atom unit cell.
Figure 10C:
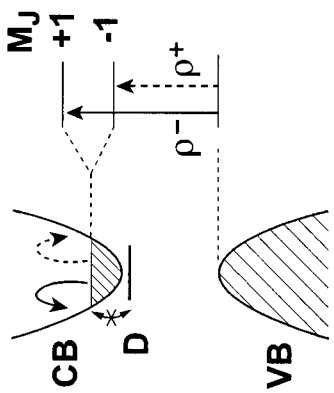
FIG. 10C illustrates two different mechanisms of MCD excitonic splitting.
Figure 10C:
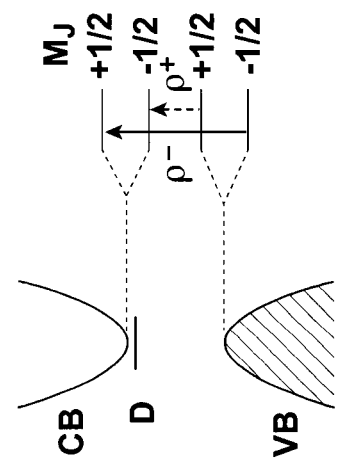

FIG. 10A illustrates calculated electronic band structures of $In_2O_3$ containing one oxygen vacancy in an 80-atom unit cell. FIG. 10B illustrates calculated electronic band structure of $Sn^{4+}$-doped $In_2O_3$ with the presence of one oxygen vacancy in an 80-atom unit cell. FIG. 10C illustrates two different mechanism of MCD excitonic splitting. Left panel illustrates the band splitting associated with spin-induced splitting arising from localized defect states (rather than transition metal dopants). Right panel illustrates magneto-plasmon-induced splitting, as detailed herein.

Band structure diagram confirms that $In_2O_3$ is a direct bandgap semiconductor, with the valence band maximum and the conduction band minimum at the centre of the Brillouin zone. The calculated bandgap energy at r point is ca. 1.15 eV. This value is smaller than optically determined bandgap energy, due to well-documented underestimation of the band gap energy by DFT. The conduction band has a large dispersion, indicating a low effective electron mass and high electron mobility. The band structure diagram for ITO also shows large conduction band dispersion and the low effective electron mass, similarly to $In_2O_3$. The Burstein-Moss shift experimentally observed for ITO is due to the conduction band occupancy as evidenced by the position of the Fermi level relative to the bottom of the conduction band. The dopant states in ITO do not exhibit significant localization at the Fermi level or conduction band minimum, implying strong hybridization of dopant ions with coordinating oxygen ions. The main features of the band structure diagram remain similar for IMO. The Fermi level for IMO lies at lower energy relative to the conduction band minimum than that for ITO, consistent with the lower energy of LSPR band and a smaller Burstein-Moss shift. However, in contrast to ITO, Mo 4d states are localized around the Fermi level, which is consistent with anomalous Zeeman splitting of the excited conduction band states observed in the MCD spectra.

FIG. 15 is a schematic representation of the excitonic splitting for IMO nanocrystals owing to the paramagnetism induced by the presence of Mo dopant in 5+ oxidation state. The presence on unpaired electron on Mo5+ dopants (d1 transition metal ion) causes additional anomalous (spin-induced) Zeeman splitting of the valence band (VB) and conduction band (CB) states. The structure and splitting of the valence band is simplified for the purpose of conceptual representation and clarity. Blue and red vertical arrows indicate the absorption of left and right circularly polarized light, respectively.

FIG. 16A is a graph illustrating normalized A term MCD spectra (collected at 100 K) of IMO nanocrystals with different molybdenum doping concentrations (as indicated in the graph) in the fundamental band gap region. FIG. 16B is a graph illustrating normalized C term MCD spectra of IMO nanocrystals in FIG. 16A. FIG. 16C is a graph illustrating exciton MCD spectra of 0.3% IMO nanocrystals recorded at 5 K for the opposite polarities of the external magnetic field of 7 T.

FIGS. 17A to 17D illustrate plasmon-induced band splitting in 9.2% IMO NCs. FIG. 17A shows absorption (top) and MCD (bottom) spectra of 9.2% IMO NCs collected at 5 K. External magnetic field strengths corresponding to different MCD spectra are indicated in the graph. FIG. 17B shows exciton MCD spectra of 9.2% IMO NCs collected at different magnetic field strengths, as indicated in the graph. Peak asymmetry indicates the contribution of orbital and spin angular momentum, as depicted in FIG. 15. FIG. 17C shows 7 T MCD spectra of 9.2% IMO NCs collected at different temperatures (5-300 K). FIG. 17D shows magnetic field (squares) and temperature (triangles) dependence of MCD intensity recorded at the maximum of the negative MCD band for 9.2% IMO NCs. The MCD intensity follows the linear dependence on the magnetic field associated with plasmon-exciton coupling, and slightly decreases with temperature, as expected from the Curie's law, owing to the presence of $Mo^{5+}$. These results reiterate the conclusions of the main text for IMO NCs.

FIG. 14 illustrates an oxidation state of molybdenum in IMO NCs. Molybdenum 3d XPS spectrum of typical IMO NCs. The Gaussian peak fitting suggested the presence of molybdenum in $Mo^{5+}$ and $Mo^{6+}$ oxidation states.

FIG. 15 illustrates spin-induced splitting in IMO NCs due to the presence of $Mo^{5+}$. Temperature dependence of the C-term MCD intensity for 0.3% IMO NCs, obtained by subtracting maximum MCD intensity at 300 K (A-term) from the maximum MCD intensities at other temperatures. Red line is the best fit to the experiments data using the equation above (Curie's law). The agreement of the experimental data with the Curie's law confirms the anomalous Zeeman splitting of the ground state in IMO NCs induced by the paramagnetism due the presence of $Mo^{5+}$.

Figure 18A:
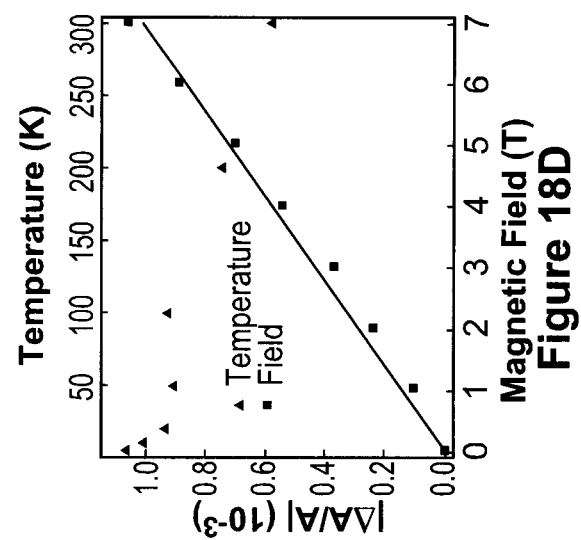
FIG. 18A is a graph showing absorption (top) and MCD (bottom) spectra of 1.4% IMO NCs collected at 5 K.
Figure 18B:
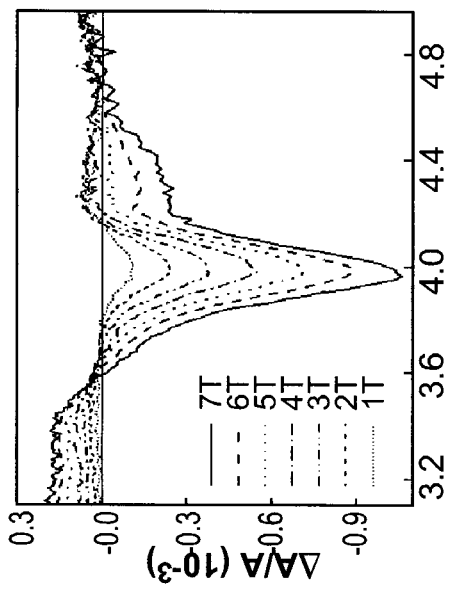
FIG. 18B is a graph illustrating 5 K MCD spectra of NCs in FIG. 18A collected at different magnetic field (1-7 T) in the band gap region.
Figure 18C:
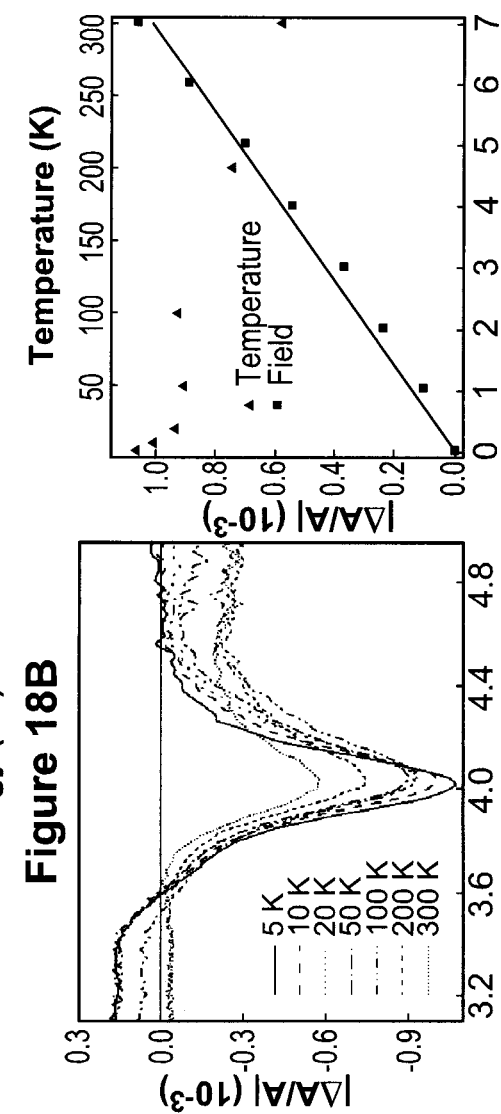
FIG. 18C is a graph illustrating 7 T MCD spectra of NCs in FIG. 18A collected at different temperatures (5-300 K) in the band gap region.
Figure 18D:
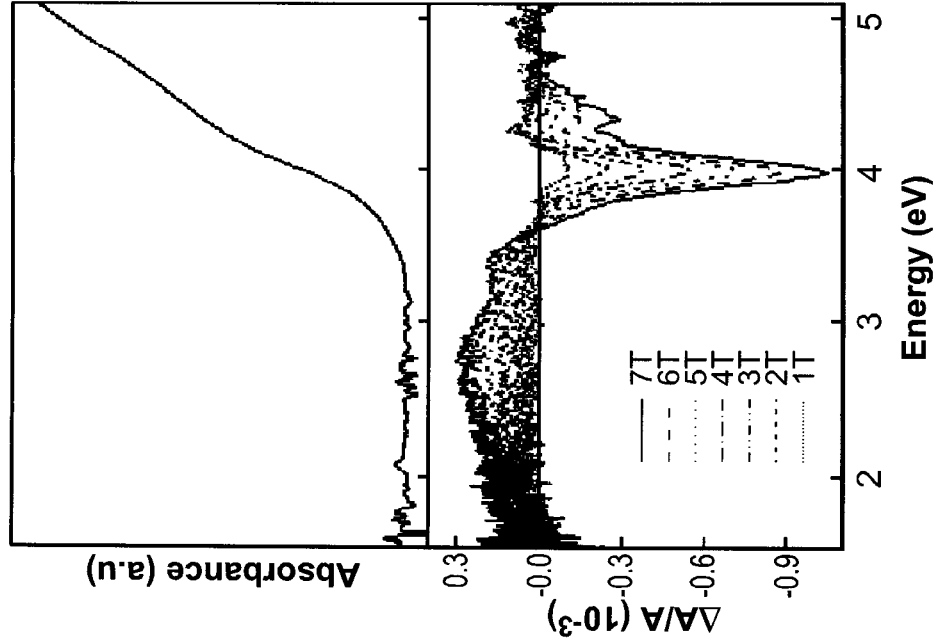
FIG. 18D is a graph illustrating magnetic field (squares) and temperature (triangles) dependence of MCD intensity of 1.4% IMO NCs.

FIG. 18A is a graph illustrating absorption (top) and MCD (bottom) spectra of 1.4% IMO NCs collected at 5 K. FIG. 18B is a graph illustrating 5K MCD spectra of NCs in (A) collected at different magnetic field (1-7 T) in the band gap region. FIG. 18C is a graph illustrating 7 T MCD spectra of NCs in (A) collected at different temperatures (5-300 K) in the band gap region. FIG. 18D is a graph illustrating magnetic field (squares) and temperature (triangles) dependence of MCD intensity of exciton MCD intensity.

Figure 19A:
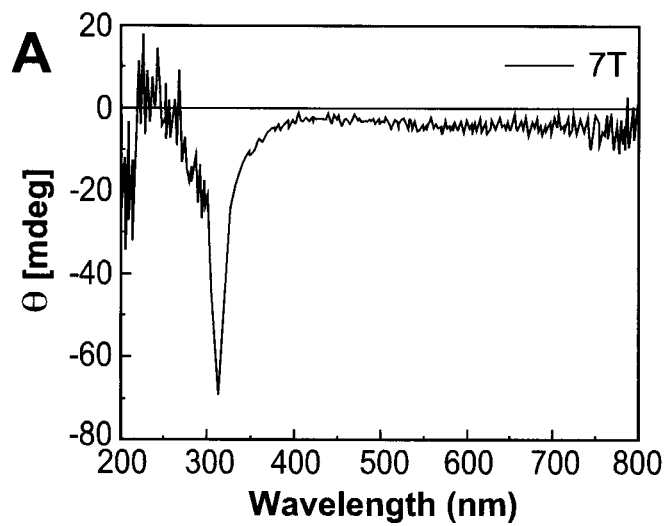
FIG. 19A is a graph showing 7 T MCD spectrum of 10% tungsten-doped indium oxide (W-doped $In_2O_3$ or IWO) NCs collected at 5 K.
Figure 19B:
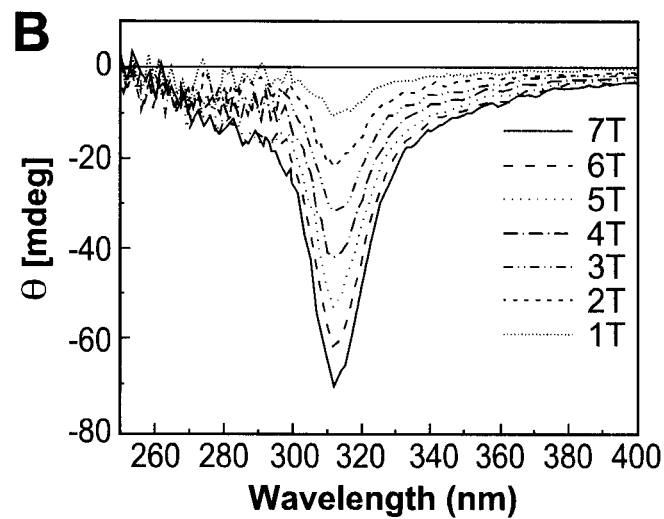
FIG. 19B is a graph illustrating 5 K MCD spectra of 10% IWO NCs collected at different magnetic fields (1-7 T) in the band gap region.
Figure 19C:
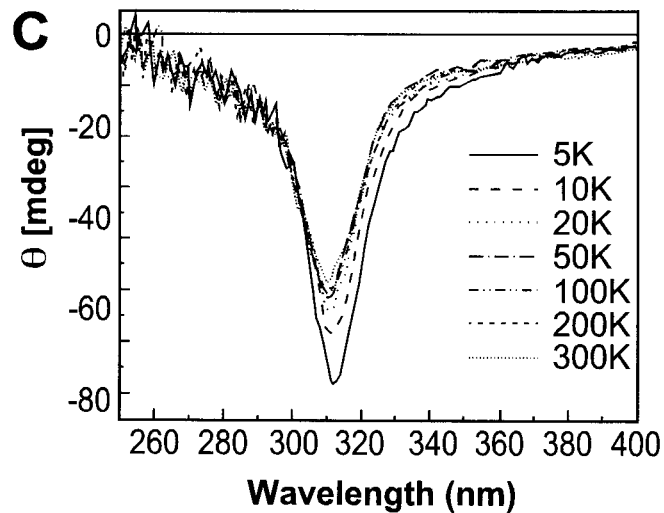
FIG. 19C is a graph illustrating 7 T MCD spectra of 10% IWO NCs collected at different temperatures (5-300 K) in the band gap region.
Figure 19D:
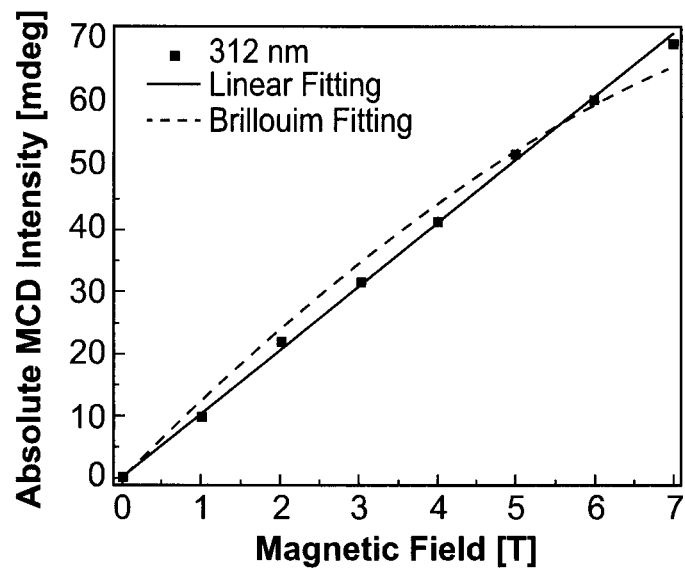
FIG. 19D is a graph illustrating magnetic field dependence of MCD intensity recorded at 312 nm for 10% IWO NCs.
Figure 19E:
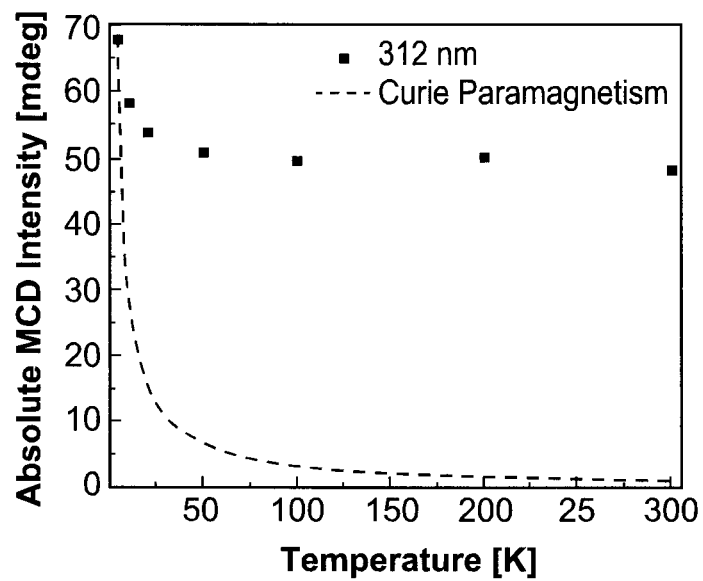
FIG. 19E is a graph illustrating temperature dependence of MCD intensity recorded at 312 nm for 10% IWO NCs.

FIG. 19A is a graph illustrating 7 T MCD spectrum of 10% tungsten-doped indium oxide (W-doped $In_2O_3$ or IWO) NCs collected at 5 K. FIG. 19B is a graph illustrating 5K MCD spectra of 10% IWO NCs collected at different magnetic field (1-7 T) in the band gap region. FIG. 19C is a graph illustrating 7 T MCD spectra of 10% IWO NCs collected at different temperatures (5-300 K) in the band gap region. FIG. 19D is a graph illustrating magnetic field dependence of MCD intensity recorded at 312 nm for 10% IWO NCs. FIG. 19E is a graph illustrating temperature dependence of MCD intensity recorded at 312 nm for 10% IWO NCs. Dashed line is a pure Curie's temperature dependence.

Figure 20A:
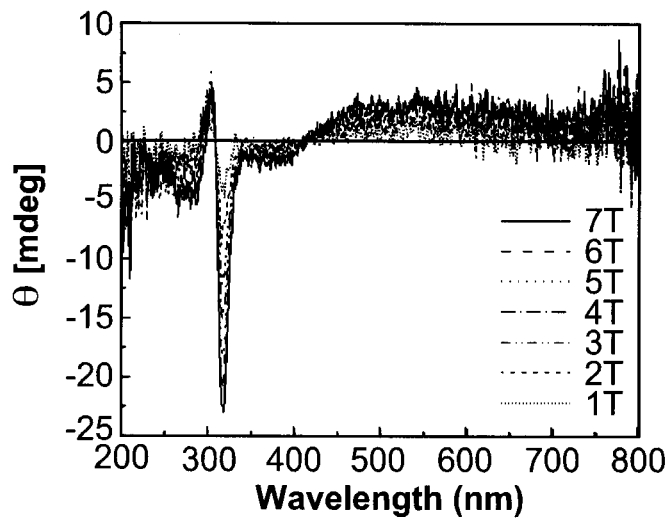
FIG. 20A is a graph showing 5 K MCD spectra of 1% IWO NCs collected at different magnetic fields (1-7 T)
Figure 20B:
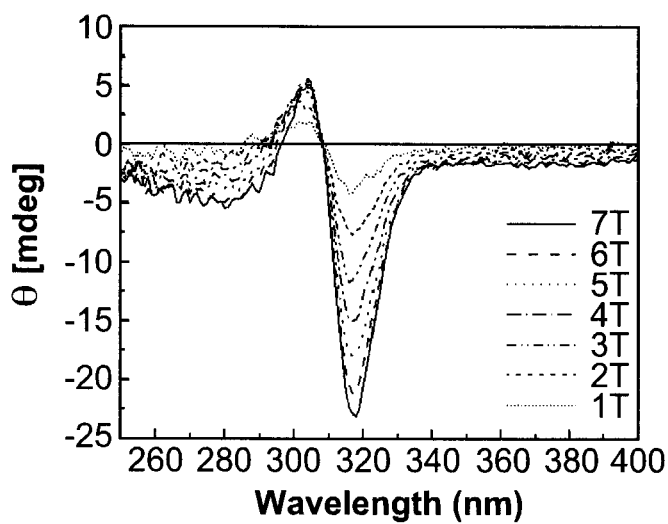
FIG. 20B is a graph showing 5 K MCD spectra of 1% IWO NCs collected at different magnetic fields (1-7 T) in the band gap region.
Figure 20C:
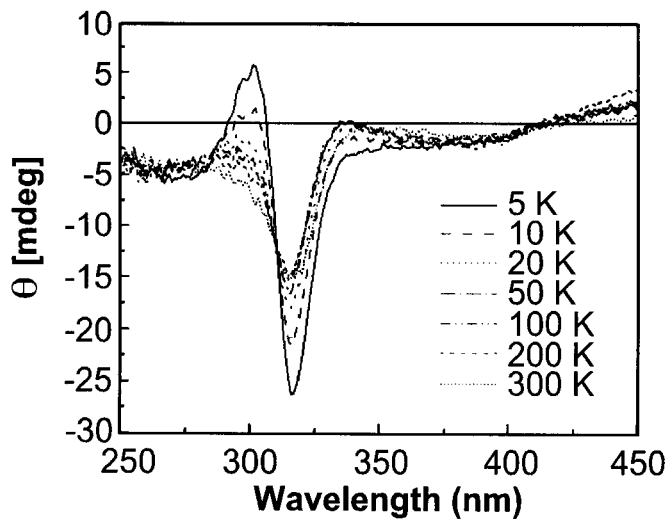
FIG. 20C is a graph showing 7 T MCD spectra of 1% IWO NCs collected at different temperatures (5-300 K) in the band gap region.
Figure 20D:
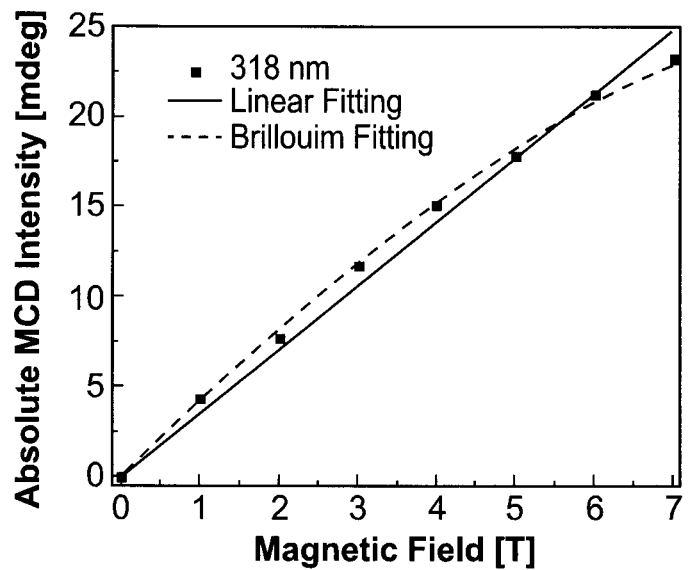
FIG. 20D is a graph illustrating magnetic field dependence of MCD intensity recorded at 318 nm for 1% IWO NCs.
Figure 20E:
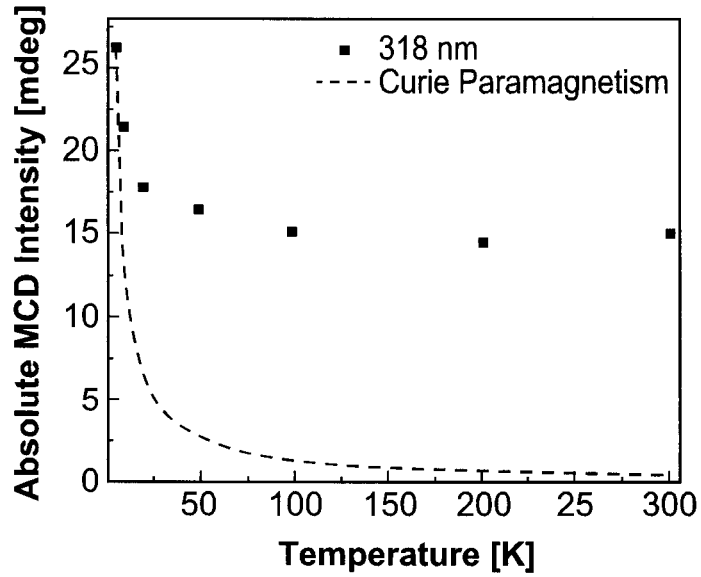
FIG. 20E is a graph illustrating temperature dependence of MCD intensity recorded at 318 nm for 1% IWO NCs.
Figure 21D:
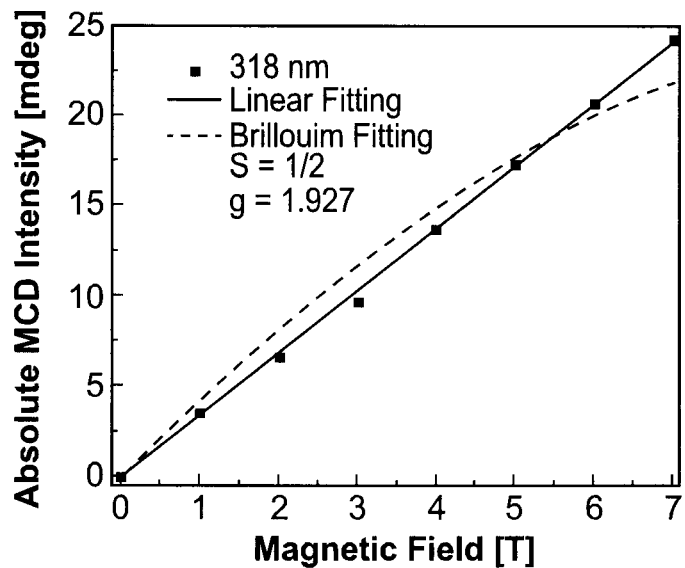
FIG. 21D is a graph illustrating magnetic field dependence of MCD intensity recorded at 349 nm for $TiO_{2-x}$ (F-OLAM) NCs.
Figure 21E:
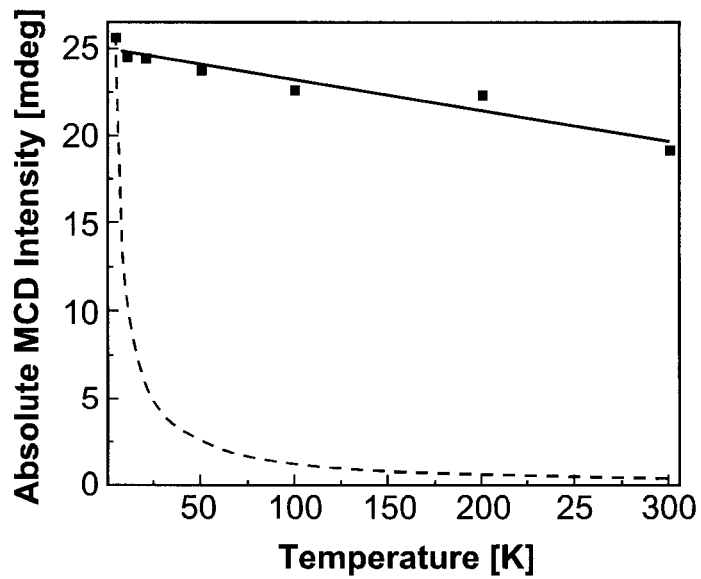
FIG. 21E is a graph illustrating temperature dependence of MCD intensity recorded at 349 nm for $TiO_{2-x}$ (F-OLAM) NCs.

FIG. 20A is a graph illustrating MCD spectra of 1% IWO NCs collected at 5 K. FIG. 20B is a graph illustrating 5K MCD spectra of 1% IWO NCs collected at different magnetic field (1-7 T) in the band gap region. FIG. 20C is a graph illustrating 7 T MCD spectra of 1% IWO NCs collected at different temperatures (5-300 K) in the band gap region. FIG. 20D is a graph illustrating magnetic field dependence of MCD intensity recorded at 318 nm for 1% IWO NCs. FIG. 20E is a graph illustrating temperature dependence of MCD intensity recorded at 318 nm for 1% IWO NCs;

FIG. 21A is a graph illustrating absorption (top) and MCD (bottom) spectra of $TiO_{2-x}$ (F-OLAM) NCs collected at 5 K. FIG. 21B is a graph illustrating 5K MCD spectra of $TiO_{2-x}$ (F-OLAM) NCs collected at different magnetic field (1-7 T) in the band gap region. FIG. 21C is a graph illustrating 7 T MCD spectra of $TiO_{2-x}$ (F-OLAM) NCs collected at different temperatures (5-300 K). FIG. 21D is a graph illustrating magnetic field dependence of MCD intensity recorded at 349 nm for $TiO_{2-x}$ (F-OLAM) NCs. FIG. 21E is a graph illustrating temperature dependence of MCD intensity recorded at 349 nm for $TiO_{2-x}$ (F-OLAM) NCs. Dashed line is a pure Curie's temperature dependence. The temperature dependence of the signal matches Curie behavior better that other dependences, such as linear.

Figure 22D:
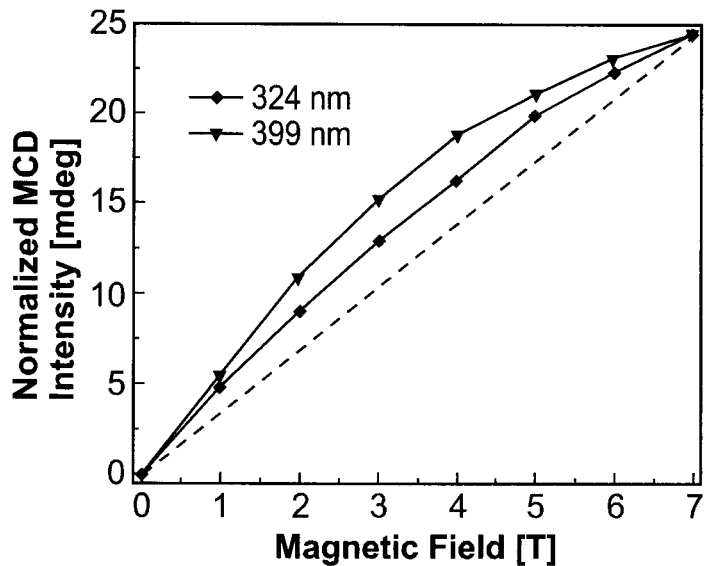
FIG. 22D is a graph illustrating magnetic field dependence of MCD intensity recorded at 324 nm (diamond) and 399 nm (triangle)
Figure 22E:
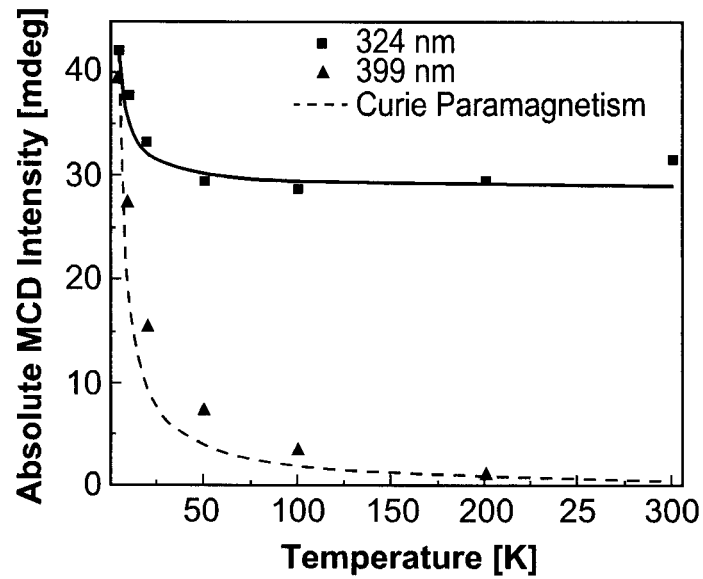
FIG. 22E is a graph illustrating temperature dependence of 7 T MCD intensity recorded at 324 nm (diamond) and 399 nm (triangle)

FIG. 22A is a graph illustrating absorption (top) and MCD (bottom) spectra of $TiO_{2-x}$ (M-OLAM) NCs collected at 5 K. FIG. 22B is a graph illustrating 5 K MCD spectra of $TiO_{2-x}$ (M-OLAM) NCs collected at different magnetic field (1-7 T). FIG. 22C is a graph illustrating 7 T MCD spectra of $TiO_{2-x}$ (M-OLAM) NCs collected at different temperatures (5-300 K). FIG. 22D is a graph illustrating magnetic field dependence of MCD intensity recorded at 324 nm (diamond) and 399 nm (triangle). FIG. 22E is a graph illustrating temperature dependence of MCD intensity recorded at 324 nm (diamond) and 399 nm (triangle).

Figure 23A:
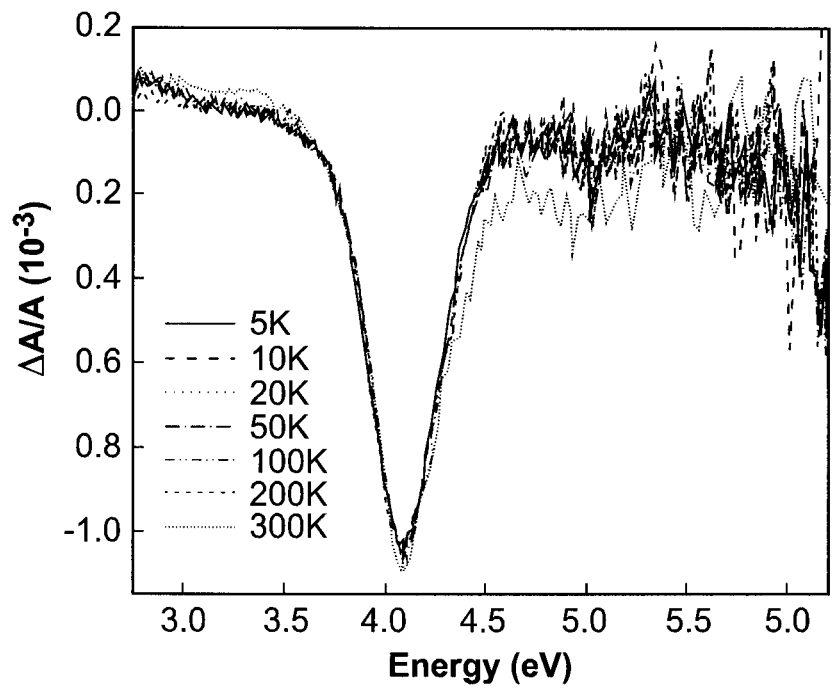
FIG. 23A is a graph illustrating 7 T MCD spectra of 7% Sb-doped $In_2O_3$ nanocrystals in the band gap region collected at different temperatures (5-300 K)
Figure 23B:
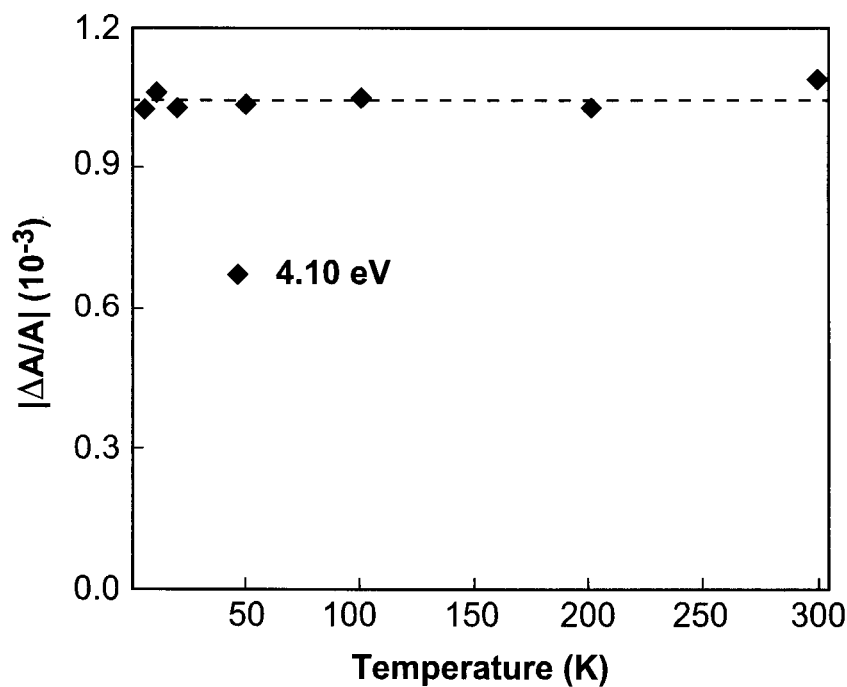
FIG. 23B is a graph illustrating excitonic MCD signal intensities for samples in FIG. 23A plotted against temperature.
Figure 24A:
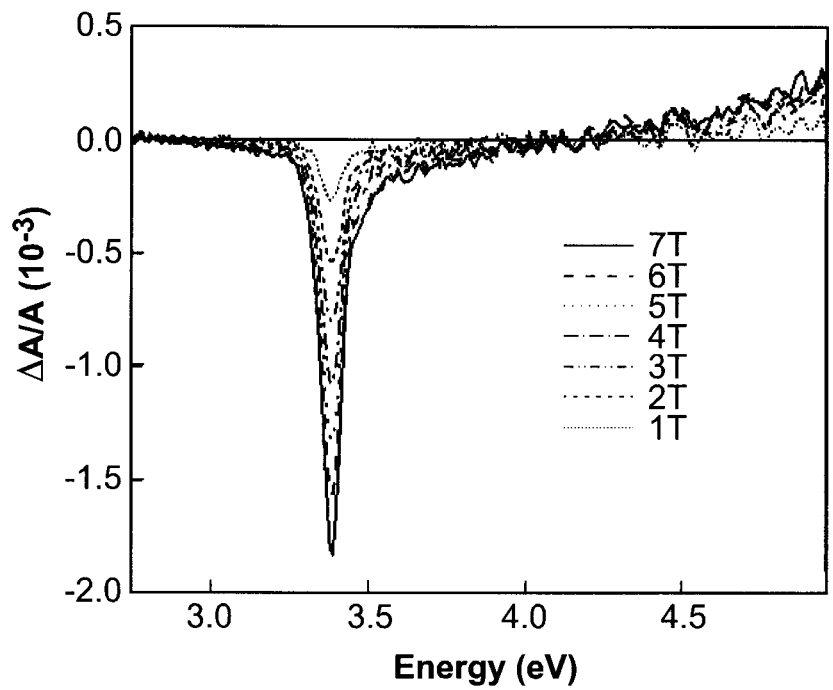
FIG. 24A is a graph illustrating 300 K exciton MCD spectra of intentionally undoped ZnO nanocrystals collected at different fields (1-7 T)
Figure 24B:
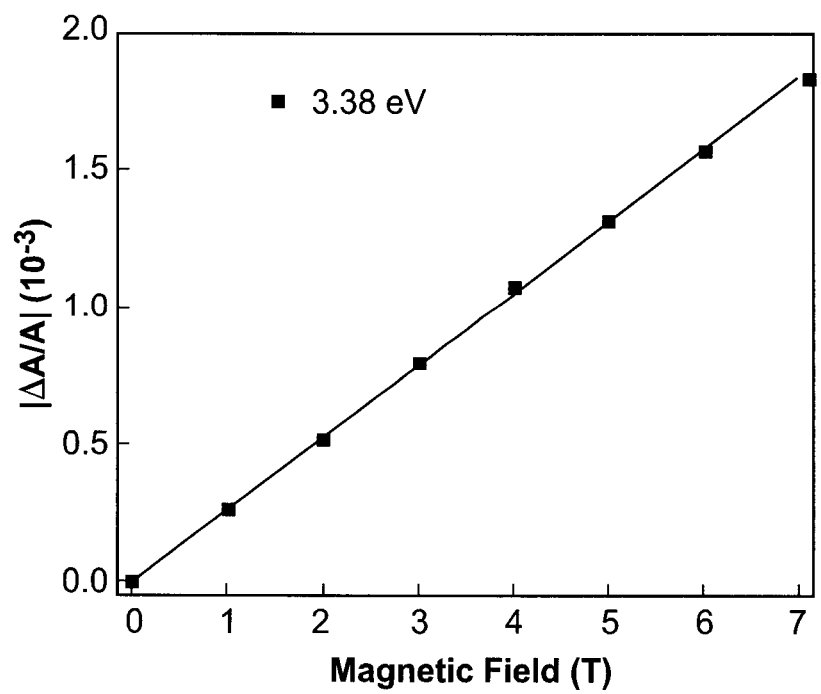
FIG. 24B is a graph illustrating excitonic MCD signal intensities for samples in FIG. 24A plotted against magnetic field.
Figure 25A:
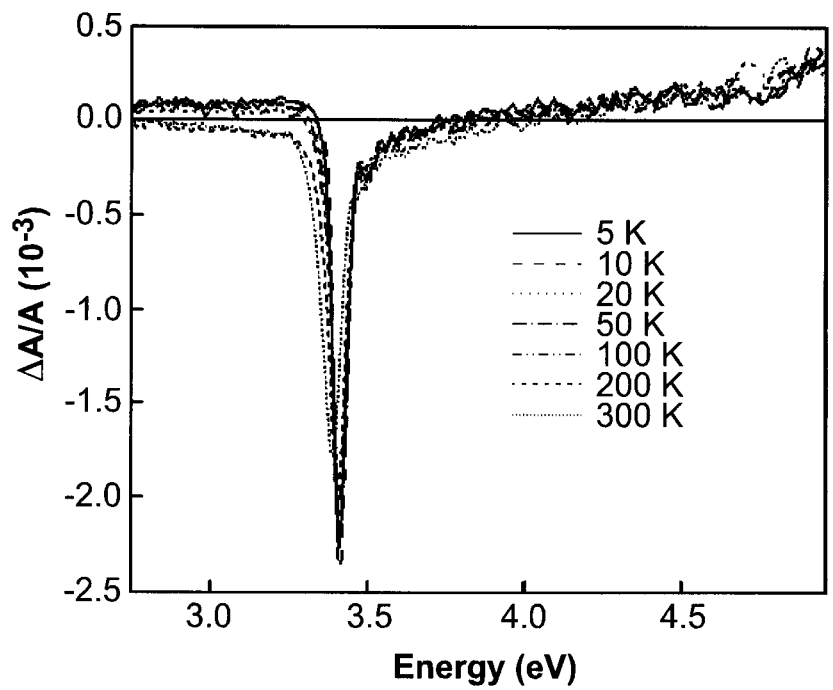
FIG. 25A is a graph illustrating 7 T exciton MCD spectra of intentionally undoped ZnO nanocrystals collected at different temperatures (5-300 K)
Figure 25B:
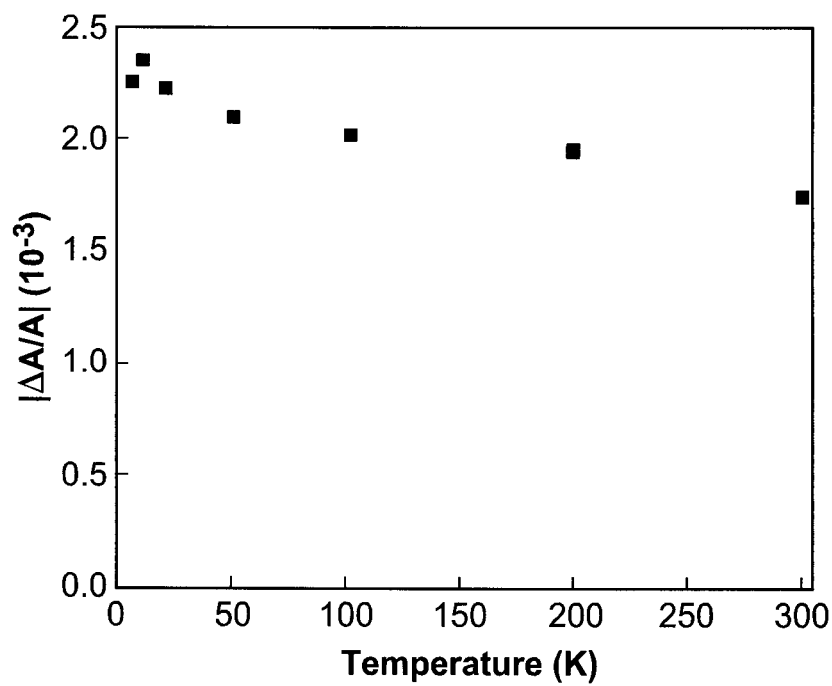
FIG. 25B is a graph illustrating excitonic MCD signal intensities for samples in FIG. 25A plotted against temperature.
Figure 26A:
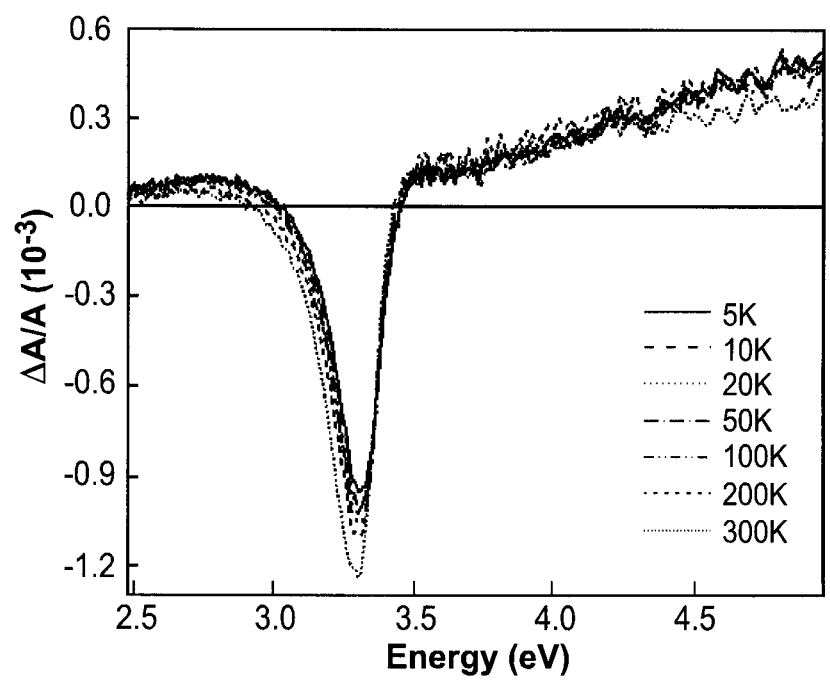
FIG. 26A is a graph illustrating 7 T exciton MCD spectra of 5% $In^{3+}$-doped ZnO (IZO) nanocrystals collected at different temperatures (5-300 K)
Figure 26B:
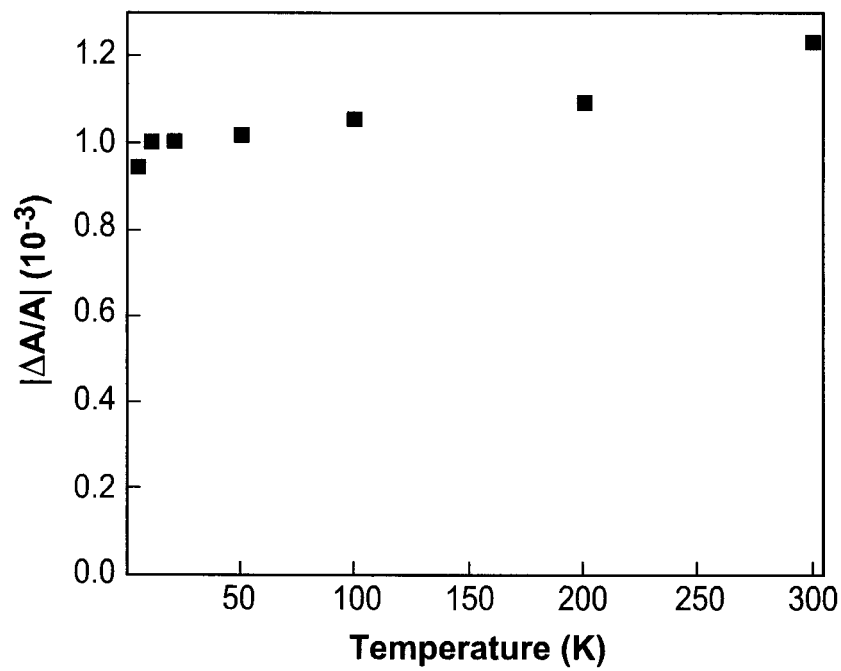
FIG. 26B is a graph illustrating excitonic MCD signal intensities for samples in FIG. 26A plotted against temperature.

FIG. 23A is a graph illustrating 7 T exciton MCD spectra of 7% Sb-doped $In_2O_3$ nanocrystals collected at different temperatures (5-300 K). FIG. 23B is a graph illustrating excitonic MCD signal intensities for samples in FIG. 23A plotted against temperature. FIG. 24A is a graph illustrating 300 K exciton MCD spectra of intentionally undoped ZnO nanocrystals collected at different fields (1-7 T). FIG. 24B is a graph illustrating excitonic MCD signal intensities for samples in (A) plotted against magnetic field;

FIG. 25A is a graph illustrating 7 T exciton MCD spectra of intentionally undoped ZnO nanocrystals collected at different temperatures (5-300 K). FIG. 25B is a graph illustrating excitonic MCD signal intensities for samples in FIG. 25A plotted against temperature. FIG. 26A is a graph illustrating 7 T exciton MCD spectra of 5% indium-doped ZnO nanocrystals collected at different temperatures (5-300 K). FIG. 26B is a graph illustrating excitonic MCD signal intensities for samples in (A) plotted against temperature. Importantly, an increase in band splitting with temperature is observed. This effect may be related to a phonon effect and may be useful for various high-temperature applications of the technology.

Figure 27A:
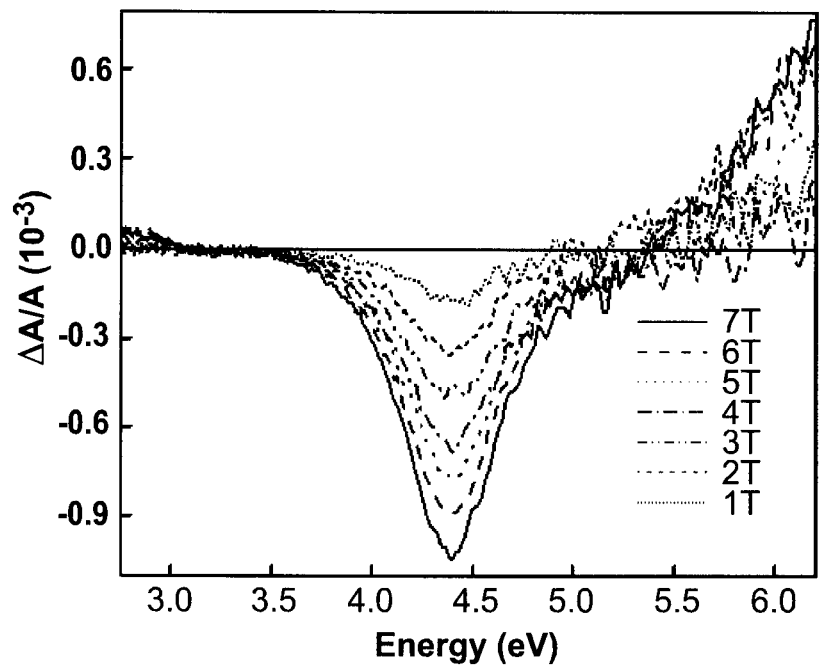
FIG. 27A is a graph showing 5 K exciton MCD spectra of 10% Sb-doped $SnO_2$ nanocrystals collected at different fields (1-7 T)
Figure 27B:
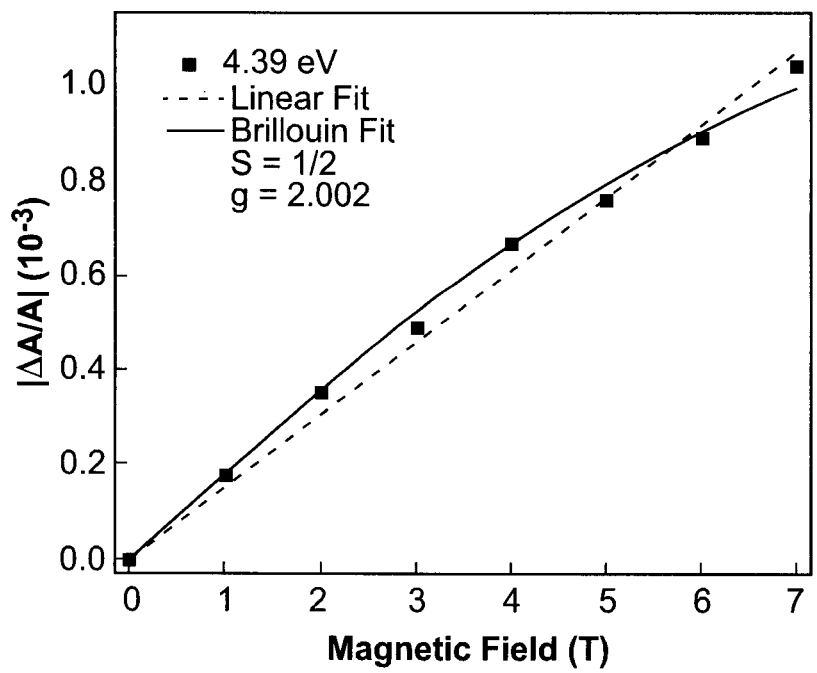
FIG. 27B is a graph illustrating excitonic MCD signal intensities for samples in FIG. 27A plotted against magnetic field.
Figure 28A:
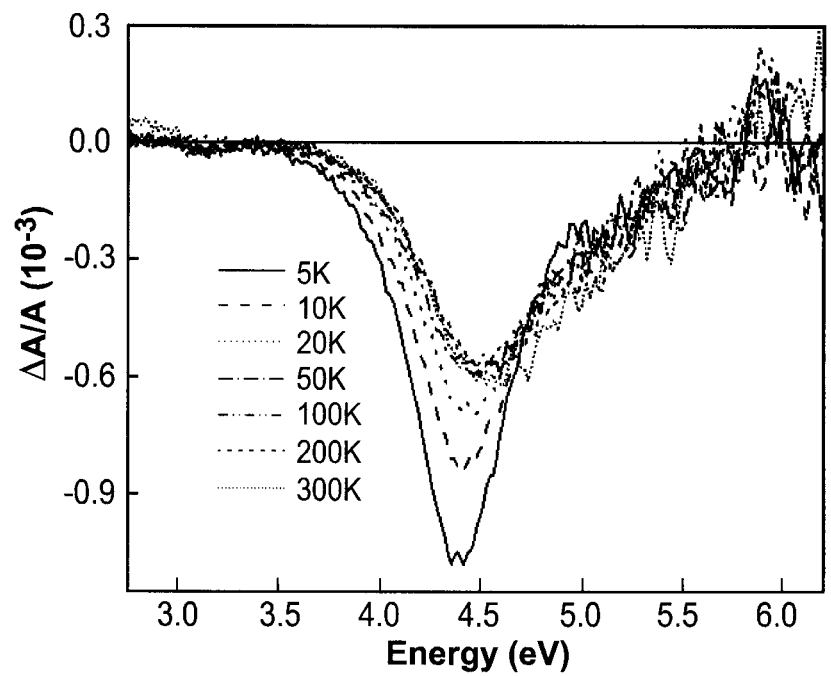
FIG. 28A is a graph illustrating 7 T exciton MCD spectra of 10% Sb-doped $SnO_2$ nanocrystals collected at different temperatures (5-300 K)
Figure 28B:
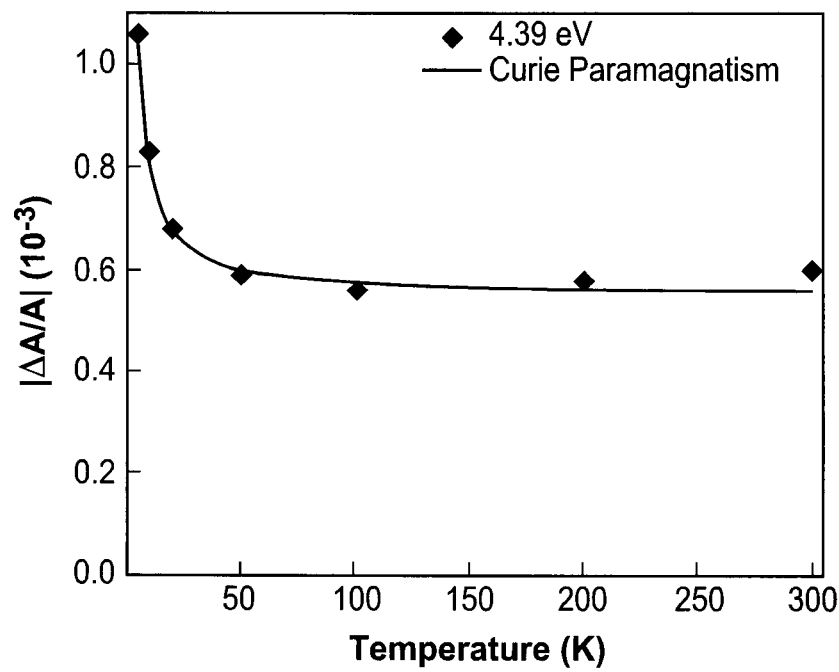
FIG. 28B is a graph illustrating excitonic MCD signal intensities for samples in FIG. 28A plotted against temperature.

FIG. 27A is a graph illustrating exciton MCD spectra of 10% Sb-doped $SnO_2$ nanocrystals collected at different fields (1-7 T). FIG. 27B is a graph illustrating excitonic MCD signal intensities for samples in (A) plotted against magnetic field. FIG. 28A is a graph illustrating 7 T exciton MCD spectra of 10% Sb-doped $SnO_2$ nanocrystals collected at different temperatures (5-300 K). FIG. 28B is a graph illustrating excitonic MCD signal intensities for samples in (A) plotted against temperature.

The preceeding graphs and discussion are intended to illustrate the range of materials that have been developed and can be used in embodiments herein and also the range of embodiments for various applications that are possible. One of skill in the art in a particular application will be able to choose an appropriate material for the application and functions required. As an example of the scope of materials, embodiments may make use of p-type or n-type semiconductor materials.

Figure 29:
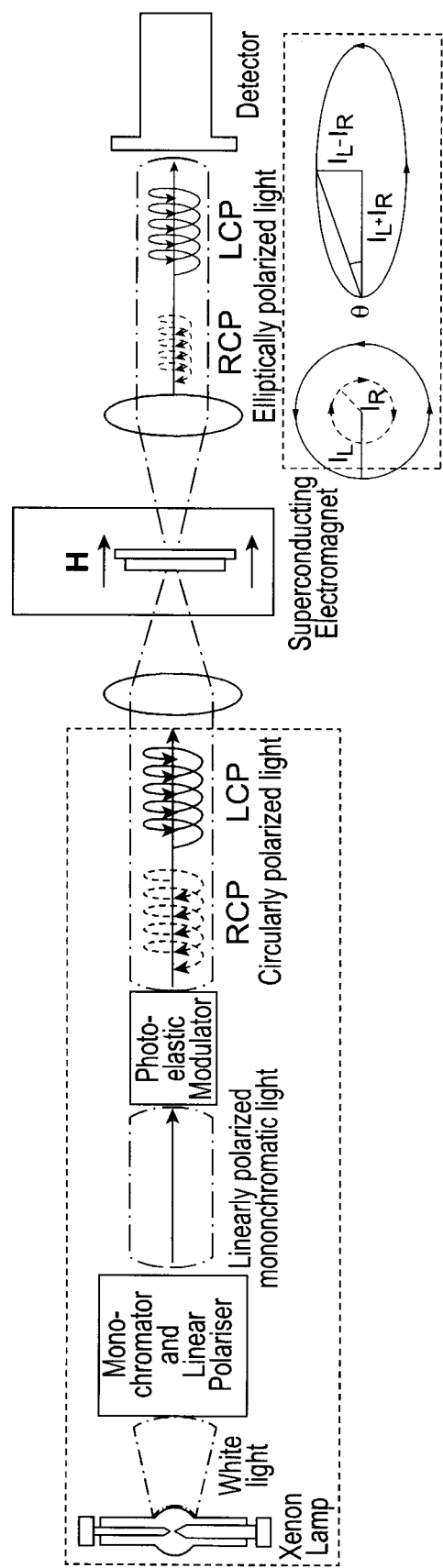
FIG. 29 illustrates an experimental setup for testing/configuring plasmonic nanostructure materials according to an embodiment.

FIG. 29 illustrates an experimental set-up 2900 for MCD measurements shown herein and can also provide an illustration for device configuration and application. A source of circularly polarized light 2910 includes a broad-band emitting source 2915 (such as a Xenon lamp), which generates light that is passed through a monochromator and polarizer 2920 to generate a monochromatic linearly polarized beam. A portion of this beam is passed through a photoelastic modulator 2925 creating left and right circularly polarized light and focused by a lens 2930. A sample 2935 is mounted in a superconducting magneto-optical cryostat 2940 with the lines of the magnetic field oriented parallel to the light propagation direction. Upon passing through the sample LCP and RCP light are absorbed to a different degree. Different intensities of left and right circularly polarized light (IL and IR, respectively) are combined via a lens 2945 to form an elliptically polarized beam and detected by a detector 2950. The ellipticity, θ, is defined as the angle between the long and short axes of the ellipse, and is converted to a differential absorption using the appropriate equation herein. This allows for an understanding of the operation of the particular configuration of nanostructure that is being analyzed and the impact of the magnetic field.

Figure 30:
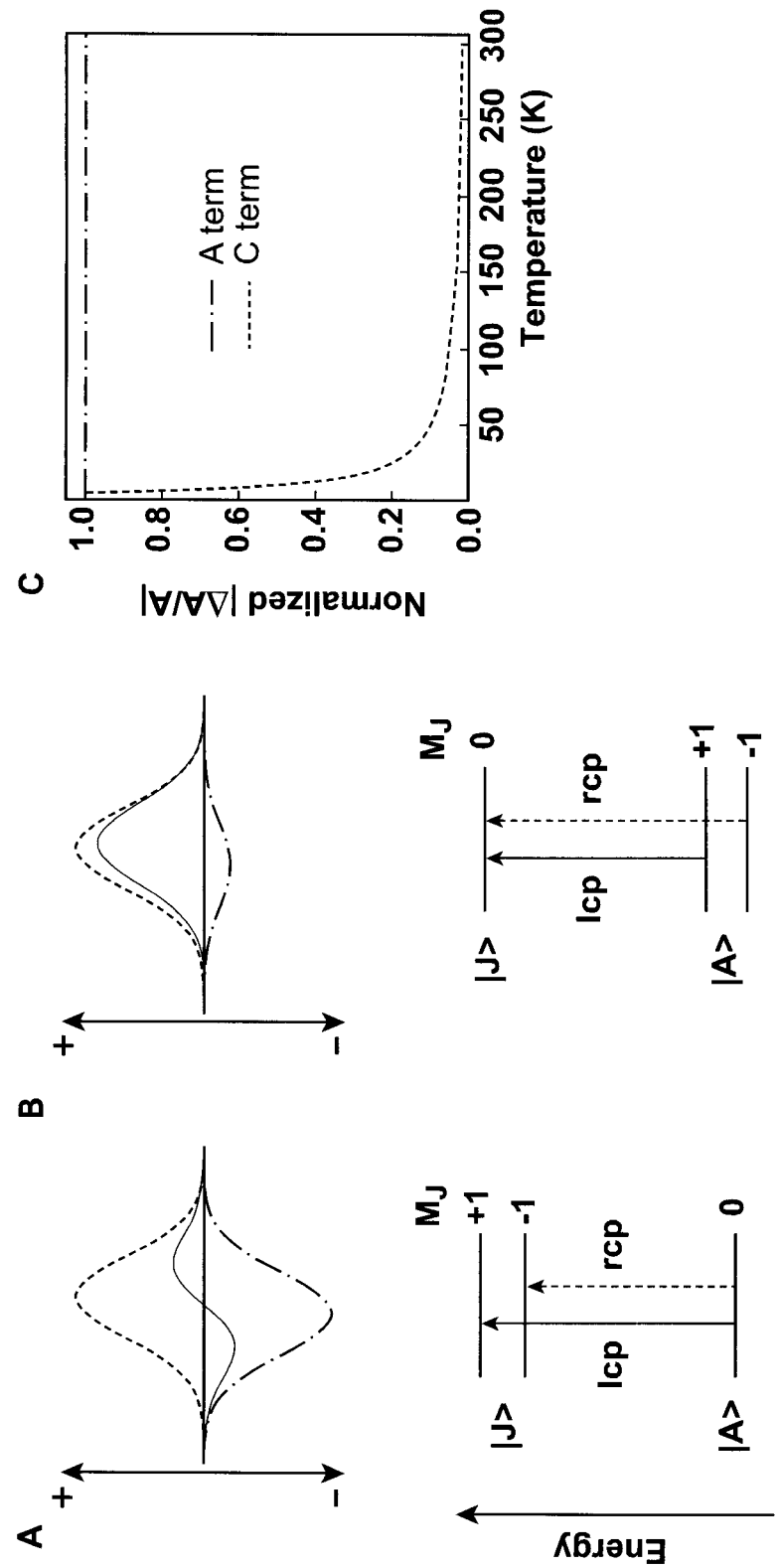
FIG. 30 is a schematic representation of MCD terms.

FIG. 30 are schematic representations of MCD terms such as those used throughout the above description. FIG. 30A illustrates MCD signal (top) and Zeeman splitting (bottom) of A-term MCD. A-term is typically associated with Zeeman splitting of the degenerate excited states, as shown in the bottom part. The small Zeeman splitting results in the oppositely signed transitions for LCP and RCP light which are slightly shifted in energy relative to each other leading to the derivative-shaped signal (top part). FIG. 30B illustrates MCD signal (top) and Zeeman splitting (bottom) of the C-term MCD. Unlike A-term, C-term involves Zeeman splitting of the degenerate ground states (bottom part). The population of the higher energy ground state is usually lower, and in the absence of excited state splitting the difference in absorption of LCP and RCP light leads to MCD signal with absorption band shape (top part). FIG. 30C shows a comparison of the temperature-dependent A-term and C-term MCD intensity. A-term is temperature independent, while C-term, which is observed only for molecules with ground state paramagnetism, follows Curie-type behavior.

Figure 31:
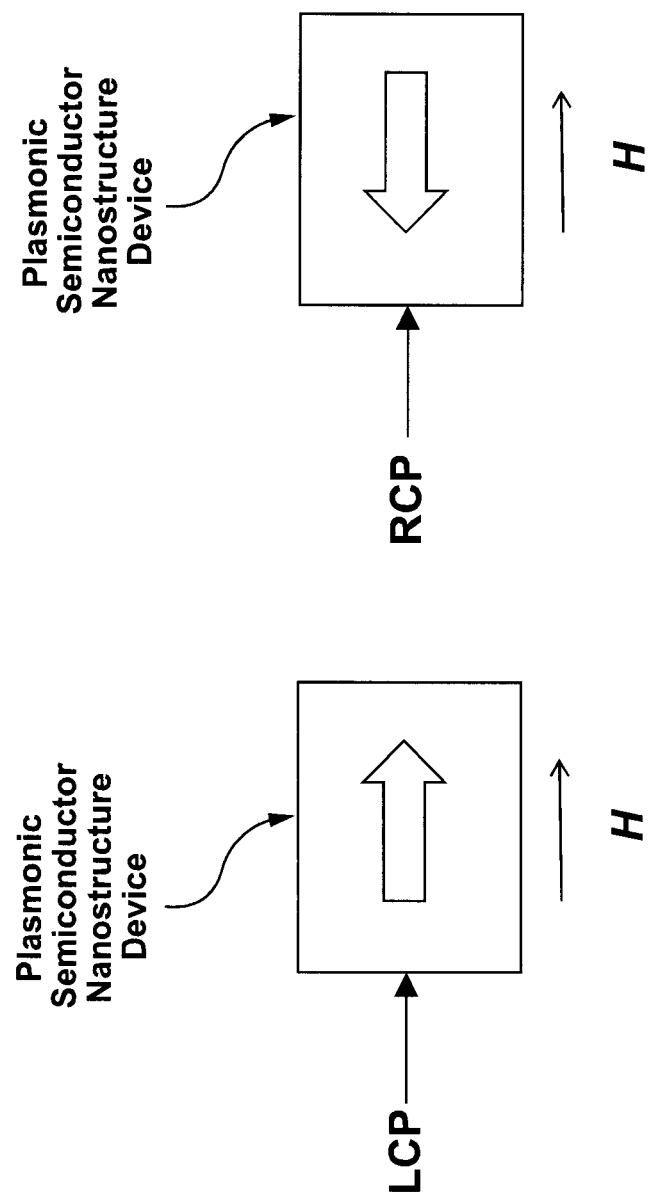
FIG. 31 is a schematic diagram of an embodiment of a device for controlling a plasmonic nanostructure material illustrating a possible implementation of the technology.

FIG. 31 illustrates a system/device 3100 and method for controlling a plasmonic nanostructure material according to an embodiment. The nanostructure material can be prepared by, for example, depositing nanocrystals as thin films, directly growing plasmonic semiconductors on a desired substrate, or fabricating single nanostructure device (for instance from plasmonic semiconductor nanowires). As shown in FIG. 31, the nanostructure material and, in particular, a subset thereof can represent a single bit 3110, that can be referred to as a plasmonic nanostructure device, having a particular orientation (shown by the large arrow 3120) for a charge carrier. The bit is supported or provided in a magnetic field H provided by a magnetic field source. A source of circularly polarized light is provided to direct circularly polarized light at the bit, in this case, left circularly polarized light (LCP) and the device is configured such that the light propagation direction and magnetic field are parallel. In this device, circularly polarized light in the presence of an magnetic field can be used to polarize charge carriers as described above. Thereafter, by changing the helicity of light (for example, left vs right circular polarization), the orientation of the carrier polarization in the bit can be switched as shown. In some embodiments, the device can be configured as a magneto-electrical device (for example, to operate under external bias and/or in order to allow the orientation of the carrier polarization to be determined/read, such as in an information processing memory or the like.

Figure 32:
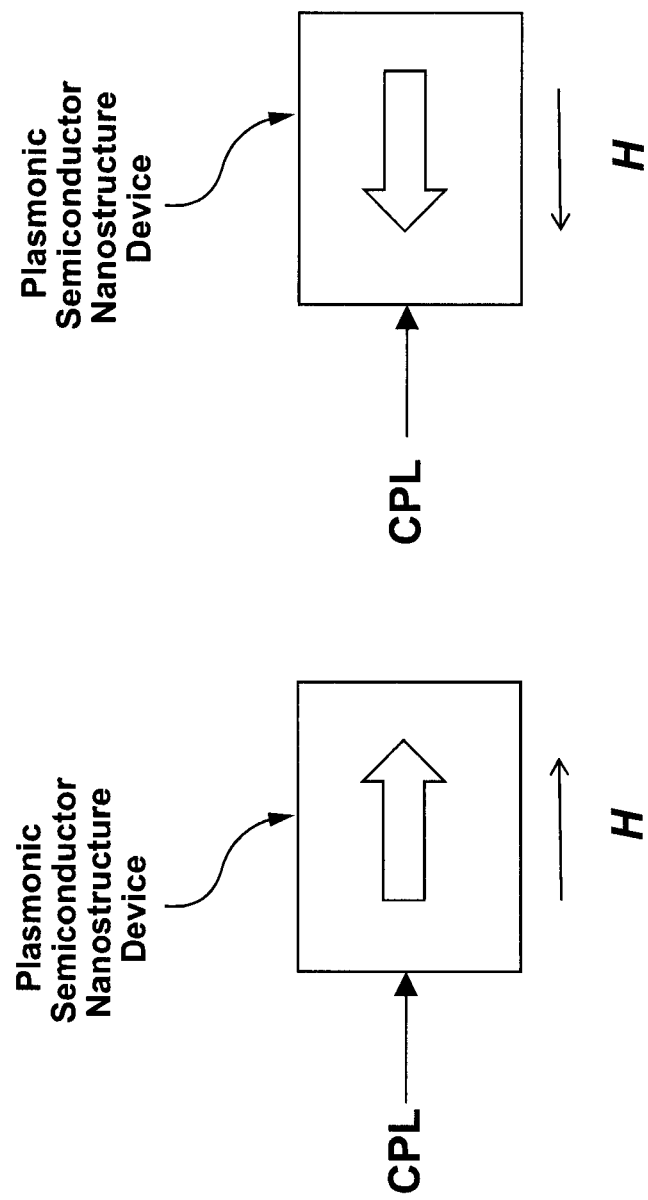
FIG. 32 is a schematic diagram of an embodiment of a device illustrating another possible implementation of the technology.

FIG. 32 illustrates a system/device 3200 and method according to another embodiment. This embodiment includes elements of the embodiment shown in FIG. 31, which are similarly numbered. In This device configuration circularly polarized light, having a predetermined left or right helicity, in the presence of an external magnetic field can be used to polarize charge carriers as described above. Thereafter, by changing the orientation of the magnetic field (rather than the helicity of light as in the embodiment of FIG. 31), the orientation of the carrier polarization can be switched. As noted above, in some embodiments, the device can be configured as magneto-electrical device (for example, to operate under external bias).

Figure 33:
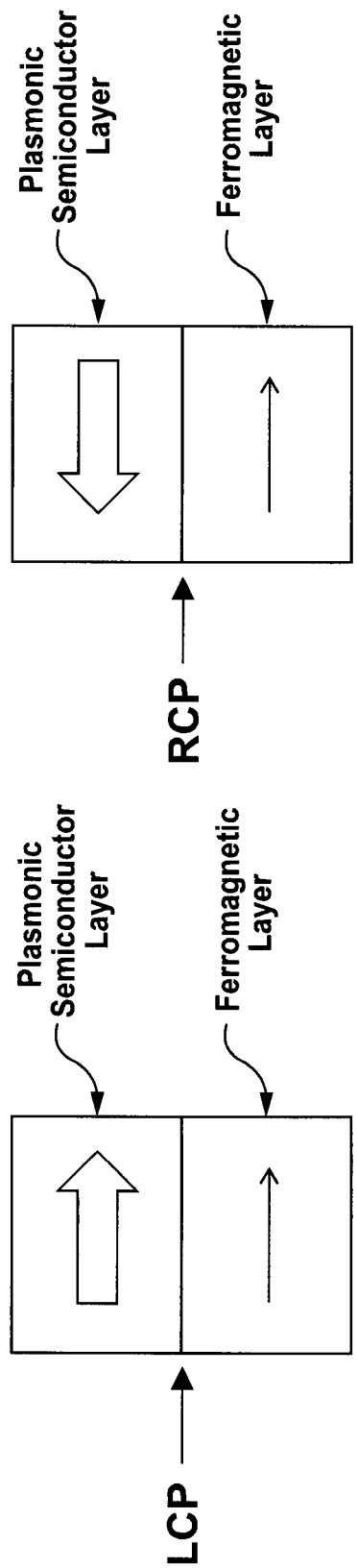
FIG. 33 is a schematic diagram of an embodiment of a device illustrating yet another possible implementation of the technology.

FIG. 33 illustrates yet another embodiment of the system/device 3300 and method. This embodiment includes elements of the embodiment shown in FIG. 31, which are similarly numbered. In this configuration, a nanostructure device 3110 can be fabricated by depositing a plasmonic semiconductor layer on a layer of a ferromagnetic material 3310 (made of, for example, of metal or metal oxide). In this case, the ferromagnetic layer provides the magnetic field described above. Circularly polarized light can be used to polarize charge carriers as described above. Thereafter, by changing the helicity of light (left vs right circular polarization), the orientation of the carrier polarization in the material can be switched. This embodiment is similar to that in FIG. 31 with the addition of the ferromagnetic material.

Figure 34:
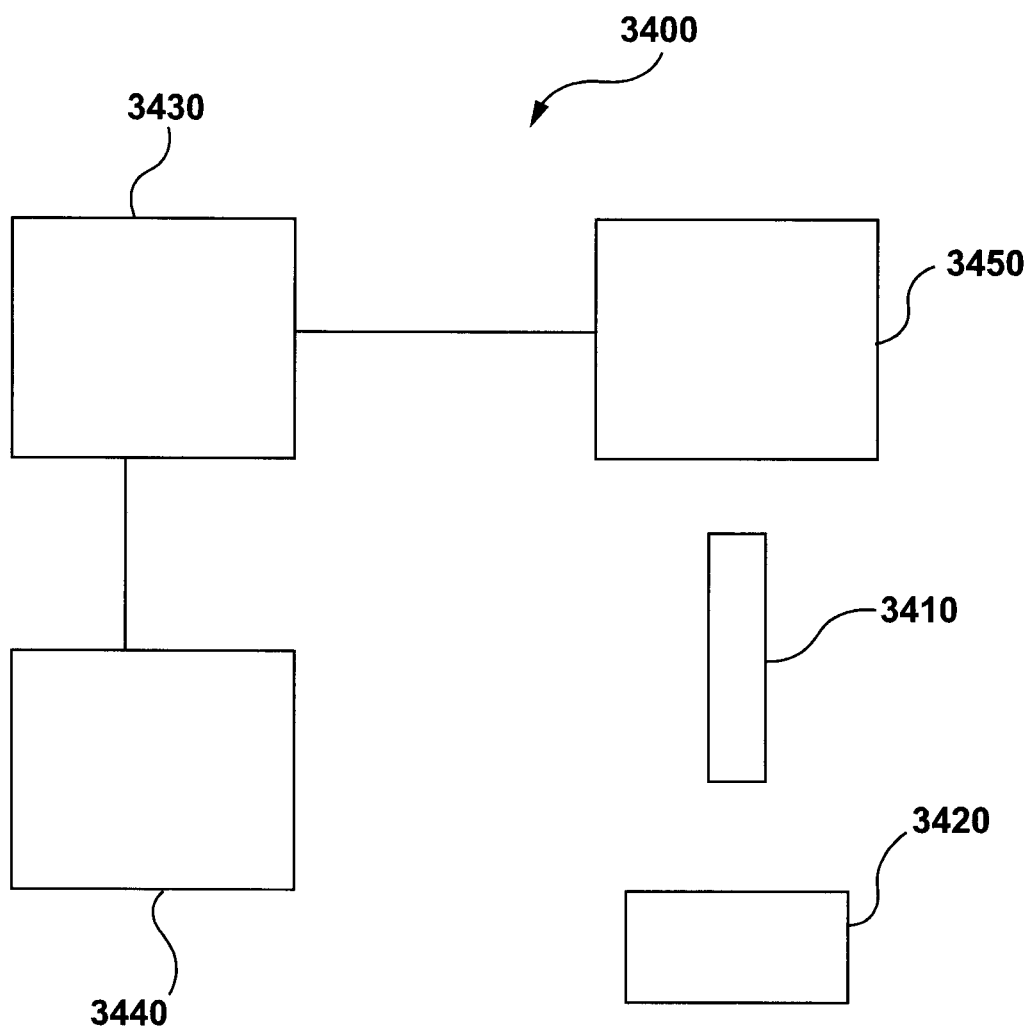
FIG. 34 is an embodiment of a device for controlling a plasmonic nanostructure material.

FIG. 34 is a schematic diagram showing a device/system 3400 for controlling a plasmonic nanostructure material. The system 3400 includes a support 3420 for the nanostructure material 3410. The support may be any appropriate way of holding the nanostructure material in position. The system 3400 also includes a source of circularly polarized light 3440. The source of circularly polarized light can be any of various arrangements that will be known to one of skill in the art. For example, a source based on the experimental set up describe herein or an arrangement of a laser with a quarter wave plate, or the like. The source is arranged such that the circularly polarized light propagates in a predetermined direction and impinges on the nanostructure material. The system 3400 also includes a magnetic field source 3450 such as a permanent magnet, an electromagnet or the like. The magnetic field source is positioned in relation to the nanostructure material and source of circularly polarized light such that the magnetic field lines are parallel with the light propagation direction. The system 3400 also include a controller 3430, which may include a processor and memory (not shown) and may also be connected to other controllers, or other elements in an information processing device or the like. The controller is connected to each of the source of circularly polarized light and to the magnetic field source and is configured to control these sources to adjust at least one of the helicity of the polarized light, or the orientation of the magnetic field, to switch the carrier polarization in the nanostructure material. This arrangement provides a system for controlling one or more bits that can be implemented in various types of information processing devices/systems, such as memory, processors or the like, may also be implemented in sensors of various types, and other applications as described herein and as would be understood upon reading this disclosure.

The following discussion examines some of the mathematics involved in the above description. The cyclotron motion of a free electron in solid state materials caused by an external magnetic field can also give rise to the formation of Landau states, which are associated with the Landau diamagnetism. It is therefore instructive to briefly compare and contrast the spectroscopic properties of the Landau states with those of the magnetoplasmonic modes observed in this work.

The Schrödinger equation for the cyclotron motion of free electrons in a magnetic field has a harmonic oscillator form, with the characteristic angular rotation frequency ($\omega_c$) of the $$\omega_c = \frac{eB}{m*c} \tag{S1}$$

harmonic oscillator expressed as:
where m* is the effective mass of the carrier. The energy eigenvalues (known as Landau levels) for an electron in a parabolic band in a semiconductor are then given by:

$$E_{N,m_S} = \frac{\hbar^2 k_z^2}{2m^*} + \hbar\omega_c\left(N + \frac{1}{2}\right) - g_S\mu_B m_S B \quad (S2)$$

where m* is the effective mass component along the magnetic field, $k_z$ is the wave vector in the direction of the magnetic field, N is the Landau quantum number (N=0, 1, 2, . . . ), and mS is the magnetic spin quantum number (m=0, 1 2). According to last term of eq. S2 each Landau level is split into two sublevels due to spin-orbit coupling determined by the Landé g factor. This quantization of the Landau levels gives rise to a variety of magneto-oscillatory phenomena.

Importantly for this work, the interband (exciton) absorption transitions involving Landau levels obey the selection rule ΔN=0. The transition energies for the corresponding MCD spectra in Faraday configuration for left ($h\nu_N^-$) and right ($h\nu_N^+$) circularly polarized light are defined as $$h\nu_N^- = E_g + \frac{\hbar^2 k_z^2}{2m_r^*} + \hbar\omega_c\left(N + \frac{1}{2}\right) \pm \frac{1}{2}\bar{g}\mu_B B \quad (S3)$$

where $E_g$ is the optical bandgap energy, $m_r^*$ is the reduced effective mass of the bands and $\omega_c$ is the associated cyclotron frequency, and g is the combined g-factor of both bands. The dependence of transitions energies on N results in the periodic oscillatory structure of both absorption and MCD spectra, which is a signature of the Landau level spectroscopy. Furthermore, the spin-orbit splitting of the Landau leads to both positive and negative MCD bands. As emphasized above, in addition to robust MCD signal at high temperature (above 300 K) and low field (below 1 T), the absence of any periodic variations in either absorption or MCD spectra and the presence of only negative MCD signal at high temperatures demonstrate that carrier polarization in plasmonic semiconductor NCs reported in this work is associated with circular magnetoplasmonic resonance as a collective behaviour of free electrons.

It is expected that embodiments of materials, systems and methods herein will have an impact in the field of semiconductor nanocrystals, and multifunctional nanostructures in general. One of the main projected advantages of plasmonic semiconductor NCs over metal nanoparticles is the possibility of synergistic coupling between plasmonic modes and excitons, which is not limited by interface between two separate components.

Furthermore, the possibility to mutually control semiconducting and plasmonic properties in a single NC could enable a variety of applications beyond those typically expected for plasmonic nanostructured materials. The demonstration of intrinsic plasmon-exciton coupling in semiconductor NCs and understanding its mechanism has the potential to create a new field of semiconductor NC plasmontronics.

Embodiments of the technology herein are expected to allow for various advantages over conventional technologies. For example, higher operation temperature, smaller device size, more flexible device design, faster speeds and possibly higher efficiency. LSPR forms cyclotron modes within individual NCs, which couple to the semiconductor conduction and/or valence bands, leading to the band splitting and the formation of two states (can be considered equivalent to 0 and 1 bits). Operation of spintronics (which relies on using spin-up and spin-down as two operating states) requires ferromagnetism, which in magnetic semiconductors is generally achieved at low temperatures (up to ca. 200 K or −73° C. for GaAs). Furthermore, the device size (and therefore efficiency) is limited by the size of ferromagnetic domains. LSPR is inherently a single NC effect, and given its temperature independent band splitting allows for operation at high temperature even for devices that are only a few nanometers in size.

Generally speaking, embodiments of the technology herein are expected to be of interest to sensor, electronic device and memory device applications. Embodiments of the technology herein are expected to provide better performance, simple design, smaller device size, faster speeds, lower power consumption than many conventional approaches in these industries. As an example of the type of application in which embodiments of the materials, systems and methods described herein can be used is for the creation of inexpensive but sensitive magneto-optical sensors for thermal imaging and molecular sensing. For example, plasmonic semiconductor NCs can be designed to exhibit LSPR in the mid-IR region, which results in a sensor that is sensitive not only to local chemical environment but also to very small temperature changes. As a further example, these new plasmontronic materials, systems and methods may be used for nonvolatile magnetic computer memory, or "plasmonic random access memory" (PRAM), which could provide smaller, more efficient memory storage for all nature of computing devices, in a similar way to spintronic devices.

The mechanism of this plasmon-induced carrier polarization is an intriguing and challenging problem. It has been hypothesized that optical phonons play a particularly important role in this mechanism, because they couple with both excitons and plasmons in semiconductor nanocrystals. Importantly, the phonons can transfer angular momentum, which allows for both the generation of the magnetoplasmonic modes and the splitting of the band states in an external magnetic field. Though more theoretical and experimental work is necessary for a quantitative understanding of the phenomena that involve quasiparticle interactions in correlated functional materials, it is particularly instructive to compare the properties of plasmonic semiconductor nanocrystals to those of diluted magnetic semiconductors in which polarized electron-spin states arise from sp-d exchange interactions. These exchange interactions typically decrease rapidly with temperature following Curie's law. The practical utilization of a diluted magnetic semiconductor requires a system that supports itinerant-carrier-mediated ferromagnetic ordering of dopant centres at or above room temperature, that is compatible with the current semiconductor technology and, ideally, transparent to visible light. Additionally, the minimum device size is generally limited thermodynamically by the size of the ferromagnetic domains. However, carrier polarization in plasmonic semiconductor nanocrystals is a universal phenomenon that persists above room temperature. Importantly, LSPR is considered a single-nanocrystal effect that can be attained in particles several nanometers in size that contain only a few free carriers.

In analogy to the emerging electronic technologies that rely on different degrees of freedom to achieve the polarization of charge carriers, which include spintronics (electron spin) and valleytronics (discrete values of crystal momentum), this disclosure refers to harnessing the cyclotron plasmonic modes for information processing, transmittal and storage as "plasmontronics". The dynamic control of the carrier polarization is enabled by intrinsic plasmon-exciton coupling, which is responsible for the excitation of the cyclotron magnetoplasmonic oscillations and subsequent Zeeman splitting of the band states. Cyclotron plasmonic modes might also be sensitive to nanocrystal size and shape, as well as the resonant enhancement of the electron-phonon coupling, potentially allowing for a variety of ways to further enhance carrier polarization in plasmonic semiconductor nanocrystals at room temperature. One dimensional semiconductors (nanowires) could be a particularly interesting nanodevice platform, because carrier polarization could be detected and exploited by magneto-electrical measurements. The ability to achieve complete polarization of carriers in individual single-phase nanocrystals at room temperature opens up the possibilities for fundamental investigations of plasmon-exciton and plasmon-spin interactions in reduced dimensions, and for technological applications in photonics, optoelectronics and quantum-information processing.

The possibility of non-resonant coupling between plasmon and exciton in reduced dimensions is much less explored. As described herein, that type of coupling allows for LSPR, a collective property of electrons, to be used as a new degree of freedom to control the electronic structure of the exciton in semiconductor NCs. A viable way to investigate non-resonant plasmon-exciton interactions is via spectroscopic measurements involving external electric and magnetic fields. Circularly polarized light acts on the LSPR by exciting cyclotron plasmonic modes in morphologies that exhibit rotational symmetry. The two cyclotron plasmonic modes—left ($\rho^-$) and right ($\rho^+$)—that collectively oscillate in circular orbits are degenerate. The application of an external magnetic field results in the additional Lorenz force acting on these electrons. The total force (F) that electrons experience can be described classically through the equation of motion:

$$F=m(dv/dt)+\gamma mv=-eE-e(v\times B) \quad (S4)$$

where E and B are external electric and magnetic field, respectively, e, m, and v are the charge, effective mass, and velocity of the electron, respectively, and $\gamma$ is the damping factor. An external magnetic field lifts the degeneracy of the two plasmonic modes, which can be detected using magnetic circular dichroism (MCD) spectroscopy. MCD measures the difference in absorption of left and right circularly polarized light by the $\rho^-$ and $\rho^+$ modes, respectively, for magnetic field applied parallel to the light propagation direction. This approach enabled an accurate prediction of the intrinsic NC electronic structure parameters, such as the type of free carriers and their effective mass.

As detailed herein, it has been demonstrated that the cyclotron magnetoplasmonic modes can cause splitting of the conduction band states in degenerately n-doped semiconductor NCs by internal transfer of the angular momentum to the NC excited states. This phenomenon enables the use of the magnetoplasmonic modes for charge carrier polarization, in analogy to using electron spin in spintronics, or discrete values of crystal momentum in valleytronics. Implementation of this interesting concept as a new technology (which we refer to as plasmontronics) demands the answer to a number of important fundamental questions, including: how many free carriers need to participate in the magnetoplasmonic mode in order to induce splitting of the NC band states? What is the degree of their delocalization, and how can it be manipulated? What are the ways to control and optimize carrier polarization? How do carrier trapping and scattering influence plasmon-induced exciton splitting?

MCD spectroscopy was used to explore the magnetoplasmonic-mode-induced exciton splitting in $In_2O_3$ NCs synthesized under different conditions and with varying Se doping concentration. Splitting of the conduction band states near the Fermi level is associated with magnetoplasmonic modes with the opposite helicity, and can be controlled by the formation of oxygen vacancies or composition of $In_2O_3$ NCs. Surprisingly, only partly delocalized electrons in collective cyclotron motion appear to lead to excitonic splitting and complete carrier polarization at room temperature in NCs. The magnitude of the band state splitting is correlated with the LSPR intensity, and is predominantly determined by the number of free carriers. Electron localization on point defect sites results in spin-induced splitting of the semiconductor band states as the fundamentally different carrier polarization mechanism.

The synthesis of colloidal $In_2O_3$ NCs was performed by non-injection method in an inert atmosphere (argon gas) and under oxidizing conditions (in air) to control the oxygen deficiency in the NC lattice. For the synthesis of indium tin oxide (ITO) NCs, varying amounts of $SnCl_4$ (1-20 mol %) were added to the reaction mixture, and the reaction was allowed to proceed under the flow of argon. The $In_2O_3$ NCs synthesized in air have a smaller average size and larger size distribution than those synthesized in argon, implying that the oxidizing environment tends to inhibit the NC growth. This process might be associated with the adsorption of byproducts obtained by partial oxidation of oleylamine as a coordinating solvent. On the other hand, the growth of NCs in the presence of Se as an impurity ion, does not significantly influence the NC growth, at least for moderate doping concentrations relevant for this work. All NC samples, undoped and doped, obtained under described conditions exhibit cubic crystal structure characteristic for bixbyite-type $In_2O_3$. A notable increase in broadening of the XRD peaks for air-synthesized $In_2O_3$ NCs is consistent with their smaller average size relative to other samples (FIG. 6A). The spectra for $In_2O_3$ NCs show four phonon peaks characteristic for bcc-$In_2O_3$ (307, 366, 497, and 630 $cm^{-1}$). These peaks are somewhat sharper and better defined for NCs synthesized in argon, indicating larger surface area and NC size distribution of air-synthesized NCs (FIG. 6B). Upon doping with Se the peaks broaden and decrease in intensity, completely disappearing for doping concentrations above ca. 10%. This phenomenon has been associated with the local crystal lattice distortion due to the incorporation of Se dopants into $In_2O_3$ NCs.

Some further details of synthesis of nanocrystals is provided as follows:

Synthesis of In2O3 and ITO nanocrystals: Colloidal $In_2O_3$ and ITO nanocrystals (NCs) were synthesized by modifying previously reported procedure. $In(acac)_3$ (2.2 mmol; 0.9 g) and oleylamine (27 mmol; 7.2 g) were mixed together. The reaction mixture was heated to 250° C. within 1 h and then allowed to react for another 1 h in argon or air with continuous stirring. Different atmosphere was used to control the concentrations of oxygen vacancies in synthesized $In_2O_3$ NCs. The argon gas flow that generated the plasmon oscillation (LSPR) in undoped $In_2O_3$ is about 50 cc/min. It is believed that approximately this level of Argon gas flow creates enough point defects to provide the plasmon resonance. The generation of plasmon resonance in undoped nanocrystal is useful in that it avoids any negative aspects of dopants (such as, for example, scattering centers, increased electrical resistance or the like), with minimal distortion to the lattice and still achieve the band splitting (carrier polarization) that is described herein. The mixture was then slowly cooled to room temperature. After centrifugation at 3000 rpm for 10 min, the precipitate was collected and washed with ethanol three times. The washed precipitate was mixed with 1.5 mL oleic acid and stirred at 90° C. for 30 min. The nanocrystal samples were subsequently precipitated again and washed with ethanol three times. The final product was dispersed in a non-polar solvent, such as hexane or toluene, for further characterization. For the synthesis of $Sn^{4+}$-doped $In_2O_3$ NCs, the same experimental procedure was applied in argon atmosphere, but with the addition of varying amount of $SnCl_4 \cdot 5H_2O$ as a doping precursor.

Synthesis of plasmonic $SnO_2$ and Sb-doped $SnO_2$ (ATO) NCs: The procedure used for the hydrothermal synthesis of Sb-doped $SnO_2$: 1.0 g SnCl4·5H2O (pentahydrate) and various amount of SbCl3 with the desired ratios of Sb/Sn were dissolved into the solvents containing 20 mL oleic acid, 7 mL ethanol, and 4 mL oleylamine. The solution then was transferred into 45 mL digestion bomb and was placed into a preheat oven at 180° C. After 4 hours, the digestion bomb was taken out of oven and allowed to cool down to room temperature naturally. The product was centrifuged and washed with ethanol three time. The precipitate was mixed with 1.5 g of trioctylphosphine oxide (TOPO) at heated to 90° C. for 30 min. After that, the product was precipitated and washed with ethanol for three times. The final product was dispersed in toluene or hexane for other measurements. This method also yields plasmonic properties in pure SnO2 and the splitting of the exciton/band splitting (carrier polarization).

The temperature dependence of the MCD intensity for undoped $In_2O_3$ and ITO NCs was also reviewed (FIG. 9C). For $In_2O_3$ NCs prepared in air, the MCD signal initially drops sharply with temperature (from 5 to 100 K), followed by a more gradual decrease until it completely disappears at room temperature. The MCD intensity is inversely proportional to temperature according to the Curie-Weiss law, and indicates the presence of paramagnetic centers in $In_2O_3$ NCs prepared in oxidizing atmosphere. In spite of the steep decrease in MCD intensity with temperature, a significant signal with negative sign remains at room temperature in argon-synthesized $In_2O_3$ NCs. The reduction of the initial intensity with temperature follows the same dependence as for NCs prepared under oxidizing conditions. In contrast to undoped $In_2O_3$ NCs, the MCD spectra of ITO NCs experience much smaller change with temperature. Specifically, the MCD intensity for 5% ITO NCs diminishes by only a small amount from 5 K to 300 K, with the decrease obeying the Curie-type behavior, as described herein. For ITO NCs containing higher doping levels (for example, 10% or more) MCD spectra remain virtually unchanged up to room temperature. MCD intensity decrease with temperature for ITO NCs evidently becomes less pronounced with increasing doping concentration, suggesting decreased contribution of paramagnetism associated with delocalized unpaired electrons. In addition to the blue shift and increased spectral broadening (vide supra), a notable increase in excitonic MCD intensity with increasing carrier concentration was observed. Together with previous results, the data and analysis suggest the coexistence of two exciton splitting mechanisms in $In_2O_3$ NCs; one that dominates at low concentration of free electrons and is temperature dependent (related to the presence localized unpaired electrons), and the other that becomes relevant at higher doping levels and is temperature independent (induced by the cyclotron magnetoplasmonic modes) (see schematic representation of the two mechanisms in FIG. 10C)

The results of this work reveal important and unique new properties of plasmonic semiconductor NCs. Unlike diluted magnetic semiconductors, the $In_2O_3$ and ITO NCs studied in this work contain no magnetic dopants but still exhibit exciton splitting associated with both individual and collective electronic properties. At low concentration of oxygen vacancies, the number of free carriers is too small to generate collective oscillatory behavior, and the NC band splitting is associated with localized spin as an intrinsic electronic property. An increase in the concentration of vacancy defects results in the increased density of free electrons and their resonant cyclotron motion induced by circularly polarized light. In the external magnetic field, the ensuing magnetoplasmonic modes induce conduction band splitting around the Fermi level (vide supra). Given that LSPR has been reported for as few as three free electrons in $In_2O_3$ NCs, the individual electrons that lead to spin-splitting of the band states must be highly localized on native defect sites. Increase in the carrier density by aliovalent doping leads to higher oscillator strength of LSPR and cyclotron plasmon resonance, and consequently to an increase in the contribution of magnetoplasmon-induced band splitting. MCD can therefore serve as a sensitive probe of the carrier delocalization. The observed change in excitonic splitting pattern with increasing concentration of defects and/or dopants is a signature of the evolution of electron delocalization in this material.

Experiments indicate that low-temperature magnetic susceptibility measurements show excellent agreement with the MCD data for $In_2O_3$ NCs. Importantly, the saturation magnetization for ITO NCs increases with Se doping concentration, suggesting that the density of localized charge carriers also increases with aliovalent doping. Similarly, the saturation magnetization of $In_2O_3$ NCs synthesized in non-oxidizing atmosphere is higher than that of $In_2O_3$ NCs synthesized in air. The conclusion that arises from these results is that the density of both localized and delocalized electrons increase with increasing concentration of aliovalent dopants or oxygen vacancies. However, an increase in the overall carrier density leads to enhanced excitonic Zeeman splitting associated with cyclotron magnetoplasmonic modes, while the anomalous spin-induced Zeeman splitting associated with localized charge carriers subsides.

To understand this phenomenon, density functional theory (DFT) calculations were preformed using generalized gradient approximation (GGA) for $In_2O_3$ and ITO. Comparison of the band structure diagrams for ideal $In_2O_3$ and ITO lattices demonstrates aliovalent-dopant-induced filling of the conduction band with free electrons, consistent with the observed Burstein-Moss shift, as well as the previously reported calculations. Similar calculations performed by introducing oxygen vacancies (Vo) to mimic the electronic structure of the NCs in this study suggest the formation of new states within the band gap which can act as double donors (FIGS. 10 A and B). Unpaired electrons localized in these states (and possibly other sub-band-gap states associated with surface defects) are responsible for the observed paramagnetism with saturation magnetization corresponding to $S=\frac{1}{2}$. Increasing concentration of oxygen vacancies and/or $Sn^{4+}$ dopants leads to an increased number of electrons in the conduction band, raising the position of the Fermi level and the energy separation between the NC excited states and the localized defect states (FIG. 10C). The key feature responsible for exchange interaction between localized defect states and unoccupied conduction band states, and the subsequent spin-induced band splitting of the NC host lattice, is their hybridization. This hybridization is parametrized by the mixing coefficient ($C_{D-E}$) according to the perturbation theory:

$$C_{D\text{-}E} = \frac{\langle \psi_D | \hat{H}_{DE} | \psi_E \rangle}{\Delta E_{D\text{-}E}} \qquad (s5)$$

where $\langle \psi_D | \hat{H}_{DE} | \psi_D \rangle$ is a wavefunction mixing integral, and $\Delta E_{D\text{-}E}$ it the energy difference between native defect and conduction band excited states. The large energy difference between the prevents their exchange interaction. Therefore, with increasing doping concentration the probability of anomalous Zeeman splitting of the NC band structure due to coupling between localized-defect and excitonic states is reduced. On the other hand, coupling between magnetoplasmonic modes and exciton is enhanced, leading to selective polarization of charge carriers.

The results demonstrate the control of the nature of band splitting in plasmonic semiconductor NCs by controlling their electronic structure and the type and concentration of defects acting as electron donors and traps. The extent of carrier localization in point defect states is determined by the defect configuration in the NC lattice having a particular crystal structure, and the sample preparation conditions. In addition to enhanced LSPR, increase in aliovalent doping concentration also induces the formation of additional lattice defects due to charge compensation, leading to an increase in the number of localized carriers trapped in these sites. The ability to control exciton polarization in $In_2O_3$ NCs using both individual (localized) and collective (plasmonic) electronic properties asserts them as multifunctional materials with truly interacting degrees of freedom (charge, spin, and plasmon), and opens up significant possibility of using these materials for general information processing devices as well as quantum information processing devices.

Embodiments of the present disclosure can be described in view of the following clauses:

1. A plasmonic nanostructure material comprising semiconductor nanocrystals or metal-oxide nanocrystals configured with point defects to provide localized surface plasmon resonance as a parameter for tuning the electronic structure of the nanocrystals.
2. A plasmonic nanostructure material according to clause 1, wherein the semiconductor nanocrystal is configured with point defects by at least one of aliovalent doping, photodoping, electrochemical injection, or native defect generation.
3. A plasmonic nanostructure material according to clause 1, wherein the semiconductor nanocrystal is further configured by controlling carrier activation, trapping and scattering based on nanocrystal composition or surface chemistry.
4. A plasmonic nanostructure material according to clause 2, wherein the semiconductor nanocrystal is doped with an aliovalent transition metal to provide both plasmon resonance and spintronic effects.
5. A plasmonic nanostructure material according to clause 1, wherein the semiconductor nanocrystal is a single phase nanocrystal and the localized surface plasmon resonance is coupled with exciton energy (semiconductor band structure) of the nanocrystal via correlated action of applying circularly polarized light and a magnetic field.
6. A plasmonic nanostructure material according to clause 5, wherein the localized surface plasmon resonance is not resonant with the exciton energy (semiconductor band structure) of the nanocrystal.
7. A plasmonic nanostructure material according to clause 1, wherein the semiconductor nanocrystal may be selected from among the following:
   A) n-type plasmonic semiconductor nanocrystals
   i) Semiconductors doped with aliovalent ions (this is particularly relevant for transparent metal oxides):
      a) $In_2O_3$ doped with tin (i.e., $Sn^{4+}$, known as ITO), antimony ($Sb^{5+}$), titanium ($Ti^{4+}$), molybdenum ($Mo^{5+}$ or $Mo^{6+}$, known as IMO), tungsten ($W^{5+}$ or $W^{6+}$, known as IWO),
      b) ZnO doped with aluminum ($Al^{3+}$, known as AZO), gallium ($Ga^{3+}$, known as GZO), indium ($In^{3+}$, known as IZO)
      c) $SnO_2$ doped with antimony ($Sb^{5+}$, known as ATO)
      d) CdO doped with indium ($In^{3+}$, ICO), dysprosium ($Dy^{3+}$) etc.
   ii) Non-stoichiometric semiconductor (i.e., anion deficient):
      $TiO_{2-x}$, $WO_{3-x}$, $InN_{1-x}$, $In_2O_{3-x}$
   B) p-type semiconductors: both aliovalent doped and cation deficient. Particularly well-know cation deficient lattices are: $Cu_{2-x}S$, $Cu_{2-x}Se$. Other semiconductor nanocrystals having similar characteristics may also be selected by one of skill in the art having knowledge of this disclosure.
8. A method of preparing a plasmonic nanostructure material comprising:
   colloidal synthesis of nanocrystals to provide point defects resulting in localized surface plasmon resonance as a parameter for tuning the electronic structure of the nanocrystals; and
   depositing nanocrystals as a thin film, growing nanocrystals on a desired substrate, or drawing nanocrystals into a nanowire.
9. A method of preparing according to clause 8, wherein the nanocrystals are configured with point defects by at least one of aliovalent doping, photodoping, electrochemical injection, or native defect generation.
10. A method of preparing according to clause 8, wherein the aliovalent doping comprises doping with aliovalent transition metal dopants.
11. A method according to clause 8, wherein the aliovalent transition metal dopants are selected from the group consisting of molybdenum, tungsten, and titanium.
12. A method according to clause 8, wherein the colloidal synthesis was conducted in an argon environment having a predetermined flow rate.
13. A device or system for controlling a plasmonic nanostructure material, the device or system comprising:
    a support for the nanostructure material;
    a source of circularly polarized light that propagates in a predetermined direction and impinges on the nanostructure material;
    a magnetic field source positioned in relation to the nanostructure material and source of circularly polarized light such that the magnetic field lines are parallel with the light propagation direction; and
    a controller configured to control at least one of:
      the helicity of the polarized light, or;
      the orientation of the magnetic field,
    to switch the carrier polarization in the nanostructure material.
14. A device or system according to clause 13, wherein the magnetic field source comprises a permanent magnet or an electromagnet.

15. A device or system according to clause 13, wherein the magnetic field source comprises a ferromagnetic material and the nanostructure material is deposited on the ferromagnetic material.

16. A device or system according to clause 13, wherein the source of circularly polarized light comprises a laser and a quarter wave plate.

17. A device according to clause 13, further comprising a system for detecting the carrier polarization in the nanostructure material.

18. A device or system according to clause 17, wherein the system for detecting the carrier polarization in the nanostructure material comprises an electrical system.

19. A method for controlling a plasmonic nanostructure material, the method comprising:
supporting a nanostructure material in a magnetic field;
directing circularly polarized light at the nanostructure material to polarize charge carriers in the nanostructure material, wherein the nanostructure material is positioned such that lines of the magnetic field are parallel with the light propagation direction; and
adjusting at least one of:
the helicity of the polarized light to switch the carrier polarization in the nanostructure material; and
the orientation of the magnetic field to switch the carrier polarization in the nanostructure material.

20. A method according to clause 19, further comprising depositing the nanostructure material on a ferromagnetic material such that the magnetic field is provided by the ferromagnetic material.

21. An information processing device incorporating the device of clause 13 or utilizing the method of clause 19.

Embodiments of the new materials, systems and methods are expected to provide increased functionality, faster performance, device miniaturization (which is directly associated with higher efficiency), lower cost (smaller amount of material can be used). Further, by coupling with other degrees of freedom (such as spin), it may be possible to form multistate memory elements and other electronic components or devices. One of the main advantages of the technology herein is that it is compatible with the semiconductor industry and manufacturing. It generally relies on the same type of materials, which should make for a seamless integration with existing processes and devices.

Although the present disclosure has been illustrated and described herein with reference to various embodiments and specific examples thereof, it will be readily apparent to those of ordinary skill in the art that other embodiments and examples may perform similar functions and/or achieve like results. Further, elements from each of the embodiments may also be combined or re-arranged with elements of other embodiments as would be understood by one of skill in the art. All such equivalent and varied embodiments and examples are within the spirit and scope of the present disclosure.

In the preceding description, for purposes of explanation, numerous details are set forth in order to provide a thorough understanding of the embodiments. However, it will be apparent to one skilled in the art that these specific details may not be required. In other instances, well-known structures may be shown in block diagram form in order not to obscure the understanding. For example, specific details are not provided as to whether elements of the embodiments described herein and, in particular, the controller, are implemented using a software routine, hardware circuit, firmware, or a combination thereof.

I claim:

1. A plasmonic nanostructure material comprising configured semiconductor nanocrystals or metal-oxide nanocrystals that are configured with point defects, the point defects providing localized surface plasmon resonance as a parameter for tuning the electronic structure of the nanocrystals
wherein the point defects are configured by at least one of aliovalent doping, photodoping, electrochemical injection, or native defect generation.

2. A plasmonic nanostructure material according to claim 1, wherein the semiconductor nanocrystals undergo carrier activation, trapping and scattering based on nanocrystal composition or surface chemistry.

3. A plasmonic nanostructure material according to claim 2, wherein the semiconductor nanocrystals are doped with an aliovalent transition metal.

4. A plasmonic nanostructure material according to claim 1, wherein the semiconductor nanocrystals are single phase nanocrystals and the localized surface plasmon resonance is coupled with exciton energy of the semiconductor nanocrystals via correlated action of applying circularly polarized light and a magnetic field.

5. A plasmonic nanostructure material according to claim 4, wherein the localized surface plasmon resonance is not resonant with the exciton energy of the nanocrystal.

6. A plasmonic nanostructure material according to claim 1, wherein the semiconductor nanocrystals are selected from among the following:
A) n-type plasmonic semiconductor nanocrystals
  i) Semiconductors doped with aliovalent ions:
    a) $In_2O_3$ doped with tin, antimony ($Sb^{5+}$), titanium ($Ti^{4+}$), molybdenum ($Mo^{5+}$ or $Mo^{6+}$, tungsten ($W^{5+}$ or $W^6$),
    b) ZnO doped with aluminum ($Al^{3+}$), gallium ($Ga^{3+}$), indium ($In^{3+}$)
    c) $SnO_2$ doped with antimony ($Sb^{5+}$)
    d) CdO doped with indium ($In^{3+}$), dysprosium ($Dy^{3+}$)
  ii) Non-stoichiometric semiconductor:
    $TiO_{-x}$, $WO_{3-x}$, $InN_{1-x}$, $In_2O_{3-x}$
B) p-type semiconductors: both aliovalent doped and cation deficient.

7. A method of fabricating a plasmonic nanostructure material comprising:
configuring semiconductor nanocrystals or metal-oxide nanocrystals with point defects, the point defects providing localized surface plasmon resonance as a parameter for tuning the electronic structure of the nanocrystals;
wherein the point defects are configured by at least one of aliovalent doping, photodoping, electrochemical injection, or native defect generation.

8. The method of claim 7 wherein configuring semiconductor nanocrystals with point defects comprises doping the semiconductor nanocrystals with an aliovalent transition metal.

9. The method of claim 7 wherein the semiconductor nanocrystals are selected from n-type plasmonic semiconductor nanocrystals, aliovalent doped p-type semiconductors and cation deficient p-type semiconductors.

10. The method of claim 9 wherein the n-type semiconductor nanocrystals comprise semiconductors doped with aliovalent ions or non-stoichiometric semiconductors.

11. The method of claim 10 wherein the semiconductors doped with aliovalent ions comprise $In_2O_3$ doped with tin, $In_2O_3$ doped with antimony ($Sb^{5+}$), $In_2O_3$ doped with titanium ($Ti^{4+}$), $In_2O_3$ doped with molybdenum ($Mo^{5+}$ or $Mo^{6+}$), $In_2O_3$ doped with tungsten ($W^{5+}$ or $W^6$), ZnO doped with aluminum ($Al^{3+}$), ZnO doped with gallium ($Ga^{3+}$), ZnO doped with indium ($In^{3+}$), $SnO_2$ doped with antimony ($Sb^{5+}$), CdO doped with indium ($In^{3+}$), or CdO doped with dysprosium ($Dy^{3+}$).

12. The method of claim 10 wherein the non-stoichiometric semiconductor comprises $TiO_{2-x}$, $WO_{3-x}$, $InN_{1-x}$, or $In_2O_{3-x}$.

13. The method of claim 7, wherein the aliovalent doping comprises doping with aliovalent transition metal dopants.

14. The method of claim 13 wherein the aliovalent transition metal dopants are selected from the group consisting of molybdenum, tungsten, and titanium.

15. The method according to claim 7, wherein configuring semiconductor nanocrystals or metal-oxide nanocrystals with point defects comprises using colloidal synthesis to provide the point defects.

16. The method according to claim 15 wherein using colloidal synthesis was conducted in an argon environment having a predetermined flow rate.

* * * * *